(12) United States Patent
Tachibana et al.

(10) Patent No.: US 8,313,890 B2
(45) Date of Patent: Nov. 20, 2012

(54) ANTIREFLECTIVE COATING COMPOSITION, ANTIREFLECTIVE COATING, AND PATTERNING PROCESS

(75) Inventors: Seiichiro Tachibana, Joetsu (JP); Kazumi Noda, Joetsu (JP); Takeru Watanabe, Joetsu (JP); Jun Hatakeyama, Joetsu (JP); Takeshi Kinsho, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 482 days.

(21) Appl. No.: 12/636,546

(22) Filed: Dec. 11, 2009

(65) Prior Publication Data

US 2010/0151381 A1 Jun. 17, 2010

(30) Foreign Application Priority Data

Dec. 12, 2008 (JP) ................. 2008-316645

(51) Int. Cl.
*G03F 7/11* (2006.01)
*G03F 7/40* (2006.01)
*C08L 31/02* (2006.01)

(52) U.S. Cl. .............. 430/323; 430/271.1; 430/270.1; 430/314; 522/111; 522/112; 525/132; 525/155; 525/187; 525/200

(58) Field of Classification Search ........... None
See application file for complete search history.

(56) References Cited

U.S. PATENT DOCUMENTS

| 5,294,511 | A * | 3/1994 | Aoai et al. ............. 430/270.1 |
| 6,312,867 | B1 | 11/2001 | Kinsho et al. |
| 6,329,125 | B2 | 12/2001 | Takechi et al. |
| 6,555,295 | B1 | 4/2003 | Tanaka et al. |
| 7,531,289 | B2 | 5/2009 | Kinsho et al. |

| 2006/0183348 | A1 * | 8/2006 | Meagley et al. ............. 438/789 |
| 2006/0228646 | A1 * | 10/2006 | Zampini et al. ............. 430/270.1 |
| 2007/0179309 | A1 | 8/2007 | Hasegawa et al. |
| 2007/0231738 | A1 | 10/2007 | Kaneko et al. |
| 2008/0008955 | A1 | 1/2008 | Brodsky et al. |
| 2008/0220381 | A1 | 9/2008 | Hatakeyama et al. |
| 2008/0227037 | A1 | 9/2008 | Hatakeyama et al. |

FOREIGN PATENT DOCUMENTS

| EP | 2085822 A1 * | 8/2009 |
| JP | 9-73173 A | 3/1997 |
| JP | 2000-53921 A | 2/2000 |
| JP | 2000-336121 A | 12/2000 |
| JP | 3414107 B2 | 6/2003 |
| JP | 2006-152255 A | 6/2006 |
| JP | 2007-60010 A | 3/2007 |
| JP | 2007-63935 A | 3/2007 |
| JP | 2007-204385 A | 8/2007 |
| JP | 2007-297590 A | 11/2007 |
| JP | 2008-257187 A | 10/2008 |
| JP | 2008-257188 A | 10/2008 |
| WO | WO-2008/047638 A1 * | 4/2008 |

OTHER PUBLICATIONS

Nobuyuki N. Matsuzawa et al., "Optimization of Dual BARC Structures for Hyper-NA Immersion Lithography", SPIE, vol. 6153, (2006), pp. 61531J-1 to 61531J-12.

Sean Burns et al., "Silicon Containing Polymer in Applications for 193 NM High NA Lithography Processes", SPIE, vol. 6153, (2006), pp. 61530K-1 to 61530K-12.

Tom Lynch et al., "Properties and Performance of Near UV Reflectivity Control Layers", SPIE, vol. 2195, (1994), pp. 225-235.

* cited by examiner

*Primary Examiner* — Cynthia Hamilton
(74) *Attorney, Agent, or Firm* — Birch, Stewart, Kolasch & Birch, LLP

(57) ABSTRACT

A composition comprising (A) a fluorinated polymer having k=0.01-0.4 and n=1.4-2.1 and (B) an aromatic ring-bearing polymer having k=0.3-1.2 is used to form an antireflective coating. The ARC-forming composition can be deposited by the same process as prior art ARCs. The resulting ARC is effective in preventing reflection of exposure light in photolithography and has an acceptable dry etching rate.

11 Claims, 4 Drawing Sheets

BARC THICKNESS (nm)

LOWER LAYER THICKNESS (nm)

ANTIREFLECTIVE COATING COMPOSITION, ANTIREFLECTIVE COATING, AND PATTERNING PROCESS

CROSS-REFERENCE TO RELATED APPLICATION

This non-provisional application claims priority under 35 U.S.C. §119(a) on Patent Application No. 2008-316645 filed in Japan on Dec. 12, 2008, the entire contents of which are hereby incorporated by reference.

TECHNICAL FIELD

This invention relates to a composition suitable for forming an antireflective coating (ARC) on a resist used in micropatterning for the fabrication of semiconductor devices or the like, and more particularly, to a composition suitable for forming an antireflective coating useful in a lithographic process adapted for exposure to KrF excimer laser (248 nm) or ArF excimer laser (193 nm). It also relates to an ARC formed from the composition, and a process for forming a pattern in a substrate by lithography using the ARC. As used in the art, the "antireflective coating" is often abbreviated herein as ARC.

BACKGROUND ART

Traditionally the technology for the fabrication of semiconductor devices depends on lithographic micropatterning using photoresist compositions. Integration of semiconductor devices is effective in improving the performance, function and reliability of devices and reducing the cost. Since the birth of integrated circuits (IC), technical development works have been continued to boost the integration level.

With the target on further device integration, efforts have been made to reduce the pattern rule by reducing the wavelength of exposure light in photolithography. In the mass production process of 64 M-bit DRAM, for example, the exposure light source of i-line (365 nm) was substituted by a KrF excimer laser having a shorter wavelength of 248 nm. For the fabrication of DRAM with an integration density of 1 G or more requiring a finer patterning technology (feature size 0.13 μm or less), photolithography using ArF excimer laser (193 nm) is under investigation.

Increasing the diameter of lens and increasing the numerical aperture (NA) of lithography system by adopting immersion lithography are also effective in reducing the pattern rule. However, as the NA increases, reflection of exposure light by a substrate poses a greater impact. Specifically, a process of providing a bottom antireflective coating (BARC) between a photoresist film and a substrate is generally employed in order to control reflection. Prior art ARCS are difficult to fully avoid the reflection of exposure light by the substrate. This raises a problem that exposure variations, known as standing waves, occur in a resist film thickness direction, resulting in a decline of resolution.

Known prior art ARCs include inorganic ARCs such as Si and TiN, and organic ARCs composed of light absorber-loaded polymers. The inorganic ARCs require deposition equipment such as vacuum evaporation, CVD and sputtering systems whereas the organic ARCs can be formed in a relatively simple manner without a need for any special equipment. The organic ARCs are not only required to suppress the reflection of exposure light, but also required to have a high dry etching rate as compared with resist film and to avoid intermixing with resist film and diffusion of low-molecular-weight fraction into the resist film (see SPIE Vol. 2195, p 225-229 (1994)).

While the immersion lithography is adapted to insert a liquid between the projection lens and the wafer, the use of water having a refractive index of 1.44 at wavelength 193 nm enables to design a projection lens to a numerical aperture (NA) which is 1.44-fold higher than the lithography in air with a refractive index of 1.0. The immersion lithography, when combined with a projection lens having a NA around 1.3, enables pattern formation at a half pitch of 45 nm.

As the NA increases, the incident angle of light on the resist film becomes shallower, with more oblique light entering. It is pointed out that the proportion of oblique incident light is further increased by s-polarized illumination intended for contrast enhancement, so that reflection by the substrate is further increased. In contrast, it is reported that bi-layer BARC(SPIE Vol. 6153, p61531J (2006)) and a tri-layer process including a silicon-containing intermediate film and an undercoat film having an antireflection effect (SPIE Vol. 6153, p61530K (2006)) have a high antireflection effect at NA 1.0 or above. At NA 1.2 or above, however, the bi-layer ARC is insufficient and a further reduction of reflection is necessary. In contrast, it is reported in SPIE Vol. 6153, p61531J (2006) that a graded BARC which becomes more absorptive toward the substrate side is more effective for preventing reflection than the bi-layer BARC. It is known from the past to use an ARC in the form of a multilayer coating in order to prevent reflection of light over a wide range of wavelength, as implemented on optical lenses and the like. A substrate having a good antireflection effect over a wide range of wavelength can also be an antireflective substrate compliant with varying incident angle. An ARC in which the number of multiple layers is increased infinite, that is, absorption is changed stepwise can exert an excellent antireflection effect. One example that applies this principle to BARC is described in JP 3414107. The illustrative materials used to provide stepwise absorption changes are photobleachable materials such as nitrone.

A multilayer ARC may be formed by iterative application of BARCs with different coefficients of absorption, but this process is impractical because of process complexities and reduced throughputs. It is preferred from the standpoint of process simplicity that an ARC having graded absorption be formed by a single coating step. Although the photo-bleachable materials are proposed in JP 3414107, no such materials are available at wavelength 193 nm. It is then difficult to design an ARC which increases its transparency on the resist side upon exposure.

JP-A 2000-53921 discloses a method of forming a two-layer ARC for reducing the reflection of visible light, using an ARC-forming composition comprising a fluorine-containing compound capable of forming a low refractive index cured film and a compound capable of forming a high refractive index cured film with greater surface free energy. It is believed that self-arrangement and collection of molecules proceed at the film formation stage so that the free energy of film surface may become minimum, and a two-layer structure forms due to a phase-separation phenomenon. This method permits two layers to be formed by a single coating step and is thus effective for both reflectance reduction and productivity improvement. However, if the difference in free energy between two polymers is inadequate, a two-layer structure due to phase separation may not always form and in many cases, a so-called island-in-sea structure forms in which domains of one phase are distributed in a matrix of the other phase. To form an ARC of two-layer structure, an optimum combination of compounds must be sought for.

As described above, the ARC is also required to have a high etching rate. A reduction of pattern feature size entails a thickness reduction of a photoresist film, which encourages to increase the etching rate of ARC. In the past, novolac resins and polyimide resins were used as the polymer to form ARC, but their etching rate is very slow, leaving a problem that the photoresist pattern has been slimmed at the time when the ARC film extinguishes. One effective means for increasing the etching rate is by reducing the number of carbon atoms and increasing a proportion of oxygen atoms. A study was thus made on the use of (meth)acrylate polymer having crosslinking groups and absorptive groups as the base resin. To further accelerate the etching rate, a polyester resin having oxygen atoms incorporated in the polymer backbone was proposed as the base resin.

In the efforts to develop $F_2$ lithography photoresist materials, various fluorine-containing polymers were examined for the purpose of improving transparency at 157 nm. Those polymers having perfluoroalkyl groups had so high water repellency that pattern collapse and stripping occurred due to incomplete development and poor substrate adhesion. On the other hand, alcohols having multiple fluorine atoms substituted at α-position provide appropriate alkaline solubility and adhesion because the hydroxyl group is rendered acidic due to the electron withdrawing nature of fluorine. Thus a number of $F_2$ lithography polymers having —$C(CF_3)_n OH$ structure were developed.

CITATION LIST

Patent Document 1: JP 3414107
Patent Document 2: JP-A 2000-53921
Non-Patent Document 1: SPIE Vol. 2195, p 225-229 (1994)
Non-Patent Document 2: SPIE Vol. 6153, p61531J (2006)
Non-Patent Document 3: SPIE Vol. 6153, p61530K (2006)

DISCLOSURE OF THE INVENTION

An object of the present invention is to provide a composition for forming an ARC suited for use in lithography for the fabrication of semiconductor devices or the like, effective for preventing reflection of exposure light, and having a sufficiently high dry etching rate to reduce the etching time and to prevent the overlying resist film from being slimmed or deformed; an ARC; and a process for forming a pattern in a substrate using the ARC-forming composition.

In one aspect, the invention provides an antireflective coating composition comprising (A) at least one polymer comprising recurring units of at least one type represented by the general formula (1) and having an extinction coefficient k in the range of 0.01 to 0.4 and a refractive index n in the range of 1.4 to 2.1 at a preselected imaging radiation wavelength, and (B) at least one polymer containing an aromatic ring and having an extinction coefficient k in the range of 0.3 to 1.2 at a preselected imaging radiation wavelength.

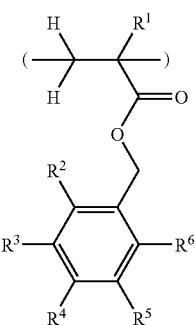

(1)

Herein $R^1$ is hydrogen, fluorine, methyl, or trifluoromethyl, and $R^2$ to $R^6$ are each independently hydrogen, fluorine, trifluoromethyl, or a $C_1$-$C_5$ alkoxy group in which at least one hydrogen atom may be substituted by fluorine, with the proviso that not all $R^2$ to $R^6$ are hydrogen at the same time. In a preferred embodiment, the polymer (A) comprises 3 to 90 mol % of recurring units having formula (1).

In a preferred embodiment, the polymer (A) further comprises recurring units of at least one type selected from the general formulae (2) to (4).

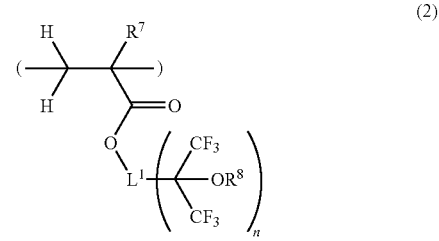

(2)

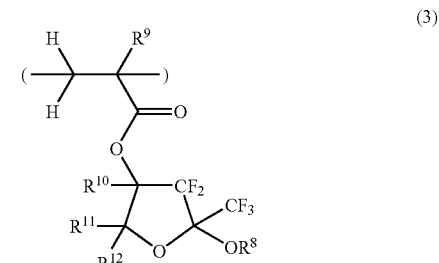

(3)

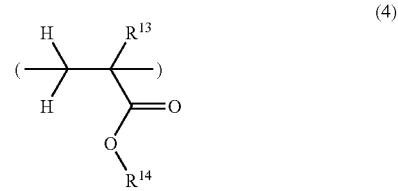

(4)

Herein $R^7$, $R^9$ and $R^{13}$ are each independently hydrogen, fluorine, methyl, or trifluoromethyl, $R^8$ is hydrogen or a straight, branched or cyclic, monovalent hydrocarbon group of 1 to 30 carbon atoms in which some hydrogen atoms may be substituted by halogen and a constituent unit —$CH_1$— may be substituted by —O— or —C(=O)—, n is 1 or 2, $L^1$ is a straight, branched or cyclic, di- or trivalent hydrocarbon group of 1 to 15 carbon atoms, $R^{10}$ to $R^{12}$ are each independently hydrogen, hydroxyl, halogen, or a straight, branched or cyclic, monovalent organic group of 1 to 15 carbon atoms, at least two of $R^{10}$ to $R^{12}$ may bond together to form a ring with the carbon atom(s) to which they are attached, and $R^{14}$ is a hydrocarbon group of 2 to 15 carbon atoms in which at least one hydrogen atom is substituted by fluorine. In a more preferred embodiment, the polymer (A) comprises 2 to 60 mol % of recurring units having formulae (2), (3) and (4) in total.

In a preferred embodiment, the polymer (A) may further comprise recurring units of at least one type capable of crosslinking reaction in the presence of acid, preferably in a total proportion of 5 to 90 mol %.

In a preferred embodiment, the polymer (B) comprises 30 to 100 mol % of aromatic ring-bearing recurring units.

In a preferred embodiment, the polymer (B) may further comprise recurring units of at least one type selected from the following formulae (i) to (xxvi).

(i)
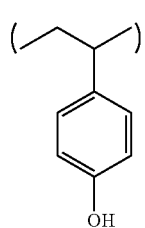
(ii)
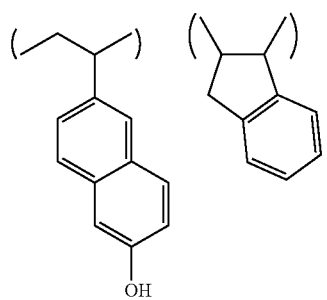
(iii)
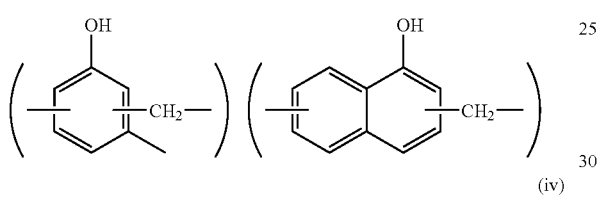
(iv)
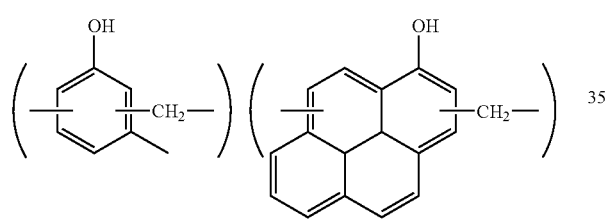
(v)
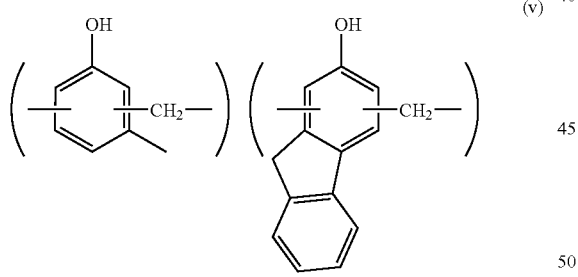
(vi)
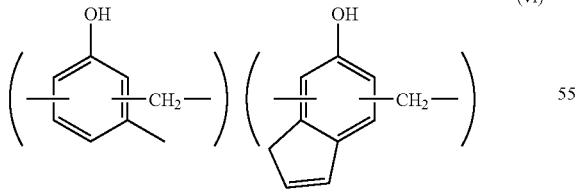
(vii)
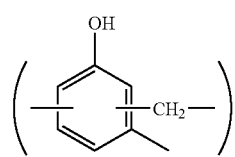
(viii)
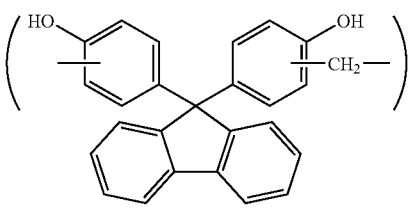
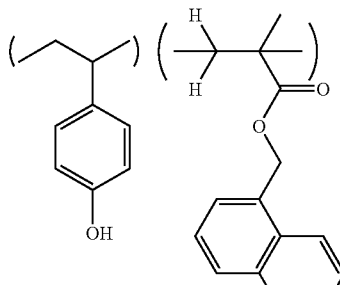
(ix)
(x)
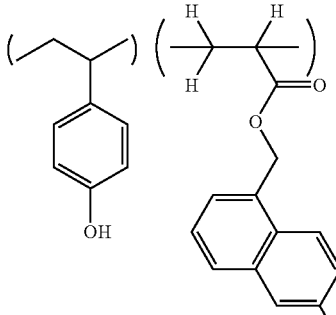
(xi)
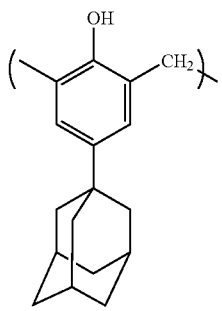
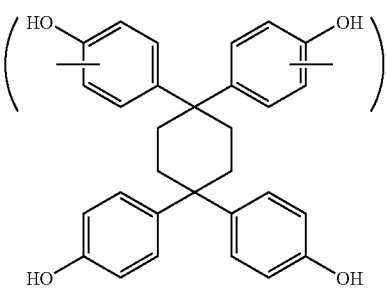

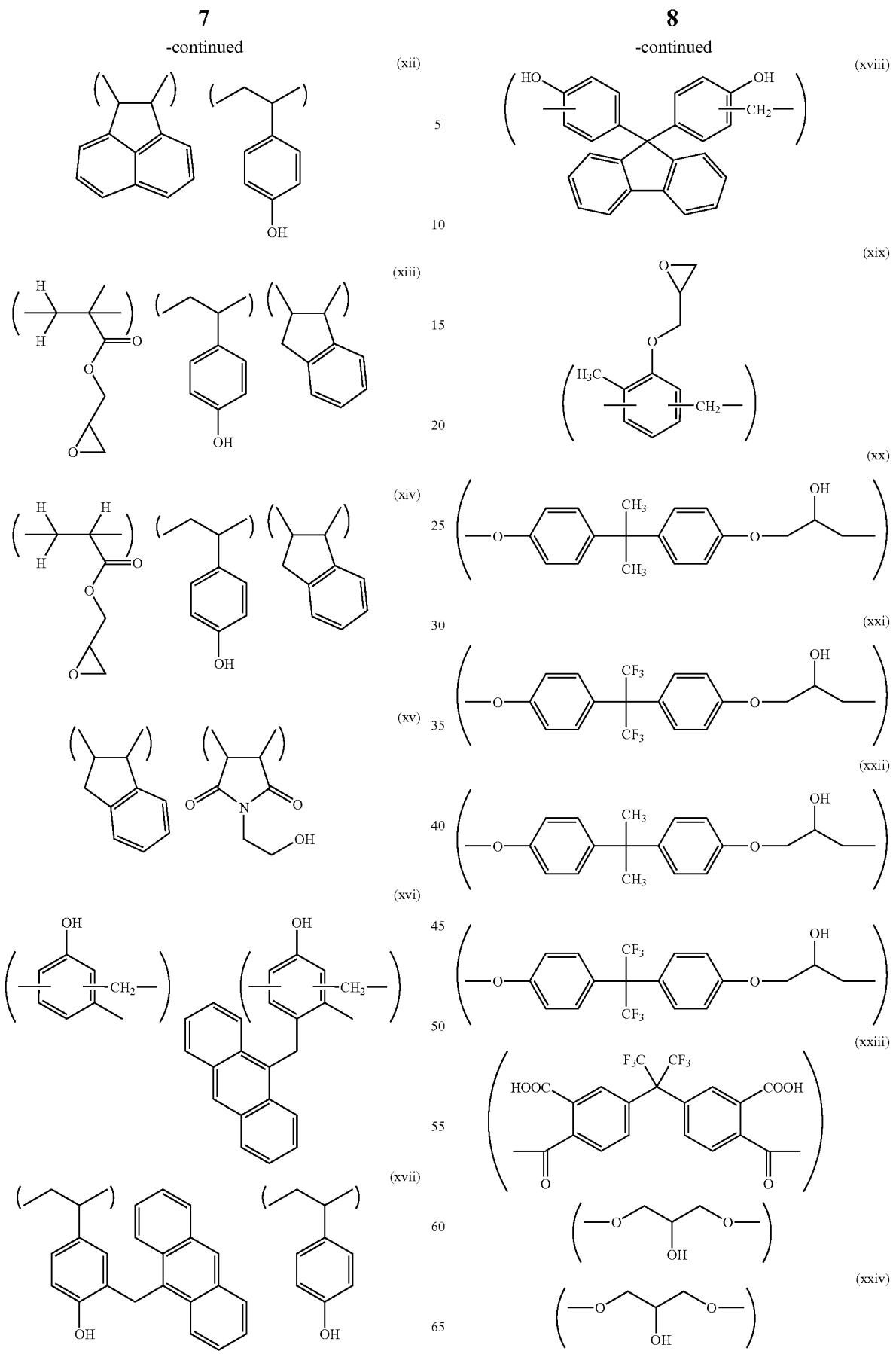

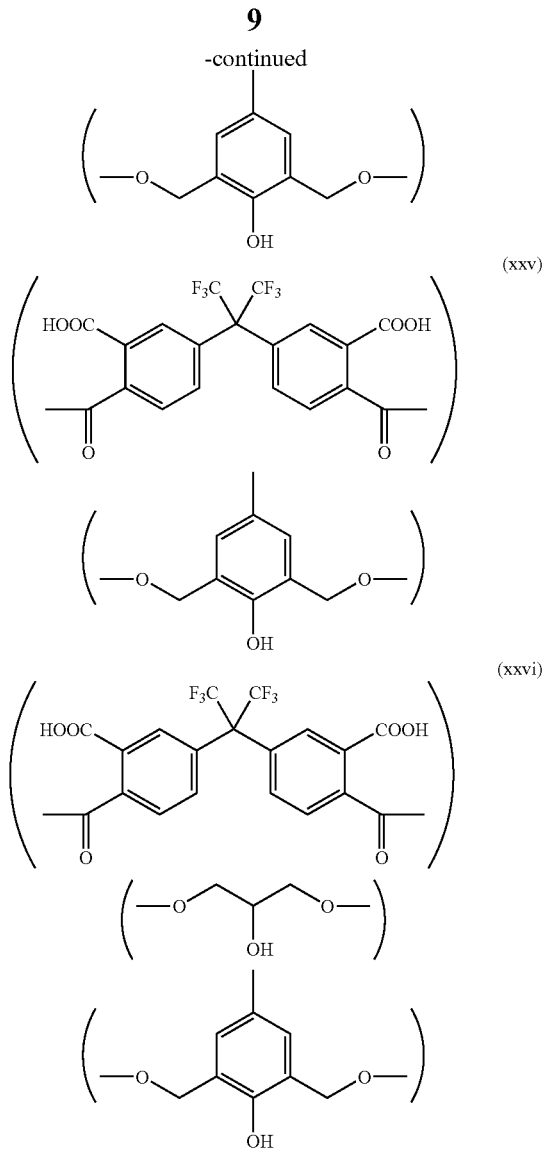

In a preferred embodiment, polymer (A) and polymer (B) are present in a weight ratio of 30:70 to 80:20.

Typically the ARC composition may further comprising an organic solvent, acid generator or crosslinker, alone or in admixture.

In a second aspect, the invention provides an antireflective coating which is prepared by applying the ARC composition defined above onto a substrate by spin coating and baking to form an antireflective coating having an inner surface contiguous to the substrate and an outer surface remote from the substrate, such that polymer (A) and polymer (B) may segregate vertically toward the outer surface and inner surface, respectively.

In a third aspect, the invention provides a lithographic pattern forming process comprising the steps of applying the ARC composition defined above onto a substrate to form an antireflective coating, forming a photoresist layer on the antireflective coating, exposing a pattern circuitry region of the photoresist layer to an imaging radiation, developing the photoresist layer with a developer to form a patterned resist layer, and etching the antireflective coating and the substrate while using the resist pattern as a mask, thereby forming a pattern in the substrate.

DESCRIPTION OF THE PREFERRED EMBODIMENT

Figure 1:
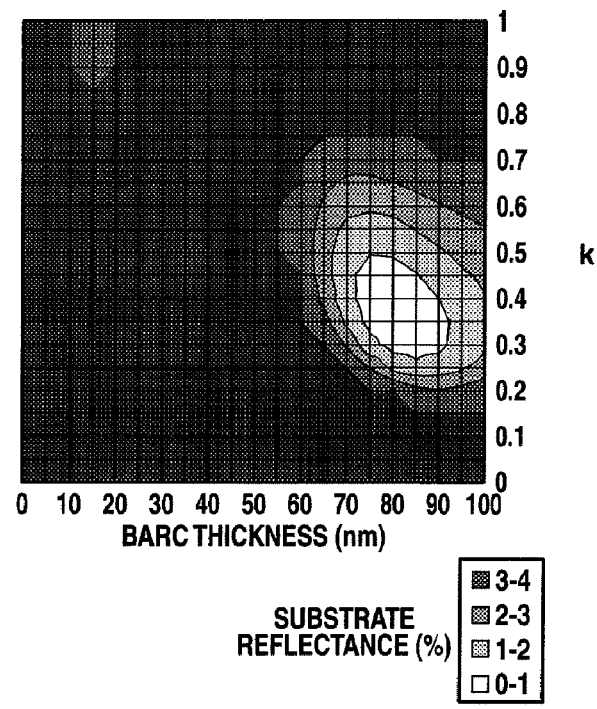
FIG. 1 is a graph plotting the substrate reflectance versus BARC thickness when the extinction coefficient (k value) of BARC is varied from 0 to 1.0 with the refractive index (n value) of BARC fixed at 1.6 under the condition NA 0.85.

It has been found that when the ARC-forming material of the invention is applied onto a substrate by spin coating and then baked to form an ARC film on the substrate, polymer (A) segregates on the outer surface side of the ARC film (remote from the substrate) to form a first layer and polymer (B) segregates on the inner surface side of the ARC film (contiguous to the substrate) to form a second layer and that depending on the particular polymers used, a third layer of a mixture of polymers (A) and (B) can form as the intermediate layer between the first and second layers. It has also been found that when an extinction coefficient k of polymer (A) is set lower than that of polymer (B) and the thicknesses of first, second and third layers are adjusted, the ARC film becomes fully effective in preventing reflection of exposure light. Additionally, polymer (A) has a high etching rate, and as a result, the ARC film has both a high antireflection effect and a high etching rate. The ARC-forming material of the invention is thus very useful in forming fine feature patterns.

For example, it is well known that a surfactant having a perfluoroalkyl group or siloxane structure emerges afloat on the surface of a resist film as spin coated and covers the surface. This is because the perfluoroalkyl group or siloxane having a low level of surface energy orients or segregates toward the surface so that the surface energy is stabilized. It is described in US 20070231738 or JP-A 2007-297590 that when a polymer having —$C(CF_3)_2OH$ structure is added to a photoresist film, it orients or segregates toward the film surface.

The invention takes advantage of the segregating tendency of such polymers. In the invention, a solution of a blend of polymer (A) having a suitable arrangement of fluorine atoms and polymer (B) containing an aromatic ring and having a high extinction coefficient k is coated on a substrate. Then polymer (A) orients or segregates toward the outer surface (photoresist film side) and polymer (B) orients or segregates toward the inner surface (substrate side). Since polymer (B) has a higher extinction coefficient k than polymer (A), there is formed a bi-layer ARC film having higher absorption at the inner surface (substrate side), or a graded absorption ARC film whose absorption increases toward the inner surface (substrate side), achieving a higher antireflection effect.

Most of the past efforts to develop $F_2$ lithography photoresist materials focused on fluorinated materials. It was pointed out that inclusion of fluorine atoms leads to an increased etching rate. A higher etching rate is preferred for ARC. It is thus proposed in JP Appln. 2007-60010 and 2007-63935 to use (meth)acrylate and poly(α-substituted acrylate) with —$C(CF_3)_2OH$ structure having improved adhesion as the base resin in organic ARCs.

In the ARC film comprising a polymer according to the invention, a high etching rate is established by introducing fluorine atoms into the polymer, and a high antireflection effect is achieved by selecting a suitable arrangement of fluorine atoms so as to adjust the extinction coefficient k and refractive index n of the polymer and by forming a multilayer structure film.

To prevent reflection of exposure light, polymer (A) should have an extinction coefficient (k value) in the range of 0.01 to 0.4 (see FIG. 5) and a refractive index (n value) in the range of 1.4 to 2.1 (see FIG. 6) as demonstrated by the calculation to be described later. Assuming that the optical constants of polymer (A) can be tailored to fall in these ranges by using a benzene ring having an electron attractive substituent group such as fluorine or trifluoromethyl, the inventors made experiments on polymers comprising recurring units of formula (1).

An observation how the extinction coefficient k and refractive index n of benzene vary with wavelength indicates that the extinction coefficient k reaches a maximum near 193 nm, and the refractive index n has a maximum on a longer wavelength side than 193 nm. In general, the Kramers-Kronig relation exists between the extinction coefficient k and the refractive index n of a substance, reflecting the law of causality. That is, there is a wavelength shift between the peak of extinction coefficient k and the peak of refractive index n, with the peak of refractive index n being on a longer wavelength side.

When a hydrogen atom on benzene ring is substituted by an electron attractive substituent group, the peaks of extinction coefficient k and refractive index n are shifted toward the shorter wavelength side, known as "blue shift." Since the extinction coefficient k of benzene has a maximum near 193 nm as pointed out above, the larger the blue shift, the lower becomes the extinction coefficient k at 193 nm. On the other hand, the refractive index n depends on the extent of blue shift. Namely, the refractive index n of substituted benzene is higher than that of benzene as long as the extent of blue shift is small, reaches a maximum, and then turns into a decline as the extent of blue shift becomes greater.

Specifically, a polymer (A) comprising recurring units having two fluorine atoms incorporated on benzene ring as derived from Monomer 2 or 3 (see Example) has a high refractive index n because blue shift occurs to such an extent that the refractive index n becomes a maximum. However, a polymer comprising a higher proportion (as high as 70 mol %) of the relevant recurring units has too high a refractive index n and may not be used in practice (see Table 2). In such a case, the polymer (A) may be tailored so as to meet the above-defined optical constants by reducing the amount of the relevant recurring units introduced and instead, introducing fluorinated recurring units of the general formulae (2) to (4). Then a multilayer film can be formed because polymer (A) segregates toward the film surface side.

Where five fluorine atoms are incorporated on benzene ring, an outstanding blue shift occurs and the extinction coefficient k becomes a low value. For example, a polymer comprising a higher proportion (as high as 70 mol %) of recurring units derived from Monomer 1 (see Example) has an extinction coefficient k falling in the range defined for polymer (A) and also a refractive index n within the practically acceptable range (see Table 2).

Notably an example using fluorine-substituted benzene ring is described in US 20080008955. In this example, a copolymer of 2,3,4,5,6-pentafluorostyrene and glycidyl methacrylate is used as the polymer segregating toward the film surface. Introduction of aromatic ring into a polymer is effective in tailoring its optical constants such as extinction coefficient k and refractive index n as described above, but entails a lowering of etching rate. On the assumption that the etching rate can be increased by using (meth)acrylate structure as the backbone of a polymer and introducing a linking organic group to separate the aromatic ring apart from the backbone, the inventors determined the etching rate of a polymer (A) comprising recurring units of formula (1) to find a high etching rate as expected. While a phenyl (meth)acrylate wherein hydrogen atoms on benzene ring are substituted by fluorine atoms is low in shelf stability due to a weakened ester bond, this problem can be avoided by introducing a linking organic group.

As a result, the ARC film is finished to have a high etching rate as a whole. By virtue of a reduced etching time, the ARC film makes it possible to prevent the resist pattern from slimming or deformation and is thus quite useful in forming fine feature patterns.

Now optical properties of a polymer are described as well as the dependency of reflectance on the thickness of an ARC film.

Figure 2:
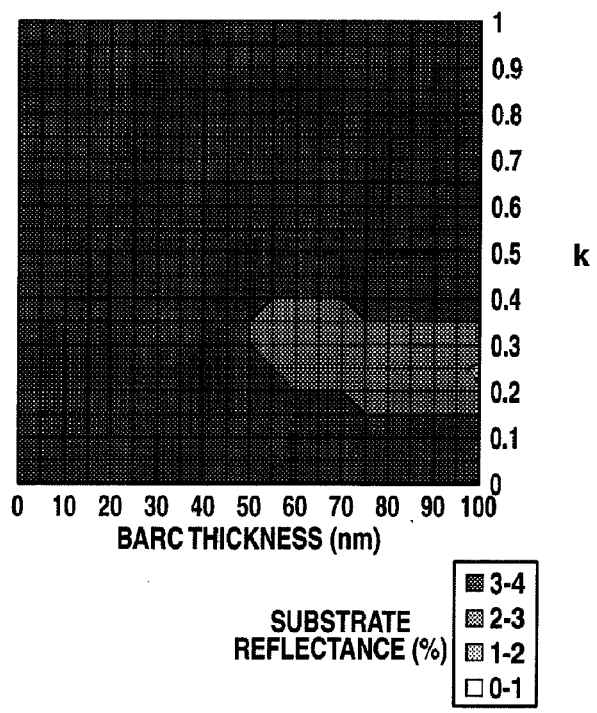
FIG. 2 is a graph plotting the substrate reflectance versus BARC thickness when the extinction coefficient (k value) of BARC is varied from 0 to 1.0 with the refractive index (n value) of BARC fixed at 1.6 under the condition NA=1.35.
Figure 3:
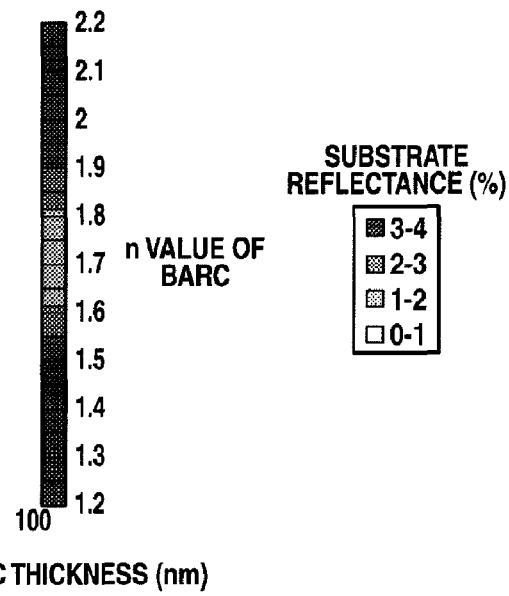
FIG. 3 is a graph plotting the substrate reflectance of BARC of 100 nm thick when the refractive index (n value) of BARC is varied from 1.2 to 2.2 with the extinction coefficient (k value) of BARC fixed at 0.3 under the condition NA=1.35.

Referring to FIG. 1, for a 65-nm line-and-space pattern exposed using an exposure tool system having NA 0.85, σ 0.93/0.78, 20° dipole illumination, and 6% half-tone phase shift mask, there are plotted data obtained by computing reflection when a BARC is applied on a $SiO_2$ substrate of 100 nm thick deposited on a Si substrate. Reflectance is plotted provided that the BARC film has a fixed refractive index (n value) of 1.6, the film thickness is on the abscissa and the extinction coefficient (k value) is on the ordinate. It is seen that the substrate reflection can be reduced to or below 1% by optimizing the k value and film thickness. Referring to FIG. 2, for a 38-nm line-and-space pattern exposed using an exposure tool system having NA 1.35, σ 0.95/0.78, 20° dipole illumination, 100% s-polarization, and 6% half-tone phase shift mask, there are plotted data obtained by computing reflection on a BARC while varying the k value and thickness of BARC. The region where reflectance is reduced to or below 1% is lost. It is seen that the substrate reflection is increased when the NA of a lens is increased so that the angle of light incident on the resist film becomes shallower. FIG. 3 illustrates data obtained by computing reflection on a BARC under the same conditions as in FIG. 2 except a fixed k value of 0.3 and a fixed thickness of 100 nm, while varying the n value. It is seen that the substrate reflection is somewhat reduced by optimizing the n value of BARC.

Figure 4:
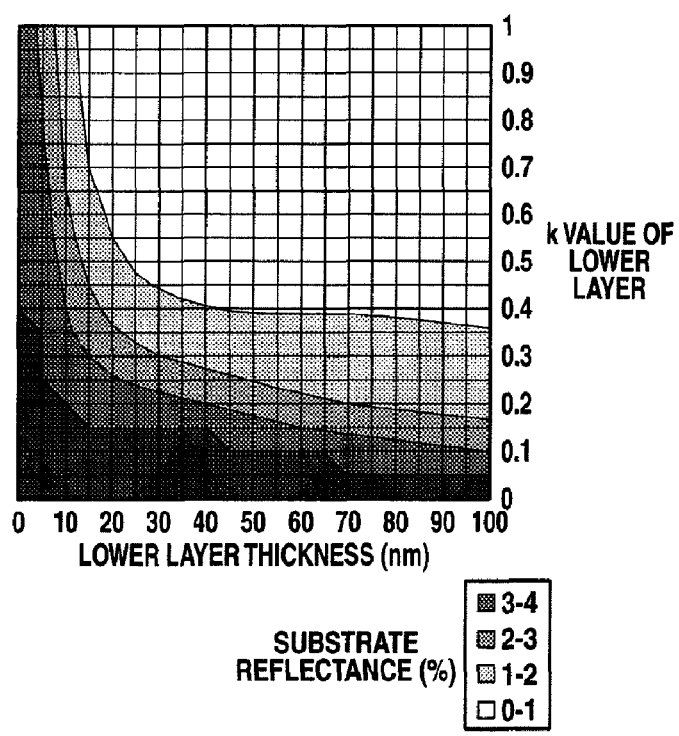
FIG. 4 is a graph, in connection with two-layer BARC, plotting the substrate reflectance versus lower layer thickness when the extinction coefficient (k value) of lower layer is varied from 0 to 1.0 under the condition NA=1.35 (upper layer having k=0.2, n=1.6 and a thickness of 60 nm and lower layer having n=1.6).
Figure 5:
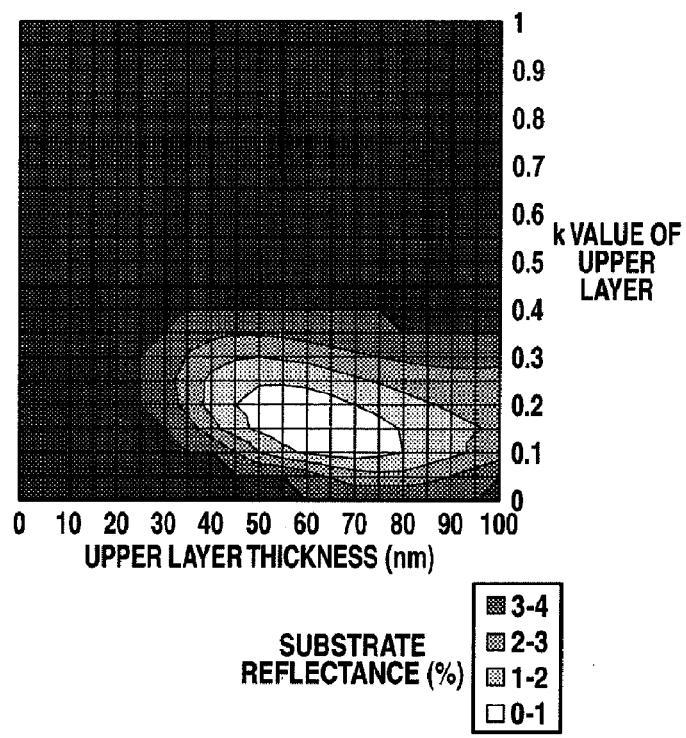
FIG. 5 is a graph, in connection with two-layer BARC, plotting the substrate reflectance versus upper layer thickness when the extinction coefficient (k value) of upper layer is varied from 0 to 1.0 under the condition NA=1.35 (upper layer having n=1.6, lower layer having k=0.6, n=1.6 and a thickness of 40 nm).
Figure 6:
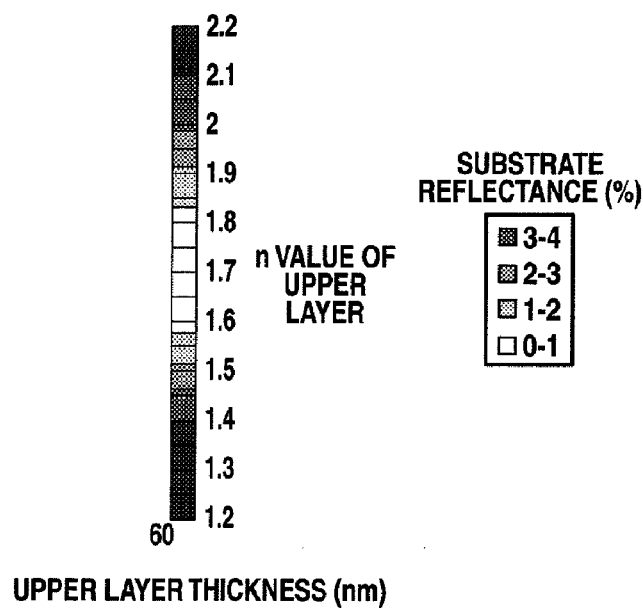
FIG. 6 is a graph, in connection with two-layer BARC, plotting the substrate reflectance when the extinction coefficient (k value) of upper layer is varied from 1.2 to 2.2 with the refractive index (k value) of upper layer fixed at 0.2 and the thickness fixed at 60 nm, under the condition NA=1.35 (lower layer having k=0.6, n=1.6 and a thickness of 40 nm).

FIG. 4 illustrates an example where a two-layer ARC is applied under the condition NA=1.35. Herein the upper layer of ARC has a fixed k value of 0.2, a fixed n value of 1.6, and a fixed thickness of 60 nm, and the lower layer has a fixed n value of 1.6, while the k value and thickness of the lower layer are varied. In FIG. 5, the upper layer of ARC has a fixed n value of 1.6, and the lower layer has a fixed k value of 0.6, a fixed n value of 1.6, and a fixed thickness of 40 nm, while the k value and thickness of the upper layer are varied. In both FIGS. 4 and 5, there exist ranges of k and thickness values within which reflectance is reduced to or below 1%. In FIG. 6, the lower layer has a k value of 0.6, a n value of 1.6, and a thickness of 40 nm, and the upper layer has a k value of 0.2 and a thickness of 60 nm, while the n value of the upper layer is varied. It is seen that the substrate reflectance can be reduced to or below 1% by optimizing the n value of the upper layer.

Figure 7:
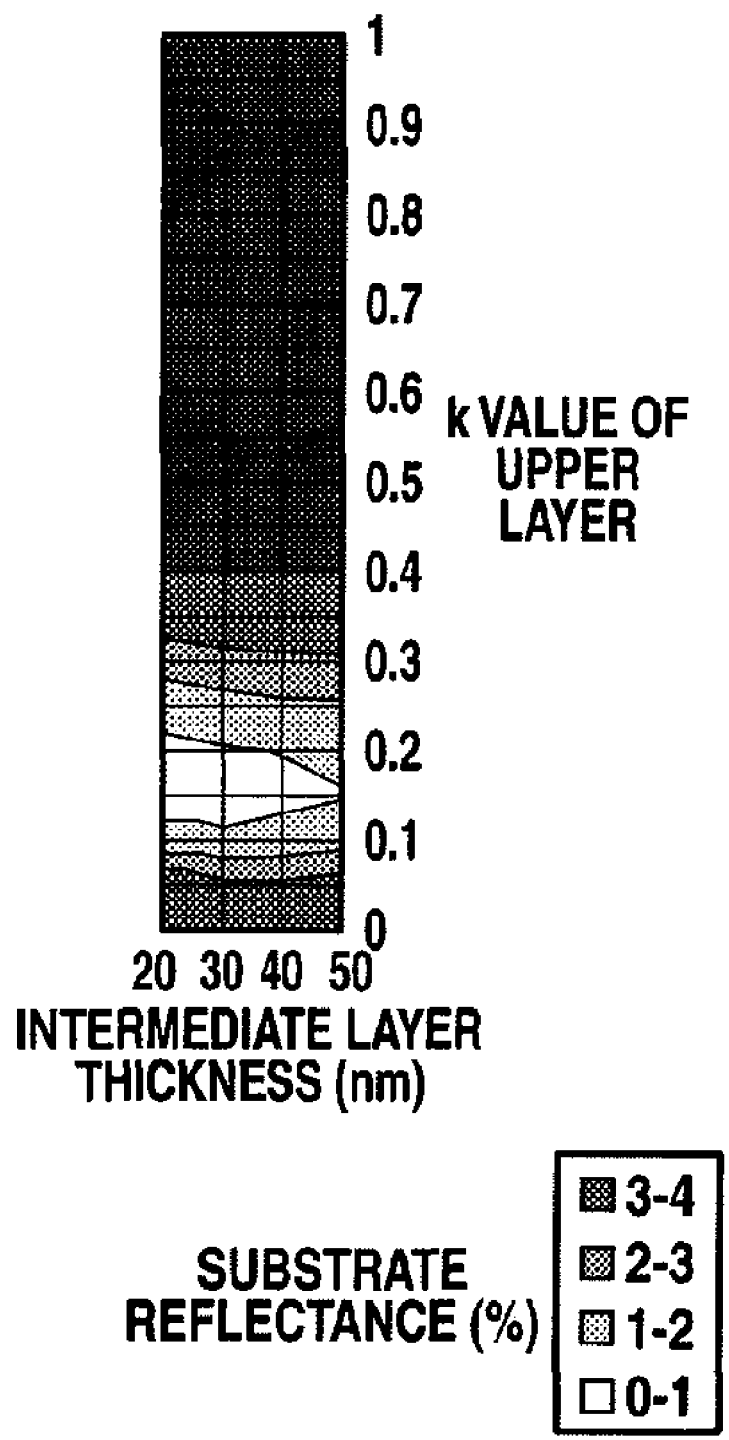
FIG. 7 is a graph, in connection with three-layer BARC, plotting the substrate reflectance versus intermediate layer thickness when the extinction coefficient (k value) of upper layer is varied from 0 to 1.0 under the condition NA=1.35 (upper layer having n=1.6 and a thickness of 45 nm, intermediate layer having k=0.4 and n=1.6, lower layer having k=0.6 and n=1.6, and upper, intermediate and lower layers summing to a thickness of 95 nm).

Next, reference is made to an example where an intermediate layer is present between the upper and lower layers, and the k value of the intermediate layer is intermediate those of the upper and lower layers. The diagram of FIG. 7 shows data obtained by computing reflectance when the thickness of the intermediate layer is increased. It is seen that as the intermediate layer becomes thicker, the reflectance increases so that the antireflection effect of two-layer ARC is reduced. It is believed that the intermediate layer is created by mixing of the upper and lower layers. When polymers (A) and (B) are separated in a film depth direction at the end of deposition, an ideal two-layer ARC film forms. If both the polymers are fully mixed without symptoms of separation, then the resulting ARC film exerts only the effect of a single layer. The acceptable thickness of the mixed layer is less than or equal to about 50% of the total thickness. If the thickness of the mixed layer exceeds 60% of the total thickness, reflection increases, indicating that the function of a two-layer ARC diminishes.

In the embodiment wherein the ARC-forming composition further contains an acid generator or crosslinker, the polymers undergo quick crosslinking reaction during baking after spin coating, forming a denser film. The denser film prevents intermixing with the overlying resist film and diffusion of low-molecular-weight components into the resist film, minimizing any profile degradation of the resist pattern. Further the ARC-forming composition is improved in application to the substrate when it contains an organic solvent.

In summary, the ARC-forming composition of the invention can be deposited by the same process as prior art organic ARCS. The resulting ARC is effective in preventing reflection of exposure light in photolithography. The ARC also has a high dry etching rate and is thus useful in forming a fine feature-size pattern.

Now, several embodiments of the invention are described in detail although the invention is not limited thereto. The terms "a" and "an" herein do not denote a limitation of quantity, but rather denote the presence of at least one of the referenced item. As used herein, the terminology "($C_x$—$C_y$)", as applied to a particular unit, such as, for example, a chemical compound or a chemical substituent group, means having a carbon atom content of from "x" carbon atoms to "y" carbon atoms per such unit. As used herein, the term "film" is used interchangeably with "coating" or "layer." The abbreviation "ARC" denotes antireflective coating, "BARC" is bottom antireflective coating, "Me" is methyl, "Ac" is acetyl, and "phr" is parts by weight per 100 parts by weight of the resin or polymer. The term "processable substrate" is interchangeable with patternable substrate and refers to a substrate that can be processed such as by etching to form a pattern therein.

Polymer A

The ARC-forming composition of the invention comprises (A) a polymer having an extinction coefficient (k value) in the range of 0.01 to 0.4 and a refractive index (n value) in the range of 1.4 to 2.1, and (B) a polymer containing an aromatic ring and having an extinction coefficient (k value) in the range of 0.3 to 1.2, at least one species for each polymer. All values of k and n are measured at the exposure wavelength used in the photolithography.

The polymer (A) comprises recurring units of at least one type represented by the general formula (1) and having an extinction coefficient (k value) in the range of 0.01 to 0.4 and a refractive index (n value) in the range of 1.4 to 2.1.

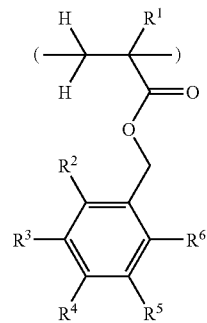

(1)

Herein $R^1$ is hydrogen, fluorine, methyl, or trifluoromethyl. $R^2$ to $R^6$ are each independently hydrogen, fluorine, trifluoromethyl, or a $C_1$-$C_5$ alkoxy group in which at least one hydrogen atom may be substituted by fluorine, with the proviso that not all $R^2$ to $R^6$ are hydrogen at the same time. It is preferred that at least one of $R^2$ to $R^6$ contain fluorine.

Where $R^2$ to $R^6$ in formula (1) are a $C_1$-$C_5$ alkoxy group in which at least one hydrogen atom may be substituted by fluorine, exemplary alkoxy groups include methoxy, ethoxy, n-propyloxy, isopropyloxy, cyclopentyloxy, n-butoxy, sec-butoxy, tert-butoxy, cyclobutoxy, n-pentyloxy, and cyclopentyloxy, and substituted forms of the foregoing in which some or all hydrogen atoms are substituted by fluorine atoms.

Illustrative examples of the recurring units having formula (1) are given below, but not limited thereto.

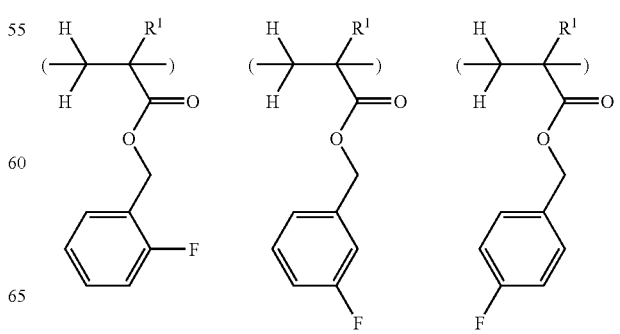

-continued
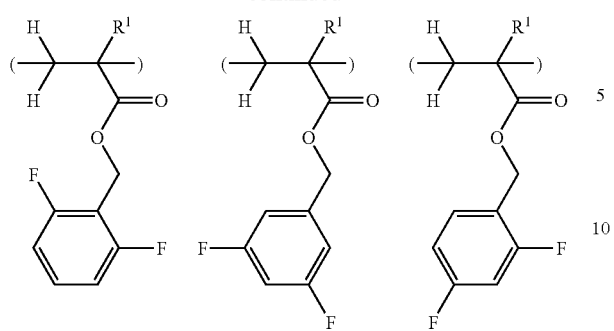
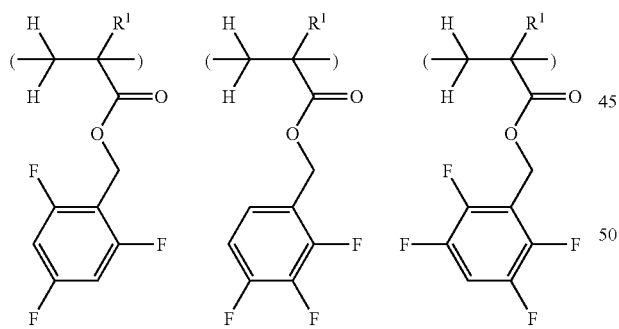
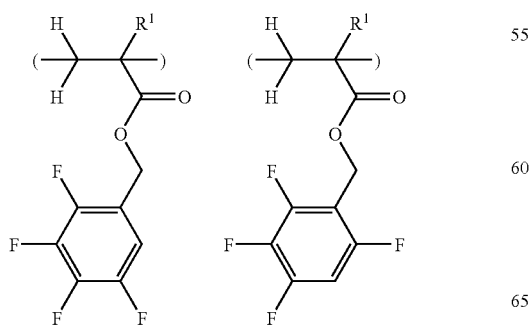
-continued
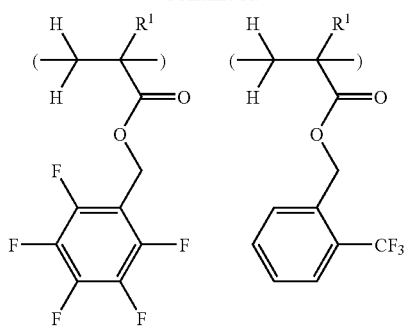
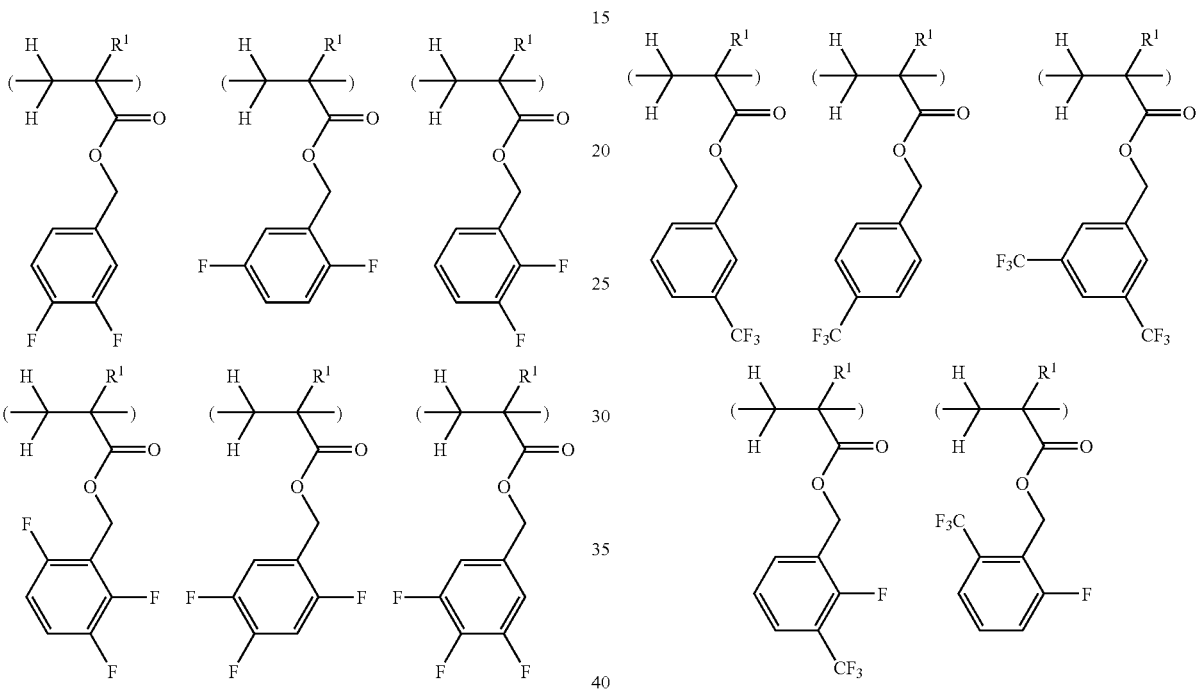
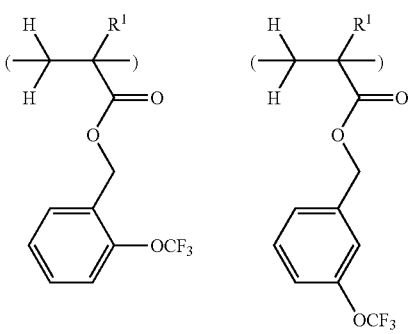
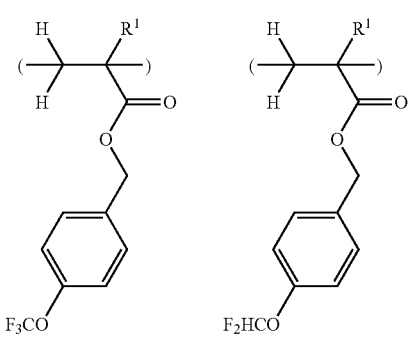

-continued

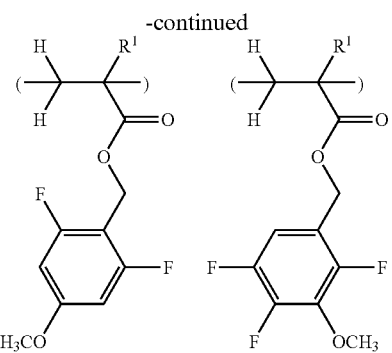

Herein R¹ is hydrogen, fluorine, methyl, or trifluoromethyl.

In polymer (A), preferably recurring units of at least one type selected from formulae (2) to (4) are further incorporated in order that polymer (A) and polymer (B) separate as two layers in film thickness direction and in order to tailor optical properties.

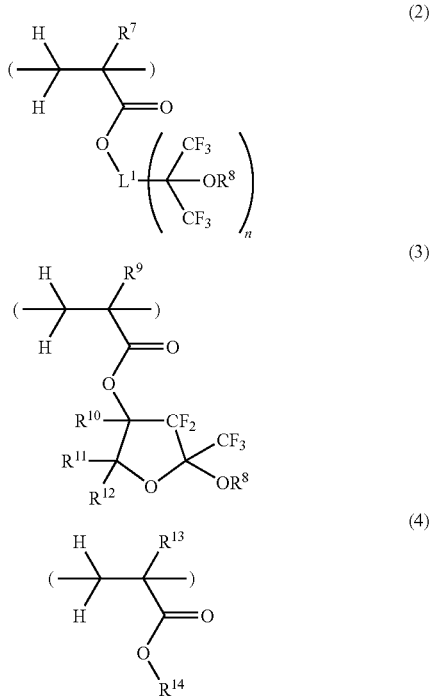

Herein $R^7$, $R^9$ and $R^{13}$ are each independently hydrogen, fluorine, methyl or trifluoromethyl. $R^8$ is hydrogen or a straight, branched or cyclic, monovalent hydrocarbon group of 1 to 30 carbon atoms in which some hydrogen atoms may be substituted by halogen and a constituent unit —$CH_2$— may be substituted by —O— or —C(=O)—. The subscript n is 1 or 2. $L^1$ is a straight, branched or cyclic, di- or trivalent hydrocarbon group of 1 to 15 carbon atoms. $R^{10}$ to $R^{12}$ are each independently hydrogen, halogen, hydroxyl or a straight, branched or cyclic, monovalent organic group of 1 to 15 carbon atoms, or at least any two of $R^{10}$ to $R^{12}$ may bond together to form a ring with the carbon atom or atoms to which they are attached. $R^{14}$ is a hydrocarbon group of 2 to 15 carbon atoms in which at least one hydrogen atom is substituted by fluorine.

In formula (2), $L^1$ is a straight, branched or cyclic, di- or trivalent hydrocarbon group of 1 to 15 carbon atoms. Examples include many hydrocarbons, such as methane, ethane, propane, n-butane, n-pentane, n-hexane, n-heptane, n-octane, n-nonane, n-decane, 2-methylpropane, 2-methylbutane, 2,2-dimethylpropane, 2-methylpentane, 2-methylhexane, 2-methylheptane, cyclopentane, cyclohexane, methylcyclopentane, methylcyclohexane, ethylcyclopentane, methylcycloheptane, ethylcyclohexane, 1-methyladamantane, 2-methyladamantane, 1-ethyladamantane, and 2-ethyladamantane, with two or three hydrogen atoms being eliminated.

$R^8$ is hydrogen or a straight, branched or cyclic, monovalent hydrocarbon group of 1 to 30 carbon atoms, preferably 1 to 20 carbon atoms, in which some hydrogen atoms may be substituted by halogen and a constituent unit —$CH_1$— may be substituted by —O— or —C(=O)—. The monovalent hydrocarbon groups represented by $R^8$ include protective groups for alcoholic hydroxyl group, for example, methyl, ethyl, propyl, isopropyl, n-butyl, sec-butyl, tent-butyl, tert-amyl, n-pentyl, n-hexyl, n-heptyl, n-octyl, n-nonyl, n-decyl, eicosanyl, cyclopropyl, cyclobutyl, cyclopentyl, cyclopentylmethyl, cyclopentylethyl, cyclopentylbutyl, cyclohexyl, cyclohexylmethyl, cyclohexylethyl, cyclohexylbutyl, methylcyclohexylmethyl, ethylcyclohexylmethyl, ethylcyclohexylethyl, and bicyclo[2.2.1]heptyl.

Also included are groups of the general formulae (R1-1) and (R1-2) shown below, tertiary alkyl groups of 4 to 20 carbon atoms, specifically 4 to 15 carbon atoms, trialkylsilyl groups in which each alkyl radical has 1 to 5 carbon atoms, oxoalkyl groups of 4 to 20 carbon atoms, specifically 4 to 15 carbon atoms, and acyl groups of 1 to 10 carbon atoms.

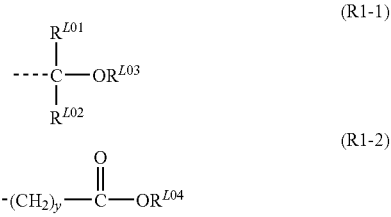

The broken line indicates a valence bond (throughout the specification).

In formula (R1-1), $R^{L01}$ and $R^{L02}$ are hydrogen or straight, branched or cyclic alkyl groups of 1 to 18 carbon atoms, preferably 1 to 10 carbon atoms. Examples of alkyl include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of these groups in which some hydrogen atoms are substituted by hydroxyl, alkoxy, oxo, amino, alkylamino or the like. Examples of the straight, branched or cyclic alkyl groups are as exemplified above for $R^{L01}$ and $R^{L02}$, and examples of the substituted alkyl groups are shown below.

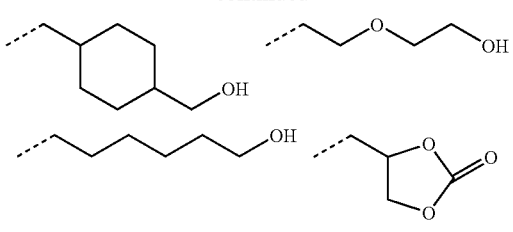

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (R1-2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (R1-1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Exemplary acyl groups include formyl, acetyl, ethylcarbonyl, pivaloyl, methoxycarbonyl, ethoxycarbonyl, tert-butoxycarbonyl, trifluoroacetyl, and trichloroacetyl. In formula (R1-2), y is an integer of 0 to 6.

Of the protective groups of formula (R1-1), the straight and branched ones are exemplified by the following groups.

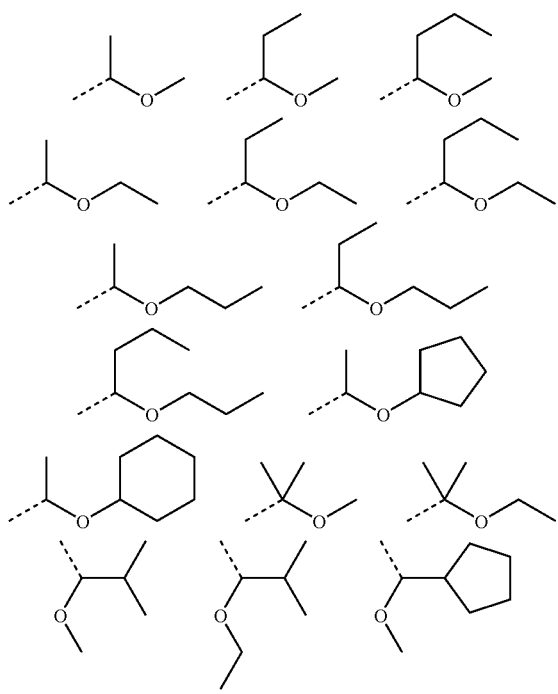

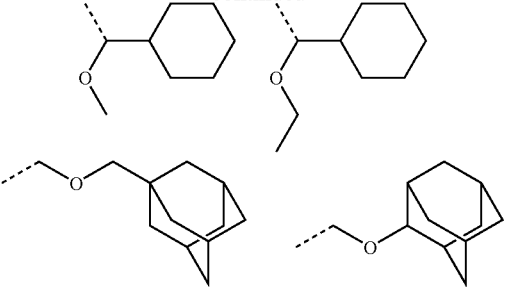

Of the protective groups of formula (R1-1), the cyclic ones are, for example, tetrahydrofuran-2-yl, 2-methyltetrahydrofuran-2-yl, tetrahydropyran-2-yl, and 2-methyltetrahydropyran-2-yl.

Examples of the protective groups of formula (R1-2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

In formula (3), $R^{10}$ to $R^{12}$ are each independently hydrogen, halogen, hydroxyl or a straight, branched or cyclic, monovalent organic group of 1 to 15 carbon atoms. Alternatively, at least any two of $R^{10}$ to $R^{12}$ may bond together to form a ring with the carbon atom(s) to which they are attached. Examples of the straight, branched or cyclic, monovalent organic group of 1 to 15 carbon atoms include monovalent hydrocarbon groups, for example, straight, branched or cyclic alkyl groups such as methyl, ethyl, propyl, isopropyl, n-butyl, sec-butyl, tert-butyl, tert-amyl, n-pentyl, n-hexyl, n-heptyl, n-octyl, n-nonyl, n-decyl, cyclopropyl, cyclobutyl, cyclopentyl, cyclopentylmethyl, cyclopentylethyl, cyclopentylbutyl, cyclohexyl, cyclohexylmethyl, cyclohexylethyl, cyclohexylbutyl, methylcyclohexylmethyl, ethylcyclohexylmethyl, ethylcyclohexylethyl, bicyclo[2.2.1]heptyl, bicyclo[2.2.1]heptylmethyl, bicyclo[2.2.1]heptylethyl, bicyclo[2.2.1] heptylbutyl, methylbicyclo[2.2.1]heptylmethyl, ethylbicyclo [2.2.1]heptylmethyl, ethylbicyclo[2.2.1]heptylethyl, bicyclo [2.2.2]octyl, bicyclo[2.2.2]octylmethyl, bicyclo[2.2.2] octylethyl, bicyclo[2.2.2]octylbutyl, methylbicyclo[2.2.2] octylmethyl, ethylbicyclo[2.2.2]octylmethyl, ethylbicyclo [2.2.2]octylethyl, tricyclo[5.2.1.0$^{2,6}$]decyl, tricyclo [5.2.1.0$^{2,6}$]decylmethyl, tricyclo[5.2.1.0$^{2,6}$]decylethyl, tricyclo[5.2.1.0$^{2,6}$]decylbutyl, methyltricyclo[5.2.1.0$^{2,6}$]decylmethyl, ethyltricyclo[5.2.1.0$^{2,6}$]decylmethyl, ethyltricyclo [5.2.1.0$^{2,6}$]decylethyl, adamantyl, adamantylmethyl, adamantylethyl, adamantylbutyl, methyladamantylmethyl, ethyladamantylmethyl, ethyladamantylethyl, tetracyclo [4.4.0.1$^{2,5}$.1$^{7,10}$]dodecyl, tetracyclo[4.4.0.1$^{2,5}$.1$^{7,10}$]dodecylmethyl, tetracyclo[4.4.0.1$^{2,5}$.1$^{7,10}$]dodecylethyl, tetracyclo [4.4.0.1$^{2,5}$.1$^{7,10}$]dodecylbutyl, tetracyclo[4.4.0.1$^{2,5}$.1$^{7,10}$] dodecylmethyl, ethyltetracyclo[4.4.0.1$^{2,5}$.1$^{7,10}$] dodecylmethyl, and ethyltetracyclo[4.4.0.1$^{2,5}$.1$^{7,10}$] dodecylethyl, aryl groups such as phenyl, methylphenyl, naphthyl, anthryl, and phenanthryl, and aralkyl groups such as benzyl, diphenylmethyl and phenethyl, alkoxy groups such as methoxy, ethoxy and propoxy, and acyloxy groups such as formyloxy and acetoxy. Also included are substituted forms of the foregoing groups in which some hydrogen atoms are substituted by halogen atoms, alkyl, aryl, alkoxy, alkoxycarbonyl, oxo, alkoxyalkyl, acyloxy, acyloxyalkyl, alkoxyalkoxy or other groups.

At least two of $R^{10}$ to $R^{12}$ in any combination may bond together to form a ring with the carbon atom(s) to which they are attached. A typical ring-forming combination is a pair of $R^{10}$ and $R^{11}$, a pair of $R^{10}$ and $R^{11}$, or a pair of $R^{11}$ and $R^{12}$. Exemplary rings thus formed are alicyclic hydrocarbons of 3 to 12 carbon atoms such as cyclopropane, cyclobutane, cyclopentane, cyclohexane, bicyclo[2.2.1]heptane, bicyclo[2.2.2]octane, tricyclo[5.2.1.0$^{2,6}$]decane, adamantane, and tetracyclo[4.4.0.1$^{2,5}$.1$^{7,10}$]dodecane, and fused rings containing at least one of the foregoing. Also included are substituted forms of the foregoing alicyclic hydrocarbons in which some hydrogen atoms are replaced by halogen atoms, hydroxyl, alkyl, aryl, alkoxy, alkoxycarbonyl, oxo, alkoxyalkyl, acyloxy, acyloxyalkyl, alkoxyalkoxy or other groups.

In formula (4), $R^{14}$ is a hydrocarbon group of 2 to 15 carbon atoms in which at least one hydrogen atom is substituted by fluorine. Examples include ethyl, propyl, isopropyl, n-butyl, sec-butyl, tert-butyl, tert-amyl, n-pentyl, n-hexyl, n-heptyl, n-octyl, n-nonyl, n-decyl, cyclopropyl, cyclobutyl, cyclopentyl, cyclopentylmethyl, cyclopentylethyl, cyclopentylbutyl, cyclohexyl, cyclohexylmethyl, cyclohexylethyl, cyclohexylbutyl, methylcyclohexylmethyl, ethylcyclohexylmethyl, ethylcyclohexylethyl, bicyclo[2.2.1]heptyl, and adamantyl, in which some or all hydrogen atoms are substituted by fluorine atoms.

Illustrative examples of the recurring units having formulae (2) to (4) are given below, but not limited thereto.

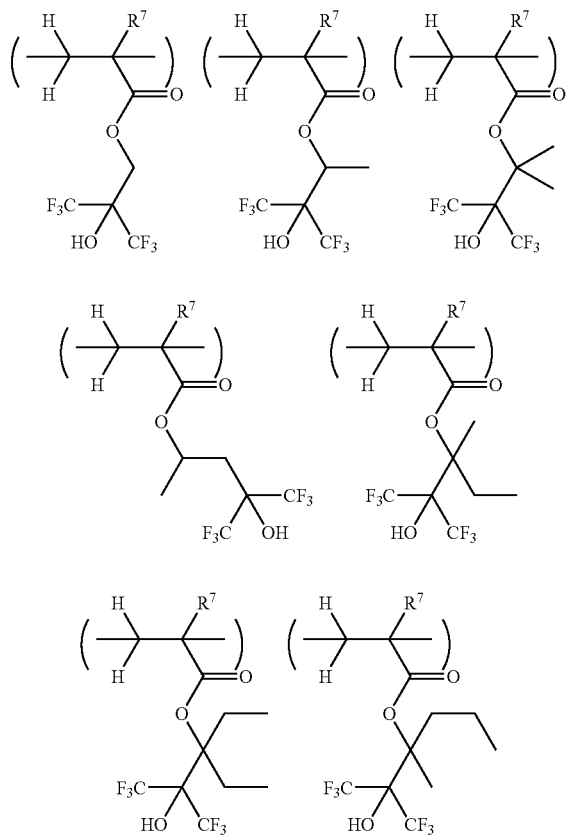

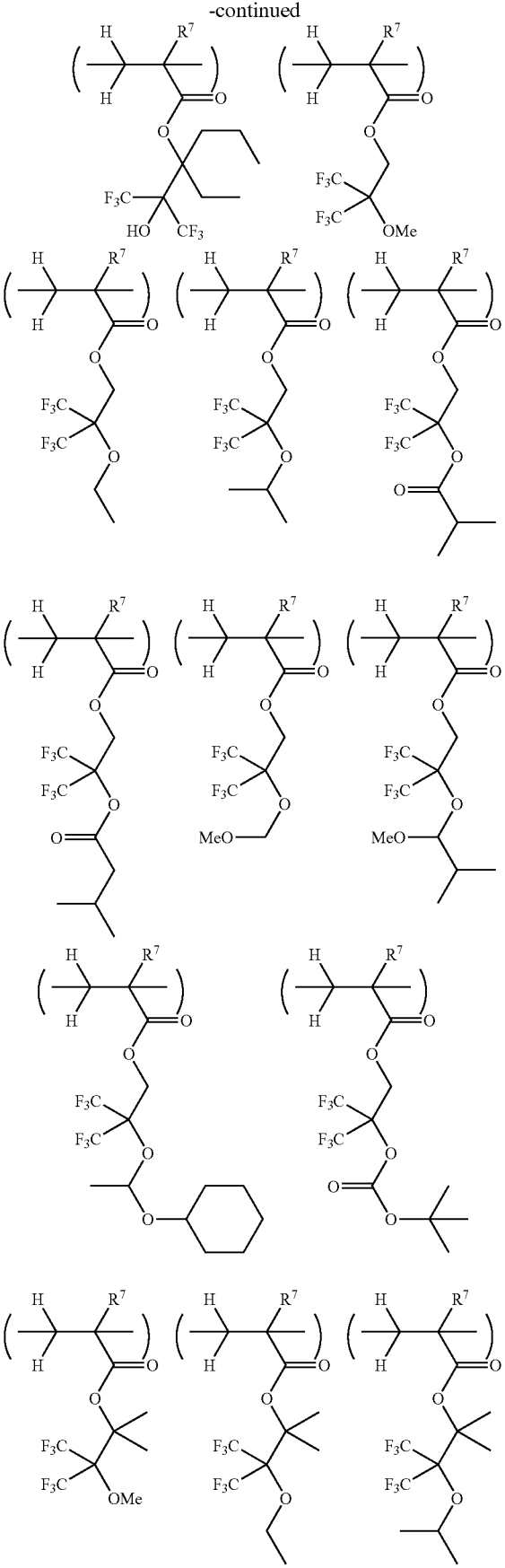

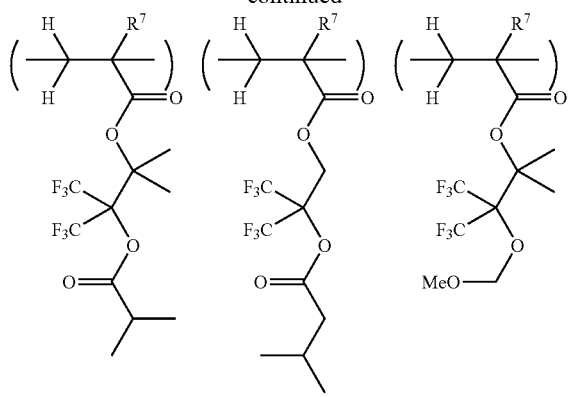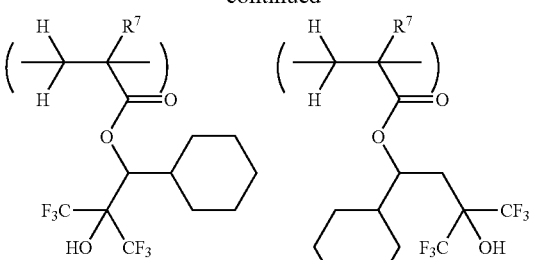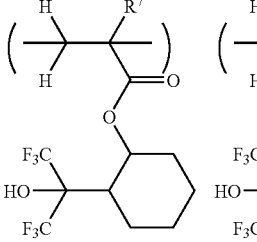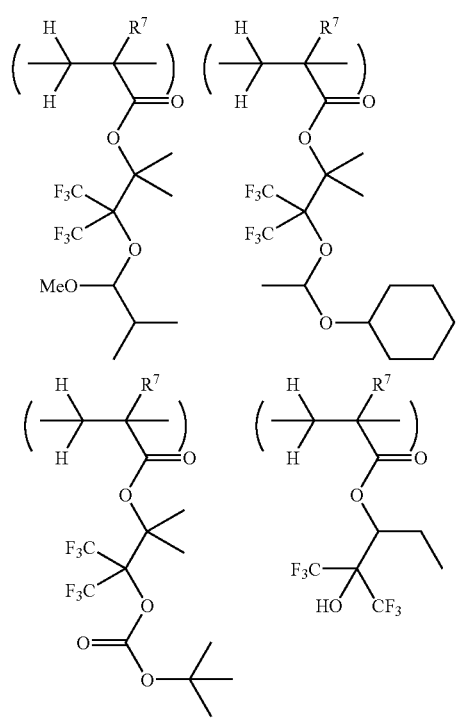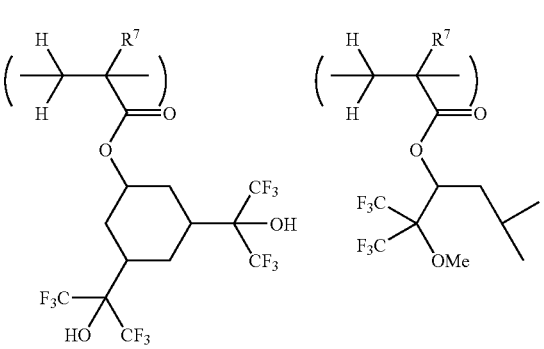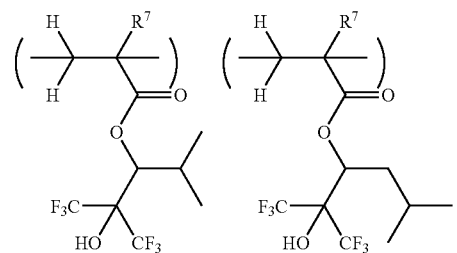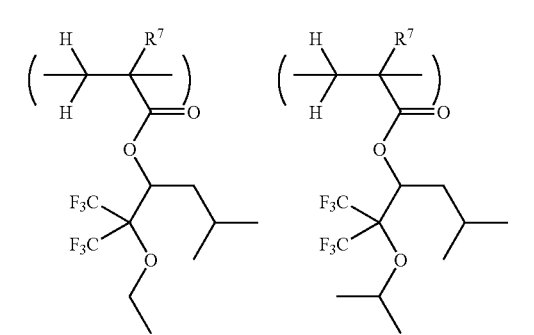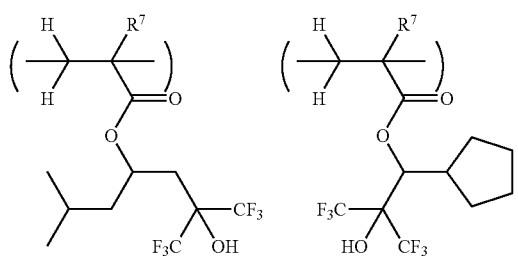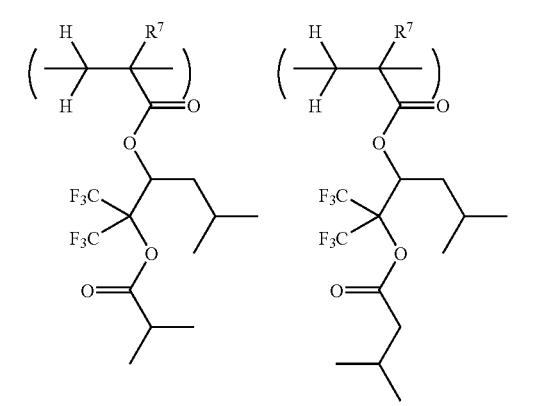

-continued
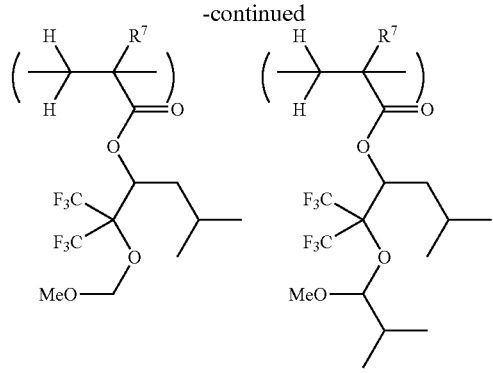
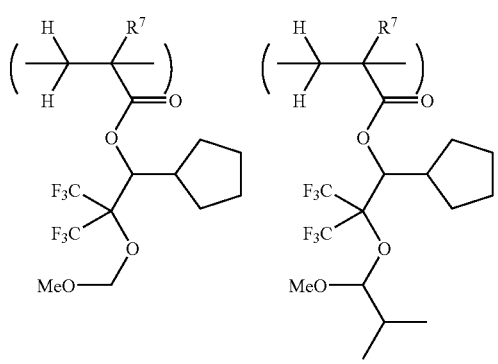
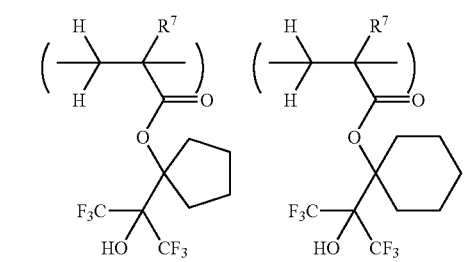
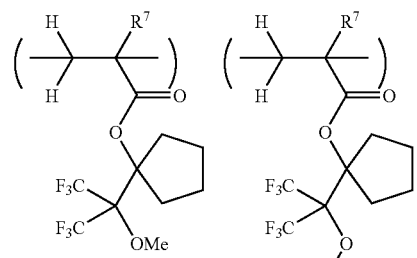
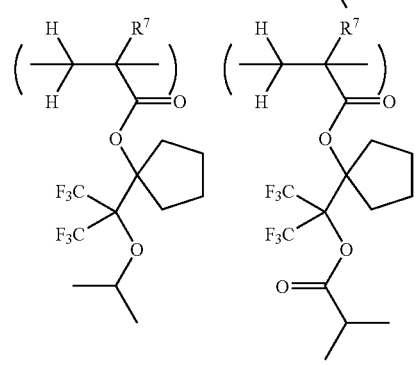
-continued
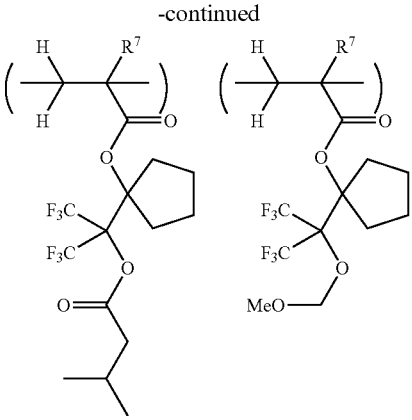
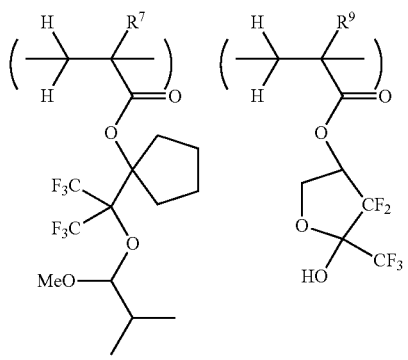
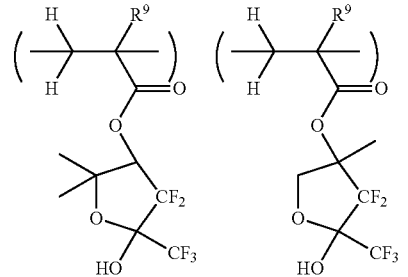
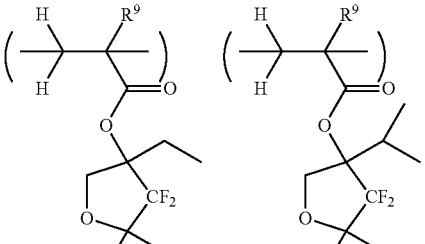
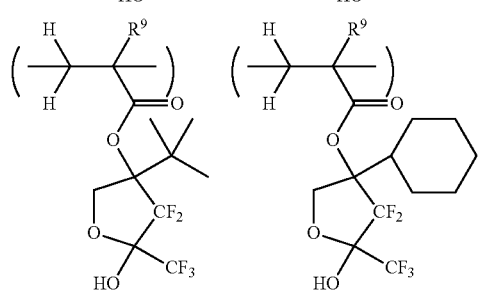

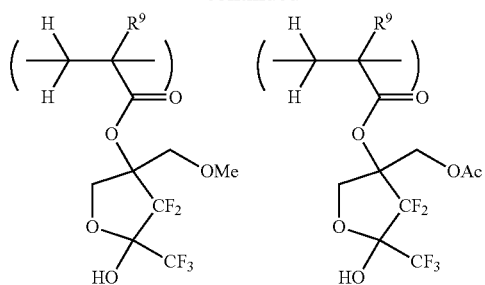
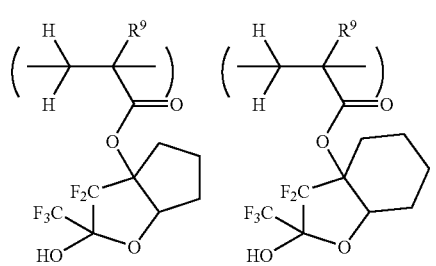
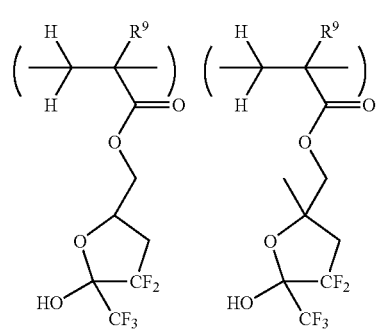
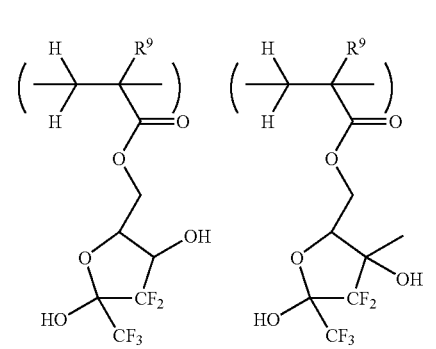
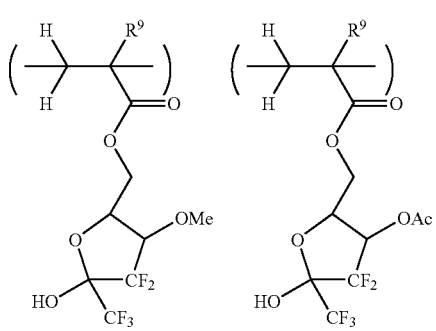
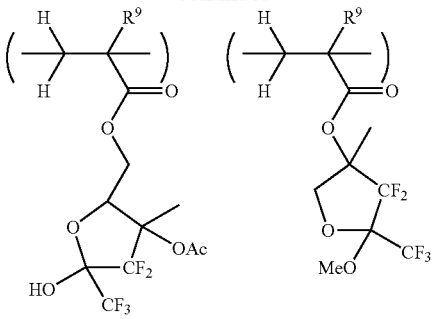
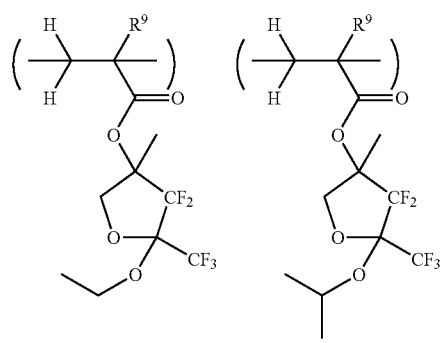
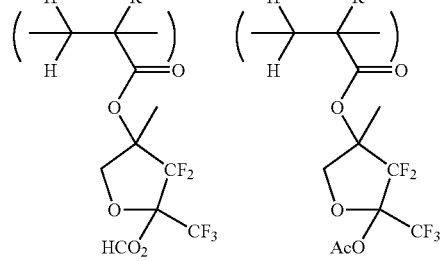
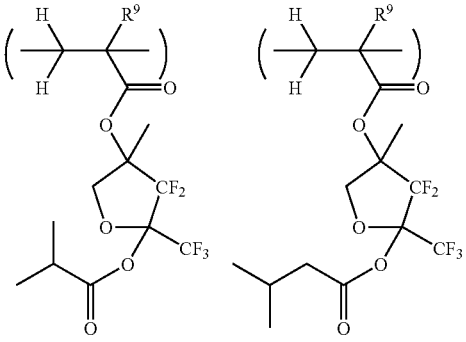
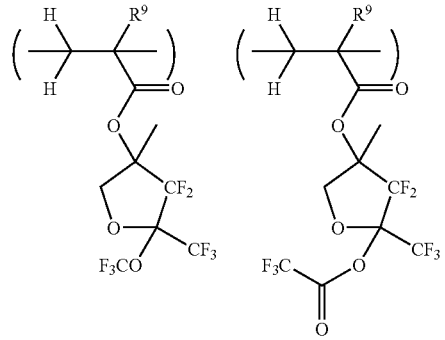

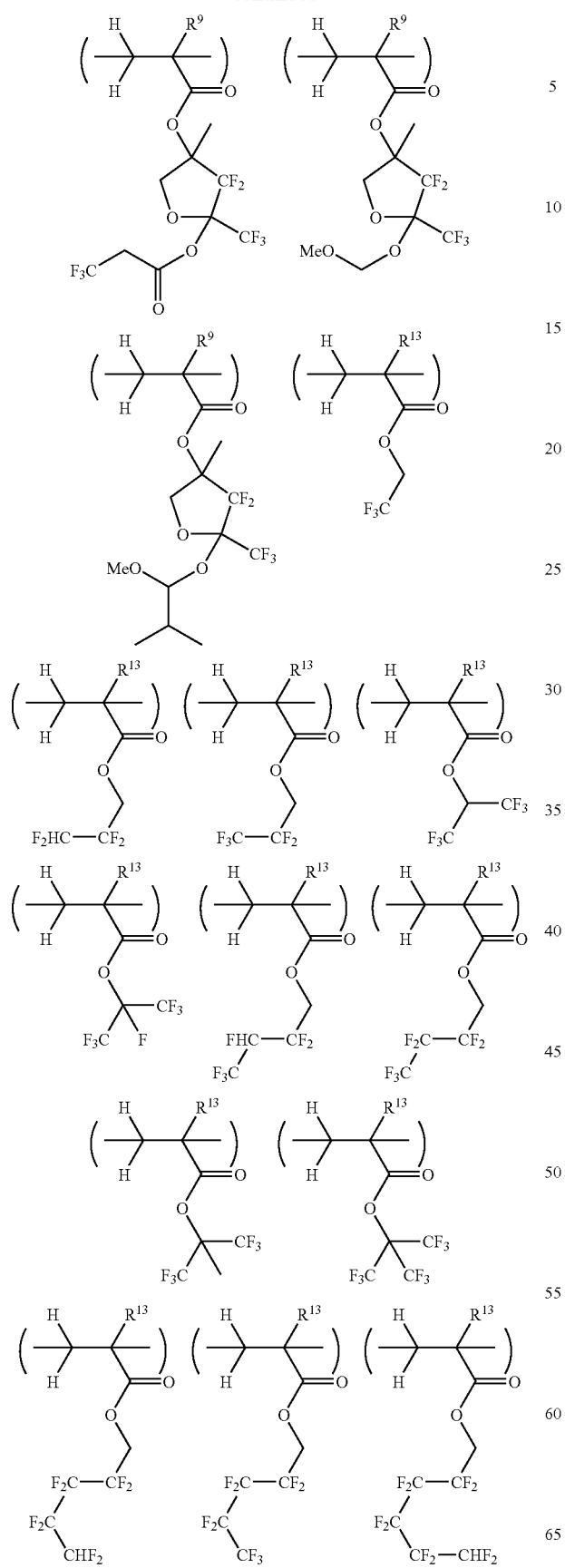
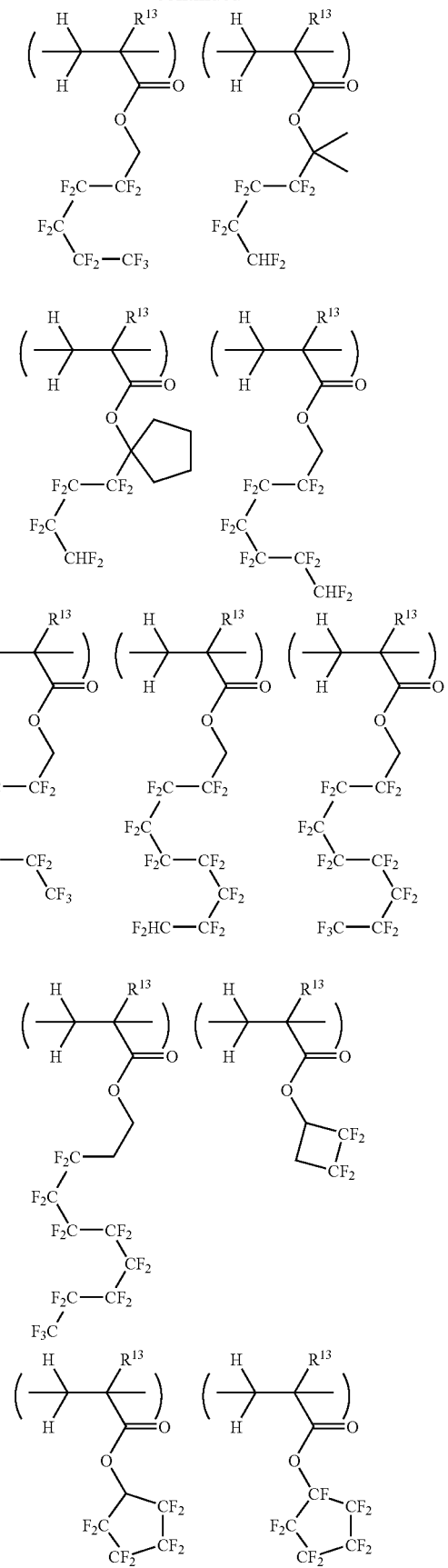

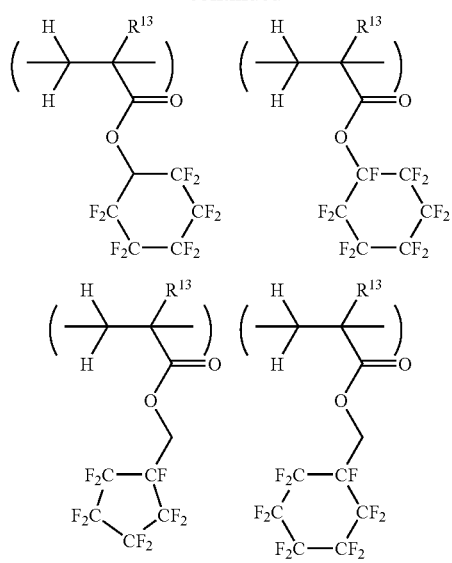
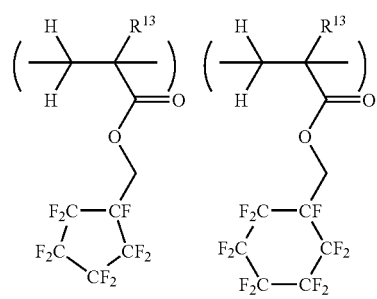
Herein $R^7$, $R^9$ and $R^{13}$ are hydrogen, fluorine, methyl or trifluoromethyl.
In polymer (A), aromatic ring-bearing recurring units of at least one type other than those of formulae (1) to (4) may be incorporated in order to tailor optical properties. Examples of such aromatic ring-bearing recurring units are given below, but not limited thereto.
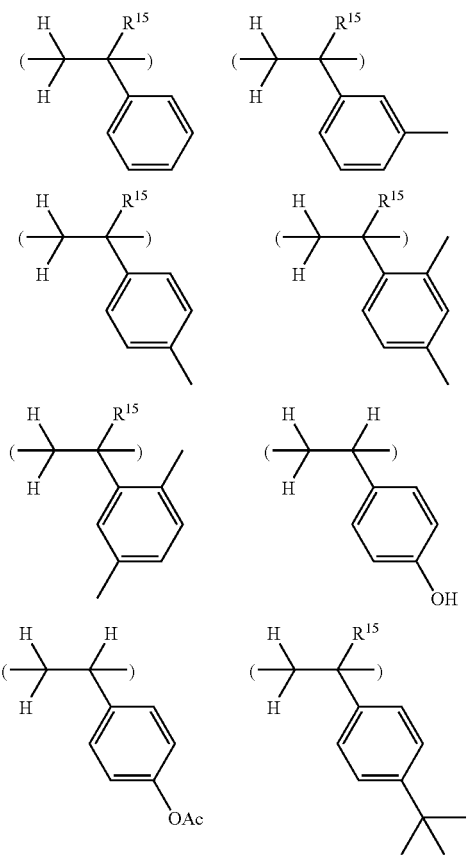
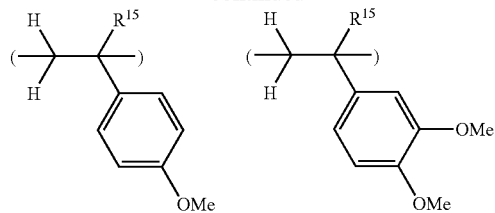
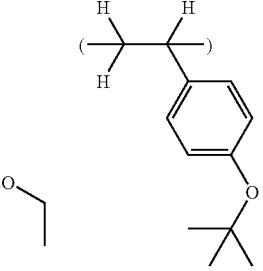
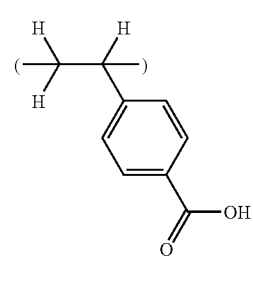
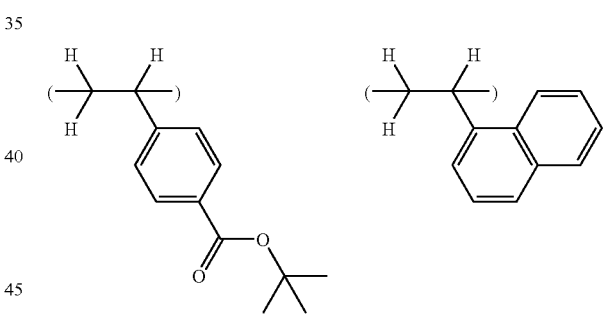
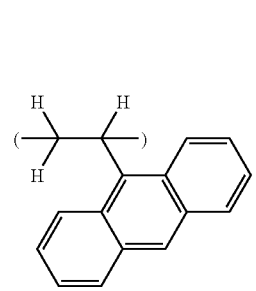
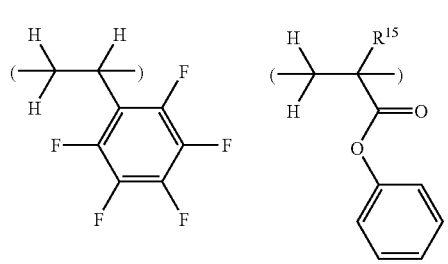

-continued

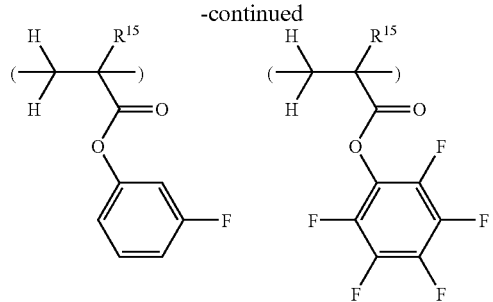
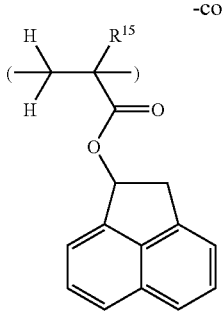
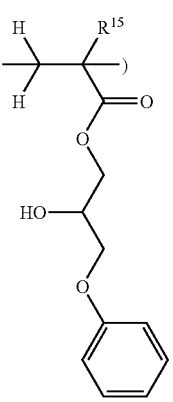

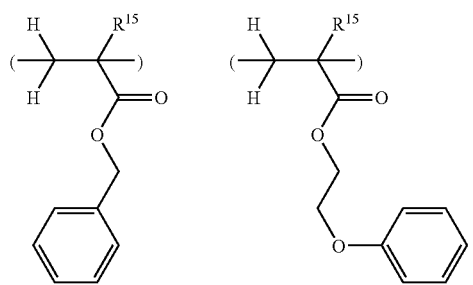
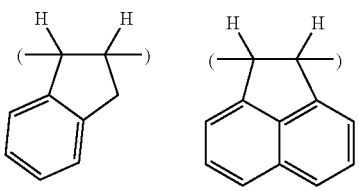

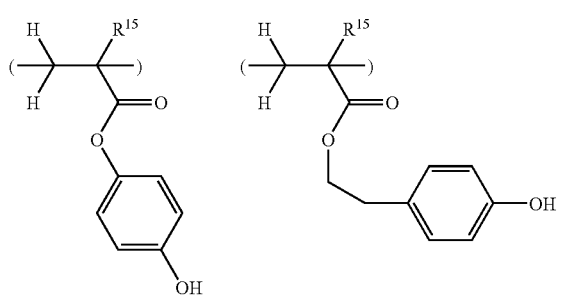
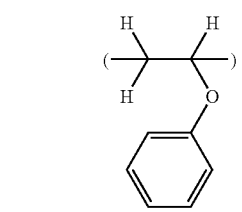

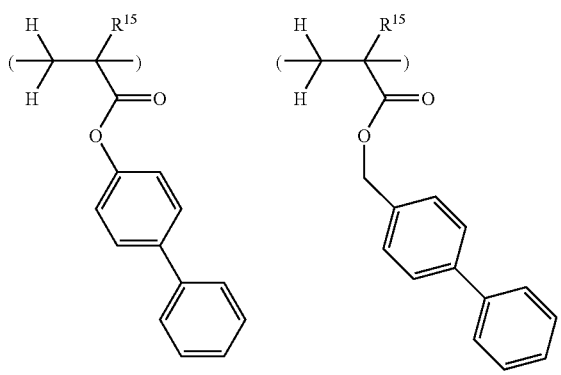

Herein $R^{15}$ is hydrogen, fluorine, methyl or trifluoromethyl.

In polymer (A), sulfur-containing recurring units of at least one type may be incorporated in order to tailor optical properties. Inclusion of sulfur atom is effective in increasing the refractive index (n value) of a polymer. Examples of sulfur-containing recurring units are given below, but not limited thereto.

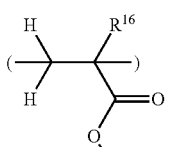
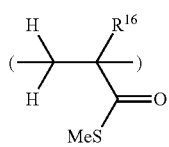

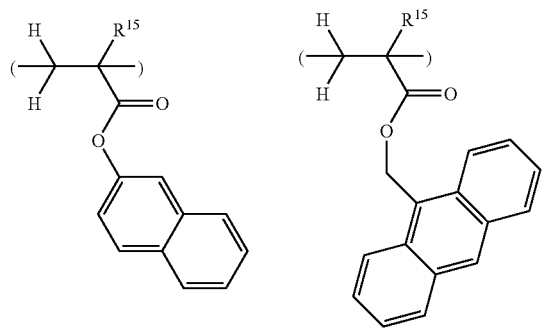
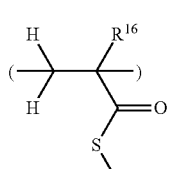
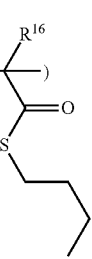

-continued

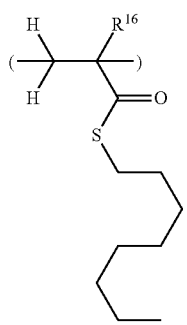
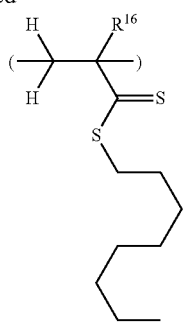
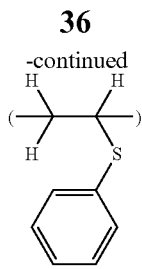

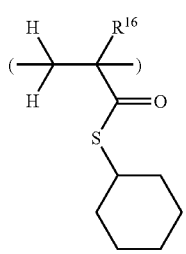
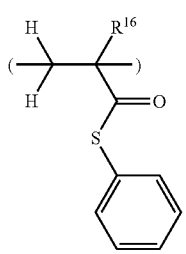

Herein $R^{16}$ is hydrogen, fluorine, methyl or trifluoromethyl.

For the purpose of forming a more densified ARC, preferably the polymer (A) may further comprise recurring units of at least one type capable of crosslinking reaction in the presence of an acid, for example, recurring units of at least one type containing a hydroxyl group, a crosslinking group derived from cyclic ether such as epoxide or oxetane, or a carboxyl group. In the embodiment wherein the polymer (A) contains recurring units capable of crosslinking reaction, the resulting ARC film has a more densified surface which is more effective in preventing intermixing with the overlying resist film or preventing low-molecular-weight components from diffusing into the resist film, minimizing any profile degradation of the resist pattern. Examples of such recurring units are given below, but not limited thereto.

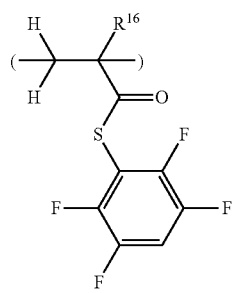
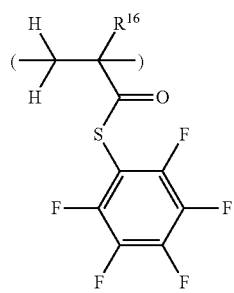

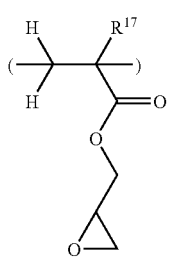
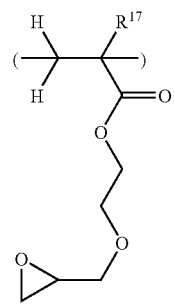

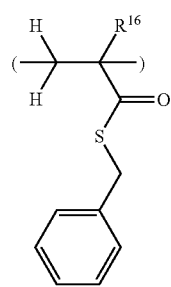
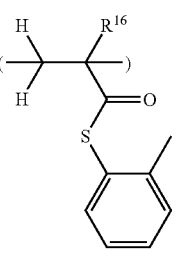

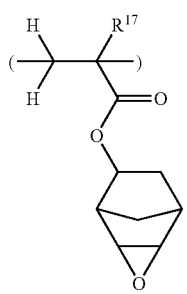
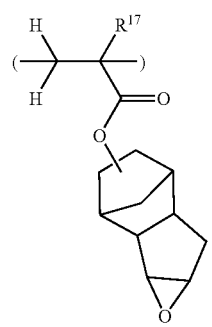

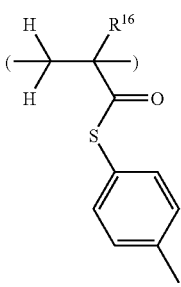
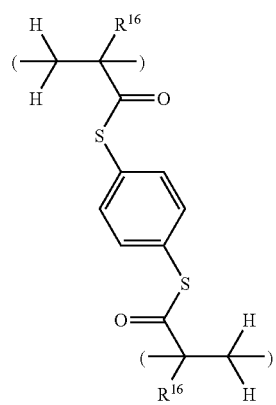

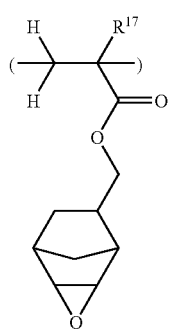
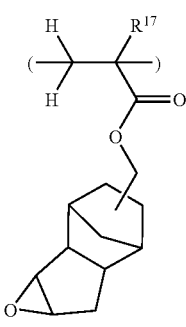

-continued

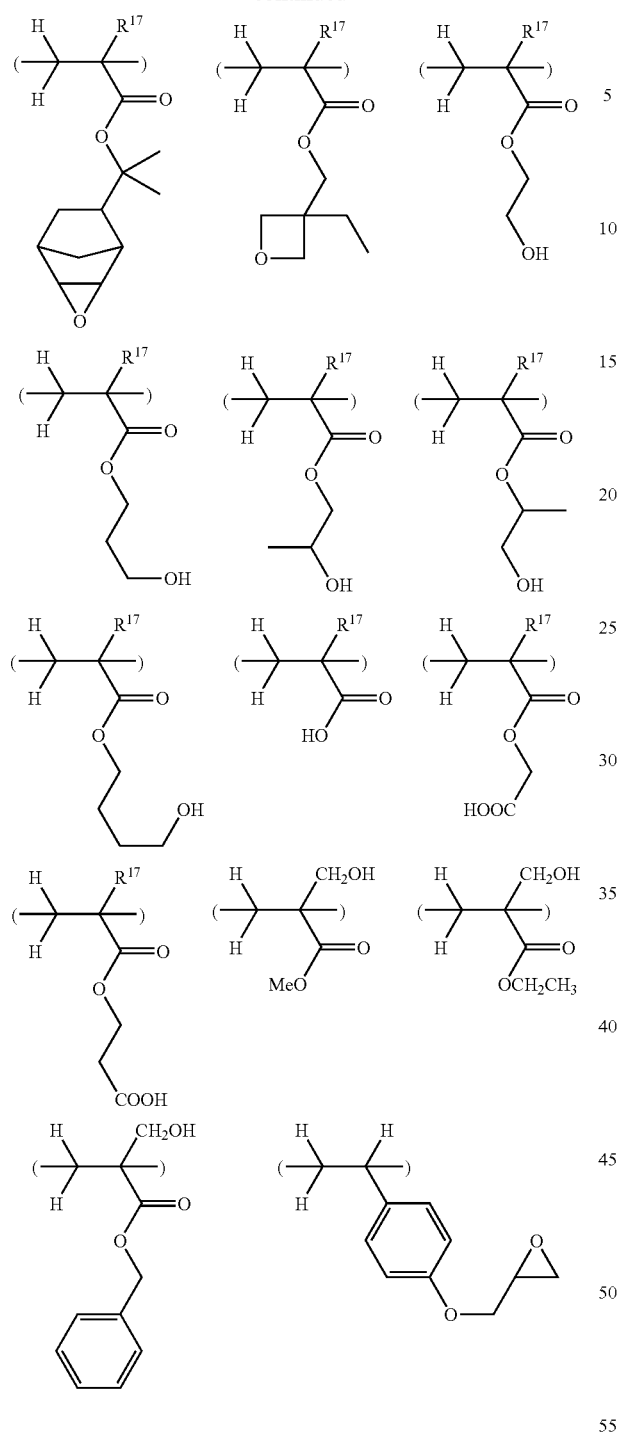
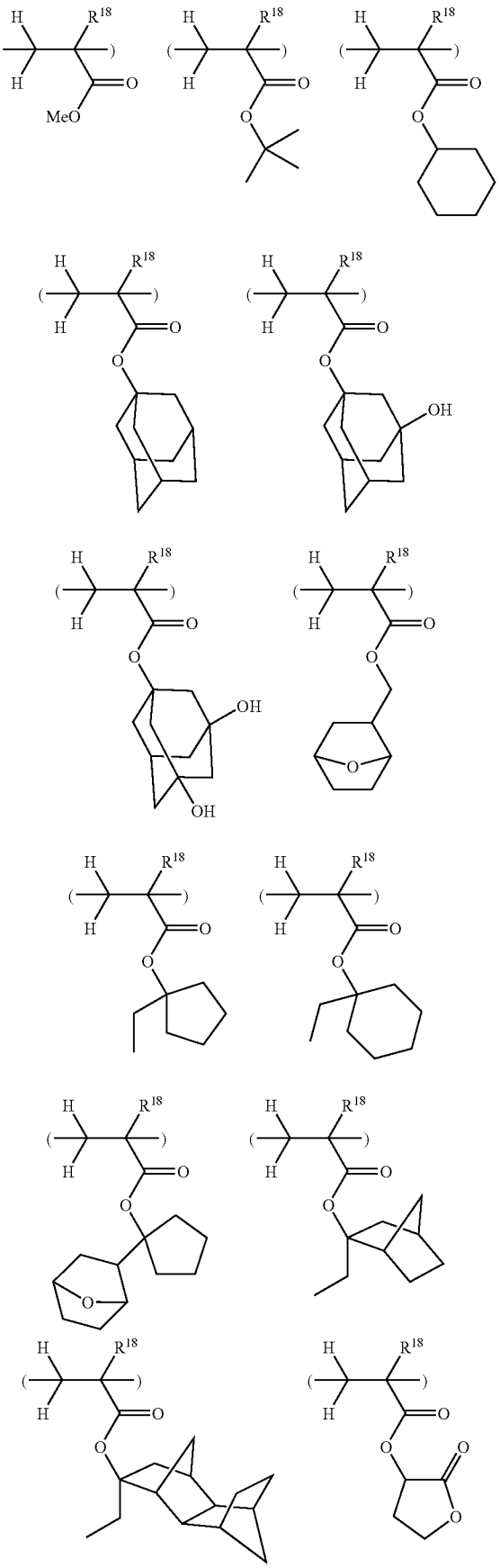

Herein $R^{17}$ is hydrogen, fluorine, methyl or trifluoromethyl.

For the purposes of improving adhesion to the overlying resist film and preventing an acid or basic compound from diffusing from the resist film, the polymer (A) may further comprise other recurring units of at least one type, for example, recurring units having acid labile groups as commonly included in resist base resins, recurring units having lactone structure, and recurring units derived from monomers of substituted (meth)acrylates, substituted norbornenes, unsaturated acid anhydrides, and the like. Examples of the other recurring units are given below, but not limited thereto.

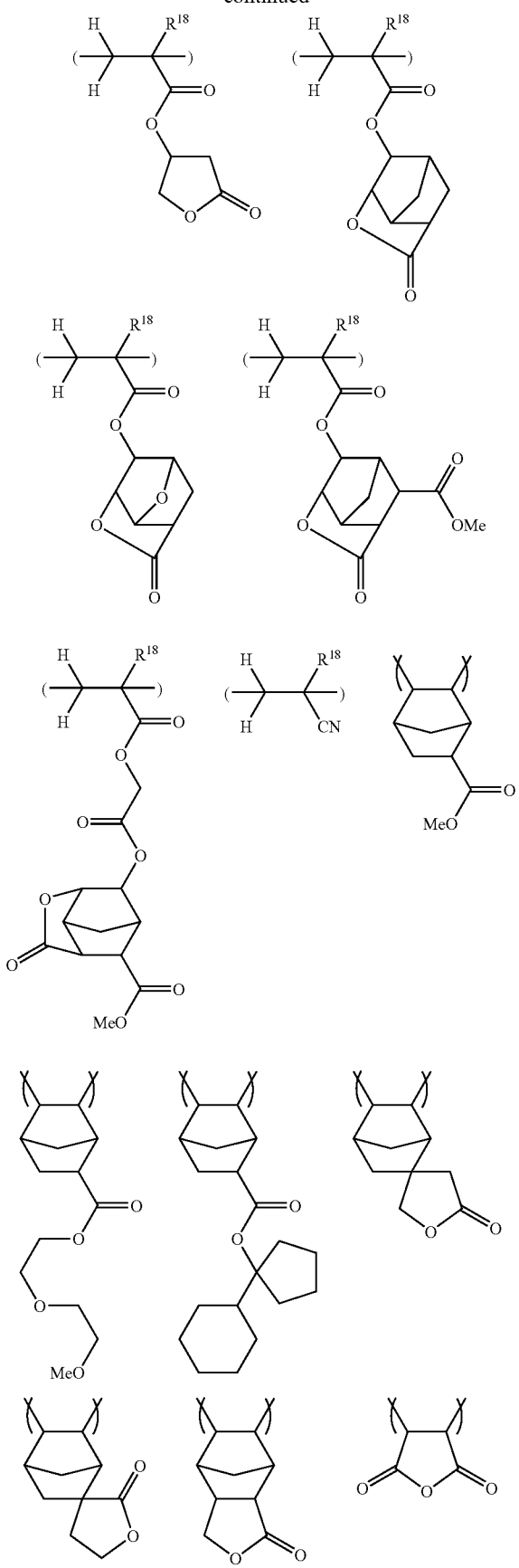
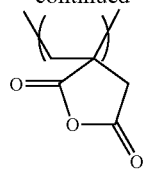

Herein $R^{18}$ is hydrogen, fluorine, methyl or trifluoromethyl.

In polymer (A), the respective recurring units are preferably incorporated in proportions <1> to <6> shown below although the invention is not limited to these ranges. The polymer (A) may comprise:

<1> recurring units of formula (1) in a proportion of 3 to 90 mol %, preferably 5 to 90 mol %, more preferably 8 to 80 mol %, and even more preferably 10 to 70 mol %;

<2> recurring units of formulae (2), (3) and (4) in a total proportion of 0 to 60 mol %, preferably 2 to 60 mol %, more preferably 3 to 60 mol %, even more preferably 4 to 50 mol %, and most preferably 5 to 40 mol %;

<3> aromatic ring-bearing recurring units other than recurring units of formulae (1) to (4) in a total proportion of 0 to 40 mol %, preferably 3 to 40 mol %, more preferably 4 to 35 mol %, and even more preferably 5 to 30 mol %;

<4> sulfur-containing recurring units in a proportion of 0 to 40 mol %, preferably 3 to 40 mol %, more preferably 4 to 35 mol %, and even more preferably 5 to 30 mol %;

<5> recurring units capable of crosslinking reaction in the presence of acid in a total proportion of 0 to 90 mol %, preferably 5 to 90 mol %, more preferably 8 to 80 mol %, and even more preferably 10 to 70 mol %; and <6> other recurring units in a total proportion of 0 to 60 mol %, specifically 1 to 60 mol %, preferably 3 to 50 mol %, and more preferably 5 to 40 mol %, with the proviso that the total of <1> to <6> is 100 mol %.

As to the monomers from which the recurring units of formulae (1) to (4) are derived, any commercially available monomers may be used as purchased, or they may be prepared by well-known organic chemical techniques. Specifically, the monomers from which the recurring units of formula (2) are derived may be prepared by the technique described in JP-A 2007-204385. Likewise the monomers from which the recurring units of formula (3) are derived may be prepared by the technique described in JP-A 2006-152255.

The monomers from which the aromatic ring-bearing recurring units other than recurring units of formulae (1) to (4), the sulfur-containing recurring units, the recurring units capable of crosslinking reaction in the presence of acid, and the other recurring units are derived may be commercially available monomers or prepared by well-known organic chemical techniques.

The polymer (A) may be prepared through various polymerization reactions, preferably radical polymerization.

For radical polymerization, preferred reaction conditions include (1) a solvent selected from hydrocarbon solvents such as benzene, toluene and xylene, glycol solvents such as propylene glycol monomethyl ether and propylene glycol monomethyl ether acetate (PGMEA), ether solvents such as diethyl ether, diisopropyl ether, dibutyl ether, tetrahydrofuran, and 1,4-dioxane, ketone solvents such as acetone, methyl ethyl ketone, methyl isobutyl ketone and methyl amyl ketone, ester solvents such as ethyl acetate, propyl acetate, butyl acetate and ethyl lactate, lactone solvents such as γ-butyrolactone, and alcohol solvents such as ethanol and isopropyl alcohol; (2) a polymerization initiator selected from well-known radical polymerization initiators including azo compounds such as 2,2'-azobisisobutyronitrile, 2,2'-azobis-2-methylisobutyronitrile, dimethyl 2,2'-azobisisobutyrate, 2,2'-azobis-2,4-dimethylvaleronitrile, 1,1'-azobis(cyclohexane-1-carbonitrile), and 4,4'-azobis(4-cyanovaleric acid), and peroxides such as lauroyl peroxide and benzoyl peroxide; (3) a radical chain transfer agent, if necessary for molecular weight control, selected from thiol compounds including 1-butanethiol, 2-butanethiol, 2-methyl-1-propanethiol, 1-octanethiol, 1-decanethiol, 1-tetradecanethiol, cyclohexanethiol, 2-mercaptoethanol, 1-mercapto-2-propanol, 3-mercapto-1-propanol, 4-mercapto-1-butanol, 6-mercapto-1-hexanol, 1-thioglycerol, thioglycolic acid, 3-mercaptopropionic acid, and thiolactic acid; (4) a reaction temperature in the range of about 0° C. to about 140° C.; and (5) a reaction time in the range of about 0.5 to about 48 hours. Reaction parameters outside these ranges need not be excluded.

The polymer (A) has a weight average molecular weight (Mw) of 1,000 to 200,000, and preferably 2,000 to 180,000, as measured by gel permeation chromatography (GPC) versus polystyrene standards. Outside the range, there is a likelihood of poor separation in a coating thickness direction between polymers (A) and (B) or an extremely low dry etching rate.

The polymer (A) should have an extinction coefficient (k value) at the exposure wavelength in the range of 0.01 to 0.4, preferably 0.02 to 0.38, and more preferably 0.03 to 0.35. With a k value of less than 0.01 or more than 0.4, no satisfactory antireflection effect is achievable (see FIGS. 5 and 7). The polymer (A) should also have a refractive index (n value) at the exposure wavelength in the range of 1.4 to 2.1, preferably 1.42 to 2.08, and more preferably 1.45 to 2.05. With an n value of less than 1.4 or more than 2.1, no satisfactory antireflection effect may be achievable. It is understood that the polymer (A) may be endowed with k and n values in the ranges by properly selecting the type and proportion of recurring units.

Polymer B

The ARC-forming composition of the invention also comprises the polymer (B) containing an aromatic ring and having an extinction coefficient (k value) at a preselected imaging radiation wavelength in the range of 0.3 to 1.2.

Suitable polymers include polymers from monomers having a polymerizable unsaturated bond such as styrene or its derivatives, indene, indole, methyleneindane, acenaphthylene, aromatic ring-bearing (meth)acrylic acid derivatives, vinyl naphthalene or its derivatives, vinyl anthracene or its derivatives, and vinyl carbazole. Exemplary are polymers comprising aromatic ring-bearing recurring units other than the recurring units of formulae (1) to (4) as illustrated above. Polyester resins, polyvinyl phenolic resins, polyether resins, and bisphenol A resins having an aromatic ring are also useful.

Also included are novolac resins obtained through condensation of phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, glycidyl 2-methylphenyl ether, 1-naphthol, 2-naphthol, 2-methyl-1-naphthol, 4-methoxy-1-naphthol, 7-methoxy-2-naphthol, dihydroxynaphthalenes (e.g., 1,5-dihydroxynaphthalene, 1,7-dihydroxynaphthalene, 2,6-dihydroxynaphthalene), methyl 3-hydroxy-naphthalene-2-carboxylate, indene, hydroxyanthracene, acenaphthylene, biphenyl, bisphenol, trisphenol, isothymol, polyindene, polyacenaphthylene, polystyrene, 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, and 5,5'-dimethyl-3,3,3',3'-tetramethyl-2,3,2',3'-tetrahydro-(1,1')-spiroblindene-6,6'-diol, with aldehydes.

Preferably the polymer (B) may further comprise recurring units capable of crosslinking reaction in the presence of an acid, for example, recurring units of at least one type containing a hydroxyl group, a crosslinking group derived from cyclic ether such as epoxide or oxetane, or a carboxyl group in order to form a more densified ARC film. When the polymer (B) comprises recurring units capable of crosslinking reaction, the resulting ARC film becomes densified enough to prevent intermixing with the overlying resist film or diffusion of low-molecular-weight components into the resist film, minimizing profile degradation of the resist pattern. Examples of the crosslinkable recurring units include those exemplified above as the crosslinkable recurring units in conjunction with polymer (A) and the recurring units shown below.

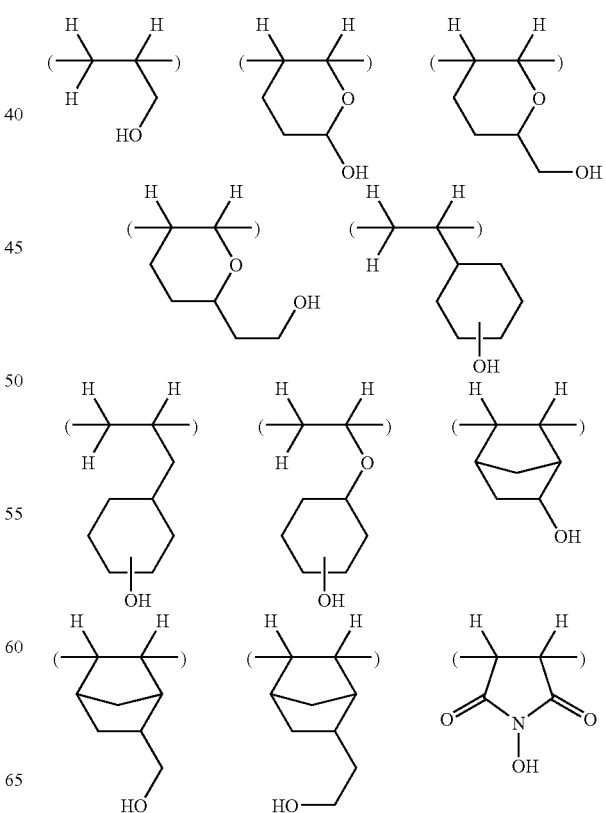

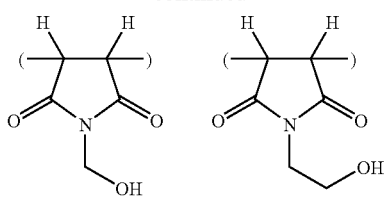

In polymer (B), the total of aromatic ring-bearing recurring units is preferably 30 to 100 mol %, and more preferably 40 to 100 mol %. If the proportion of aromatic ring-bearing recurring units is less than 30 mol %, polymer (B) may have an extinction coefficient (k value) of less than 0.3.

The preferred polymers (B) are copolymers comprising recurring units of the following structure.

poly(4-hydroxystyrene):

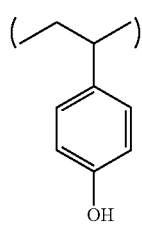

copolymers of 6-hydroxy-2-vinylnaphthalene and indene:

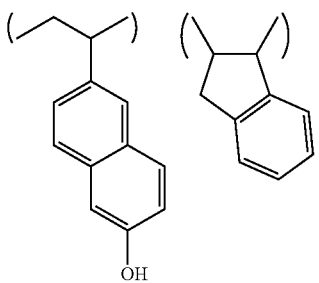

copolymers obtained through condensation of cresol and naphthol, hydroxypyrene, hydroxyfluorene, hydroxyindene or 4,4'-(9H-fluoren-9-ylidene)bisphenol with aldehydes:

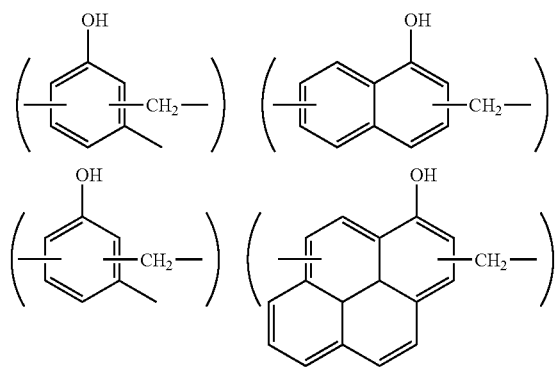

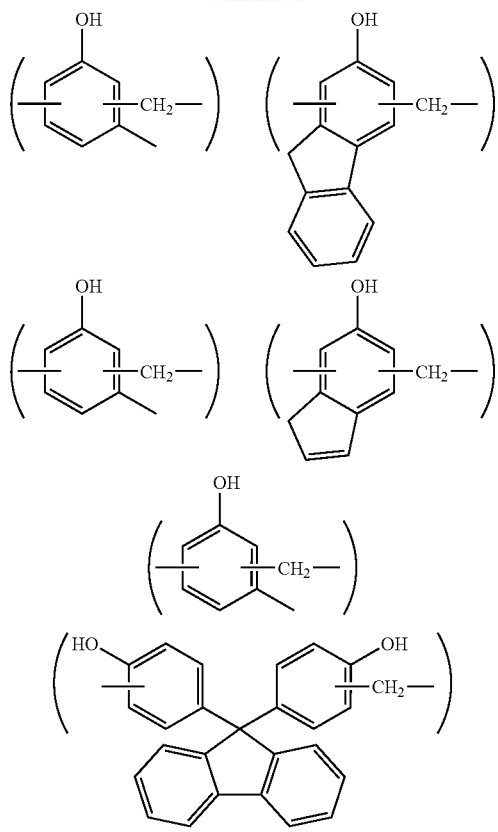

copolymers of 4-hydroxystyrene and 1-anthracenemethyl (meth)acrylate:

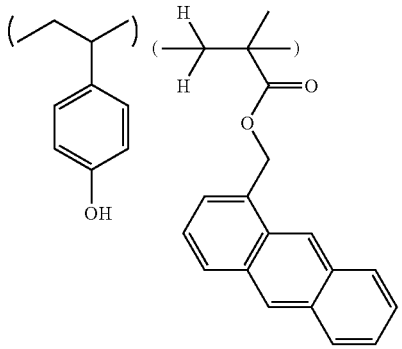

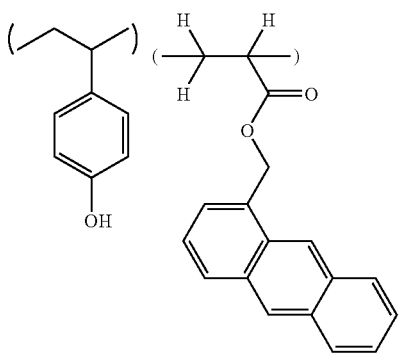

copolymers comprising recurring units of the following formula:

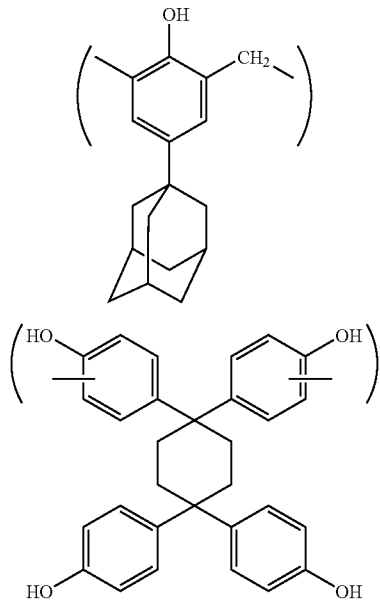

copolymers of acenaphthylene and hydroxystyrene:

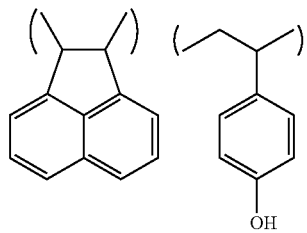

copolymers of glycidyl (meth)acrylate, hydroxystyrene and indene:

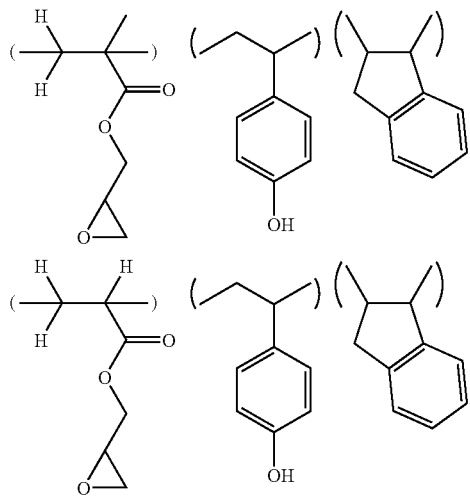

copolymers of indene and N-hydroxyethyl maleimide:

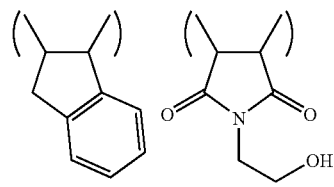

polymers comprising recurring units of the following formula:

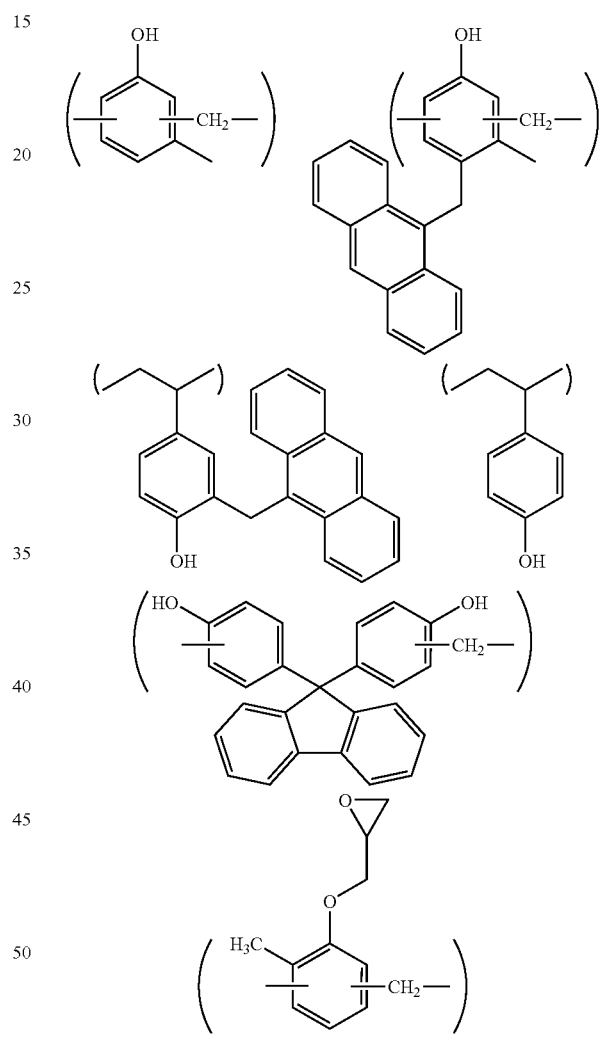

polymers obtained from polycondensation of polyhydric alcohols, for example, recurring units (I), recurring units (II), or combinations of recurring units (I) and (II), shown below, and epichlorohydrin:

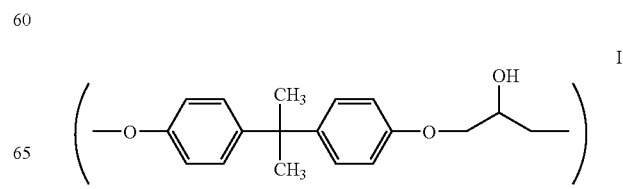

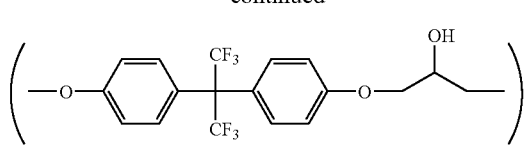

polymers obtained through polyaddition of acid anhydrides and polyhydric alcohols or polycondensation of carboxylic acids and polyhydric alcohols, for example, combinations of recurring units (i) and (ii), recurring units (i) and (iii), or recurring units (i), (ii) and (iii), shown below:

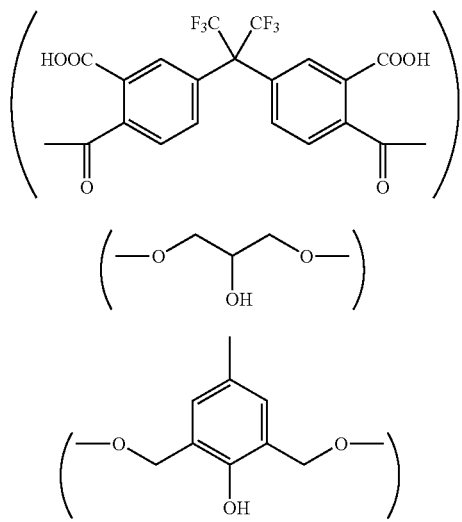

The polymer (B) has a weight average molecular weight (Mw) of 1,000 to 100,000, and preferably 1,500 to 90,000, as measured by GPC versus polystyrene standards. Outside the range, separation in a coating depth direction between polymers (A) and (B) may be compromised.

The polymer (B) should have an extinction coefficient (k value) at the exposure wavelength in the range of 0.3 to 1.2, preferably 0.32 to 1.18, and more preferably 0.35 to 1.15. With a k value of less than 0.3 or more than 1.2, no satisfactory antireflection effect is achievable.

For a better antireflection effect, it is necessary that the k value of polymer (B) be greater than the k value of polymer (A). Specifically the k value of polymer (B) is preferably greater than the k value of polymer (A) by at least 0.1, and more preferably by at least 0.2. It is understood that the polymer (B) may be endowed with a k value in the range by properly selecting the type and proportion of aromatic ring-bearing recurring units.

In the ARC-forming composition of the invention, polymers (A) and (B) are preferably present in a weight ratio between 30:70 and 80:20, and more preferably between 40:60 and 77:23.

In a preferred embodiment, the ARC-forming composition of the invention further comprises at least one member selected from an organic solvent, an acid generator and a crosslinker.

To the ARC-forming composition of the invention, an organic solvent is preferably added in order to facilitate coating to substrates. Where the ARC-forming composition contains an acid generator or crosslinker, crosslinking reaction of the polymers is facilitated during the heating or baking step following spin coating, forming a more densified film. This reduces a likelihood of intermixing with the resist film or diffusion of low-molecular-weight components into the resist film, minimizing profile degradation of the resist pattern.

The organic solvent and the amount thereof will be described later.

Acid Generator

To the ARC-forming composition of the invention, an acid generator may be added in order to facilitate thermally or otherwise induced crosslinking reaction. The acid generators include thermal acid generators capable of generating an acid through pyrolysis and photoacid generators capable of generating an acid upon exposure to light, and both are useful.

The acid generators used herein include
(i) onium salts of the formula (P1a-1), (P1a-2), (2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.
(i) Onium Salts of Formula (P1a-1), (P1a-2), (2) or (P1b):

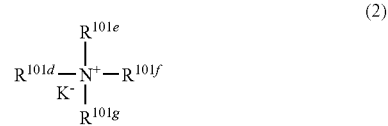

Herein, $R^{101a}$, $R^{101b}$ and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all hydrogen atoms may be replaced by alkoxy or other groups. Also, $R^{101b}$ and $R^{101c}$, taken together, may form a ring with the sulfur atom to which they are attached. $R^{101b}$ and $R^{101c}$ each are alkylene groups of 1 to 6 carbon atoms when they form a ring. $R^{101d}$, $R^{101e}$, $R^{101f}$, and $R^{101g}$ stand for hydrogen atoms or straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all hydrogen atoms may be replaced by alkoxy groups. A pair of $R^{101d}$ and $R^{101e}$ or a combination of $R^{101d}$, $R^{101e}$ and $R^{101f}$ may form a ring with the nitrogen atom to which they are attached, and in this event, $R^{101d}$ and $R^{101e}$ or $R^{101d}$, $R^{101e}$ and $R^{101f}$ together represent an alkylene group of 3 to 10 carbon atoms or a hetero-aromatic ring having the nitrogen atom incorporated therein. $K^-$ is a non-nucleophilic counter ion.

$R^{101a}$, $R^{101b}$, $R^{101c}$, $R^{101d}$, $R^{101e}$, $R^{101f}$, and $R^{101g}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary oxoalkenyl groups include 2-oxo-4-cyclohexenyl and 2-oxo-4-propenyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl.

Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl.

Examples of the non-nucleophilic counter ion represented by $K^-$ include halide ions such as chloride and bromide ions, fluoroalkylsulfonates such as triflate, 1,1,1-trifluoroethanesulfonate, and nonafluorobutanesulfonate, arylsulfonates such as tosylate, benzenesulfonate, 4-fluorobenzenesulfonate, and 1,2,3,4,5-pentafluorobenzenesulfonate, alkylsulfonates such as mesylate and butanesulfonate, imide acids such as bis(trifluoromethylsulfonyl)imide, bis(perfluoroethylsulfonyl)imide and bis(perfluorobutylsulfonyl)imide, methide acids such as tris(trifluoromethylsulfonyl)methide and tris(perfluoroethylsulfonyl)methide, and sulfonates having fluorine substituted at α-position as represented by the following general formula (K-1) and sulfonates having fluorine substituted at α- and β-positions as represented by the following general formula (K-2).

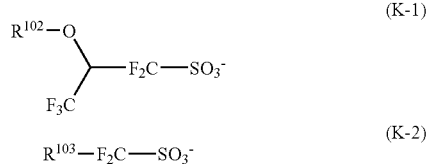

In formula (K-1), $R^{102}$ is a hydrogen atom, straight, branched or cyclic $C_1$-$C_{20}$ alkyl or acyl group, $C_2$-$C_{20}$ alkenyl group, or $C_6$-$C_{20}$ aryl or aryloxy group. In formula (K-2), $R^{103}$ is a hydrogen atom, straight, branched or cyclic $C_1$-$C_{20}$ alkyl group, $C_2$-$C_{20}$ alkenyl group, or $C_6$-$C_{20}$ aryl group.

Of the non-nucleophilic counter ions represented by $K^-$, those sulfonates having fluorine substituted at α-position are most preferred because of high acid strength and quick crosslinking reaction.

Examples of the hetero-aromatic ring having the nitrogen atom (in formula (2)) incorporated therein, represented by $R^{101d}$, $R^{101e}$, $R^{101f}$, and $R^{101g}$ include imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

The salts of (P1a-1) and (P1a-2) have both the functions of a photoacid generator and a thermal acid generator while the salts of (2) function as a thermal acid generator.

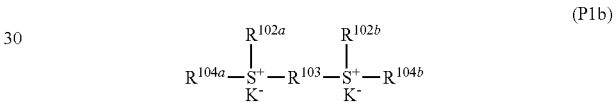

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the alkyl groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the alkylene groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the 2-oxoalkyl groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1), (P1a-2) and (2).

Among the onium salts of formulae (P1a-1), (P1a-2), (2) and (P1b), the salts of formulae (P1a-1), (P1a-2) and (P1b) generate acid in response to light or heat, and the salts of (2) generate acid in response to heat. Among the onium salts of formulae (P1a-1), (P1a-2), (2) and (P1b), the ammonium salts of formula (2) are most preferred as the acid generator to be added to the ARC-forming composition of the invention. Since the ammonium salts of formula (2) are thermally decomposed into amine and acid, the risk of evaporation by heat becoming a source of particulate emission is minimized. Accordingly, during pattern formation, the risk of the substrate being contaminated is minimized and the substrate is maintained at a high level of cleanness.

(ii) Diazomethane Derivatives of Formula (P2)

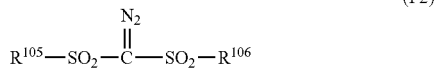

Herein, $R^{105}$ and $R^{106}$ independently represent straight, branched or cyclic $C_1$-$C_{12}$ alkyl or haloalkyl groups, $C_6$-$C_{20}$ aryl or haloaryl groups, or $C_7$-$C_{12}$ aralkyl groups.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary haloalkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary haloaryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

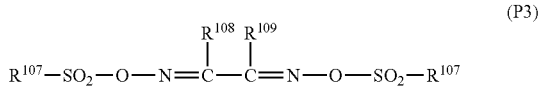

Herein, $R^{107}$, $R^{108}$, and $R^{109}$ independently represent straight, branched or cyclic $C_1$-$C_{12}$ alkyl or haloalkyl groups, $C_6$-$C_{20}$ aryl or haloaryl groups, or $C_7$-$C_{12}$ aralkyl groups. Also, $R^{108}$ and $R^{109}$, taken together, may form a ring with the carbon atoms to which they are attached. $R^{108}$ and $R^{109}$ each are a straight or branched $C_1$-$C_6$ alkylene group when they form a ring. $R^{105}$ is as defined in formula (P2).

Illustrative examples of the alkyl, haloalkyl, aryl, haloaryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

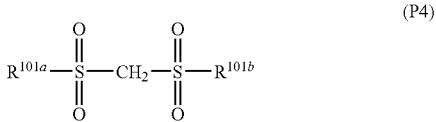

Herein, $R^{101a}$ and $R^{101b}$ are as defined above.

(v) Sulfonic Acid Esters of N-hydroxyimide Compounds of Formula (P5)

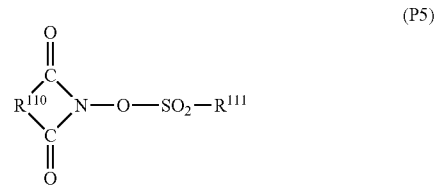

Herein, $R^{110}$ is a $C_6$-$C_{10}$ arylene group, $C_1$-$C_6$ alkylene group, or $C_2$-$C_6$ alkenylene group wherein some or all hydrogen atoms may be replaced by straight or branched $C_1$-$C_4$ alkyl or alkoxy groups, nitro, acetyl, or phenyl groups. $R^{111}$ is a straight, branched or cyclic $C_1$-$C_8$ alkyl group, alkenyl, alkoxyalkyl, phenyl or naphthyl group wherein some or all hydrogen atoms may be replaced by $C_1$-$C_4$ alkyl or alkoxy groups, phenyl groups (which may have substituted thereon a $C_1$-$C_4$ alkyl, alkoxy, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the $C_1$-$C_4$ alkyl groups include methyl, ethyl, propyl, isopropyl, n-butyl, isobutyl and tert-butyl; the $C_1$-$C_4$ alkoxy groups include methoxy, ethoxy, propoxy, isopropoxy, n-butoxy, isobutoxy, and tert-butoxy; the phenyl groups which may have substituted thereon a $C_1$-$C_4$ alkyl or alkoxy group, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the acid generator include:
onium salts such as
tetramethylammonium trifluoromethanesulfonate,
tetramethylammonium nonafluorobutanesulfonate,
triethylammonium nonafluorobutanesulfonate,
pyridinium nonafluorobutanesulfonate,
triethylammonium camphorsulfonate,
pyridinium camphorsulfonate,
tetra-n-butylammonium nonafluorobutanesulfonate,
tetraphenylammonium nonafluorobutanesulfonate,
tetramethylammonium p-toluenesulfonate,
(p-methoxyphenylmethyl)dimethylphenylammonium trifluoro-methanesulfonate,
diphenyliodonium trifluoromethanesulfonate,
bis(p-tert-butylphenyl)iodonium trifluoromethanesulfonate,
bis(p-tert-butylphenyl)iodonium nonafluorobutanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate, tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate],
1,2'-naphthylcarbonylmethyltetrahydrothiophenium triflate,
triethylammonium nonaflate, tributylammonium nonaflate, tetraethylammonium nonaflate, tetrabutylammonium nonaflate,
triethylammonium bis(trifluoromethylsulfonyl)imide, and
triethylammonium tris(perfluoroethylsulfonyl)methide;
  diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
  glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
  bissulfone derivatives such as
bisnaphthylsulfonylmethane, bistrifluoromethylsulfonylmethane,
bismethylsulfonylmethane, bisethylsulfonylmethane,
bispropylsulfonylmethane, bisisopropylsulfonylmethane,
bis-p-toluenesulfonylmethane, and bisbenzenesulfonylmethane;
  β-ketosulfonic acid derivatives such as
2-cyclohexylcarbonyl-2-(p-toluenesulfonyl)propane and
2-isopropylcarbonyl-2-(p-toluenesulfonyl)propane;
  disulfone derivatives such as diphenyl disulfone and dicyclohexyl disulfone;
  nitrobenzyl sulfonate derivatives such as
2,6-dinitrobenzyl p-toluenesulfonate and
2,4-dinitrobenzyl p-toluenesulfonate;
  sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
  sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethane-sulfonate, and
N-hydroxy-5-norbornene-2,3-dicarboxyimide p-toluenesulfonate.
  Preferred among these acid generators are onium salts such as triethylammonium nonafluorobutanesulfonate,
(p-methoxyphenylmethyl)dimethylphenylammonium trifluoro-methanesulfonate,
bis(p-tert-butylphenyl)iodonium nonafluorobutanesulfonate,
triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate, trinaphthylsulfonium trifluoromethanesulfonate,
cyclohexylmethyl(2-oxocyclohexyl)sulfonium trifluoromethane-sulfonate,
(2-norbornyl)methyl(2-oxocylohexyl)sulfonium trifluoromethanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane; and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These acid generators may be used singly or in combinations of two or more thereof. The acid generator is preferably added in an amount of 0.1 to 50 parts by weight, and more preferably 0.5 to 40 parts by weight, per 100 parts by weight of the polymers combined. At least 0.1 phr of the acid generator generates a sufficient amount of acid to induce crosslinking reaction. Up to 50 phr of the acid generator minimizes the occurrence of a mixing phenomenon that acid migrates to the overlying resist layer.

Crosslinker

Suitable crosslinkers of addition type which can be used herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as an alkenyl ether group. Acid anhydrides are also useful as the crosslinker.

Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Examples of the acid anhydride include aromatic acid anhydrides such as phthalic anhydride, trimellitic anhydride, pyromellitic anhydride, 3,3',4,4'-benzophenonetetracarboxylic dianhydride, biphenyltetracarboxylic dianhydride, 4,4'-(isopropylidene)diphthalic anhydride, and 4,4'-(hexafluoroisopropylidene)diphthalic anhydride, and alicyclic carboxylic anhydrides such as tetrahydrophthalic anhydride, methyltetrahydrophthalic anhydride, hexahydrophthalic anhydride, methylhexahydrophthalic anhydride, endomethylene-tetrahydrophthalic anhydride, dodecenylsuccinic anhydride, trialkyltetrahydrophthalic anhydrides.

In the embodiment of the ARC-forming composition wherein one polymer comprises recurring units having a glycidyl group, addition of a hydroxyl-containing compound is effective. In particular, compounds having at least two hydroxyl groups in a molecule are preferred. Examples of suitable hydroxyl-containing compounds include alcoholic group-containing compounds such as naphthol novolac, m- and p-cresol novolac, naphthol-dicyclopentadiene novolac, m- and p-cresol-dicyclopentadiene novolac, 4,8-bis(hydroxymethyl)tricyclo[$5.2.1.0^{2,6}$]-decane, pentaerythritol, 1,2,6-hexanetriol, 4,4',4"-methylidene triscyclohexanol, 4,4'-[1-[4-[1-(4-hydroxycyclohexyl)-1-methylethyl]phenyl]-ethylidene]biscyclohexanol, [1,1'-bicyclohexyl]-4,4'-diol, methylenebiscyclohexanol, decahydronaphthalene-2,6-diol, and [1,1'-bicyclohexyl]-3,3',4,4'-tetrahydroxyl; and
  low-nuclear phenol compounds such as
bisphenol, methylene bisphenol,
2,2'-methylenebis[4-methylphenol],
4,4'-methylidene-bis[2,6-dimethylphenol],
4,4'-(1-methyl-ethylidene)bis[2-methylphenol],
4,4'-cyclohexylidene bisphenol,
4,4'-(1,3-dimethylbutylidene)bisphenol,
4,4'-(1-methylethylidene)bis[2,6-dimethylphenol],
4,4'-oxybisphenol, 4,4'-methylenebisphenol,
bis(4-hydroxyphenyl)methanone,
4,4'-methylene bis[2-methylphenol],
4,4'-[1,4-phenylenebis(1-methylethylidene)]bisphenol,
4,4'-(1,2-ethanediyl)bisphenol,
4,4'-(diethylsilylene)bisphenol,
4,4'-[2,2,2-trifluoro-1-(trifluoromethyl)ethylidene]bisphenol,
4,4',4"-methylidene trisphenol,
4,4'-[1-(4-hydroxyphenyl)-1-methylethyl]phenyl]ethylidene]-bisphenol, 2,6-bis[(2-hydroxy-5-methylphenyl)methyl]-4-methylphenol,
4,4',4"-ethylidyne tris[2-methylphenol],
4,4',4"-ethylidyne trisphenol,
4,6-bis[(4-hydroxyphenyl)methyl]-1,3-benzenediol,
4,4'-[(3,4-dihydroxyphenyl)methylene]bis[2-methylphenol],
4,4',4",4'''-(1,2-ethanediylidene)tetrakisphenol,
4,4',4",4'''-(1,2-ethanediylidene)tetrakis[2-methylphenol],
2,2'-methylenebis[6-[(2-hydroxy-5-methylphenyl)methyl]-4-methylphenol],
4,4',4",4'''-(1,4-phenylenedimethylidyne)tetrakisphenol,
2,4,6-tris(4-hydroxyphenylmethyl)-1,3-benzenediol,
2,4',4"-methylidenetrisphenol,
4,4',4'''-(3-methyl-1-propanyl-3-ylidene)trisphenol,
2,6-bis[(4-hydroxy-3-fluorophenyl)methyl]-4-fluorophenol,
2,6-bis[4-hydroxy-3-fluorophenyl]methyl]-4-fluorophenol,
3,6-bis[(3,5-dimethyl-4-hydroxyphenyl)methyl]-1,2-benzenediol,
4,6-bis[(3,5-dimethyl-4-hydroxyphenyl)methyl]-1,3-benzenediol,
p-methylcalix[4]arene,
2,2'-methylenebis[6-[(2,5/3,6-dimethyl-4/2-hydroxyphenyl)-methyl]-4-methylphenol,
2,2'-methylenebis[6-[(3,5-dimethyl-4-hydroxyphenyl)methyl]-4-methylphenol,
4,4',4",4'''-tetrakis[(1-methylethylidene)bis(1,4-cyclohexylidene)]phenol,
6,6'-methylenebis[4-(4-hydroxyphenylmethyl)-1,2,3-benzenetriol, and
3,3',5,5'-tetrakis[(5-methyl-2-hydroxyphenyl)methyl]-[(1,1'-biphenyl)-4,4'-diol].

In the ARC-forming composition, the crosslinker is preferably compounded in an amount of 1 to 50 parts by weight, more preferably 2 to 40 parts by weight per 100 parts by weight of the polymers combined. At least 1 phr of the crosslinker minimizes the risk of mixing with the resist film. Up to 50 phr of the crosslinker minimizes the risk that the antireflection effect is reduced or the crosslinked film cracks. The crosslinkers may be used alone or in admixture of two or more.

Organic Solvent

The organic solvent used in the ARC-forming composition of the invention may be any organic solvent in which the base polymers, acid generator, crosslinker and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol, ethyl lactate and PGMEA, and mixtures thereof.

The organic solvent is preferably added in an amount of 200 to 10,000 parts by weight, especially 300 to 8,000 parts by weight per 100 parts by weight of the polymers combined.

Basic Compound

In the ARC-forming composition of the invention, a basic compound may be compounded for improving the storage stability. The basic compound plays the role of a quencher for preventing a minute amount of acid generated from the acid generator from promoting crosslinking reaction during shelf storage.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

The basic compounds may be used alone or in admixture of two or more. The basic compound is preferably formulated in an amount of 0.001 to 2 parts by weight, and especially 0.01 to 1 part by weight, per 100 parts by weight of the polymers combined. At least 0.001 phr of the basic compound provides the desired effect whereas up to 2 phr of the basic compound minimizes the risk of trapping the entirety of thermally generated acid to inhibit crosslinking reaction.

Process

Another aspect of the invention is a process for forming a pattern in a substrate by lithography. Specifically, the patterning process involves at least the steps of applying the ARC-forming composition onto a substrate to form an ARC film, applying a photoresist composition over the ARC film to form a photoresist film, exposing a pattern circuitry region of the photoresist film to radiation, developing the photoresist film with a liquid developer to form a pattern in the photoresist film, and etching the ARC film and substrate through the resist pattern as a mask for thereby forming a pattern in the substrate.

Using the ARC-forming composition of the invention, an ARC film can be formed on a processable substrate. The processable substrate is formed on a (support) substrate. The processable substrate may be selected from low dielectric constant films of Si, $SiO_2$, SiON, SiN, polycrystalline silicon (p-Si), amorphous silicon ($\alpha$-Si), W, W—Si, Al, Cu, Al—Si and the like and etching stop films thereof, and typically formed to a thickness of 10 to 10,000 nm, especially 20 to 5,000 nm. The support substrate is not particularly limited and is typically made of a material different from the processable substrate material, such as Si, $SiO_2$, SiON, SiN, p-Si, $\alpha$-Si, W, TiN, Al or the like.

In another embodiment, a hard mask may be laid on the processable substrate for facilitating processing of the processable substrate. When the processable substrate is a dielectric layer of $SiO_2$ based material, the hard mask is selected from SiN, SiON, p-Si, $\alpha$-Si, W, and W—Si. When the processable substrate is a gate electrode of p-Si, W—Si, Al—Si or the like, the hard mask is selected from $SiO_2$, SiN, SiON and the like. In this embodiment, an ARC film may be formed on the hard mask using the ARC-forming composition.

In a further embodiment, an organic film may be formed on the processable substrate, and a silicon-containing film formed on the organic film. In this embodiment, an ARC film may be formed on the Si-containing film using the ARC-forming composition. The patterning process thus involves the steps of applying a photoresist composition over the ARC film to form a photoresist film, exposing a pattern circuitry region of the photoresist film to radiation, developing the photoresist film with a liquid developer to form a pattern in the photoresist film, etching the ARC film and Si-containing film through the resist pattern as a mask, etching the organic film through the patterned Si-containing film as a mask, and further etching the processable substrate for thereby forming a pattern in the substrate.

To accelerate the migration phenomenon that allows polymer (A) to move afloat and polymer (B) to settle down by utilizing a difference of surface energy, a hydrophilic substrate is preferably used as the substrate. For example, a $SiO_2$ substrate is originally hydrophilic, but is converted, through HMDS treatment, into a water repellent substrate which may impede separation between polymers (A) and (B). Also, Si, SiON and SiN substrates are highly hydrophilic when their surface is covered with an autoxidation film, but become highly water repellent immediately after treatment with hydrofluoric acid, which nature may impede separation between polymers (A) and (B).

It is now described how to form an ARC film according to the invention. From the ARC-forming composition of the invention, an ARC film may be formed on a substrate by spin coating and other standard techniques as used in forming photoresist films. After the ARC-forming composition is applied by spin coating or the like, desirably the organic solvent is evaporated off and the coating is baked to promote crosslinking reaction to prevent mixing with an overlying resist film. The baking is preferably performed at a temperature of 80 to 300° C. for a time of 10 to 300 seconds. The thickness of the ARC is determined so as to enhance the antireflection effect and falls preferably in the range of 10 to 200 nm, and more preferably 20 to 150 nm. Once the ARC film is formed, a resist film is formed thereon.

The photoresist composition from which the resist film is formed may be any of well-known compositions as described in JP-A H09-73173 and JP-A 2000-336121, for example. The thickness of the resist film is not particularly limited, but falls preferably in the range of 30 to 500 nm, and more preferably 50 to 400 nm. When the resist film is formed from the photoresist composition, spin coating and other standard techniques may be preferably used as in the case of ARC formation. After the resist composition is applied by spin coating or the like, the resist coating is desirably pre-baked at 80 to 180° C. for 10 to 300 seconds.

Thereafter, in accordance with the standard procedure, the resist coating in a pattern circuitry region is exposed to radiation, post-exposure baked (PEB), and developed, yielding a resist pattern.

A resist protective coating may be formed on top of the resist film. The resist protective coating may have an antireflection function and be formed of either water-soluble or water-insoluble materials. The water-insoluble materials include those which are dissolvable in alkaline developer and those which are not dissolvable in alkaline developer, but strippable with fluorochemical solvents. The former is advantageous from the process standpoint in that it can be stripped at the same time as the development of the resist. In the case of immersion lithography, a protective film may be provided for the purpose of preventing additives like acid generator from being leached out of the resist film and for the purpose of improving water slippage. The protective film is preferably made of a material which is not dissolvable in water, but in alkali, typically a solution of a polymer of alcohol structure having plural fluorine atoms substituted at α-position, in a higher alcohol of at least 4 carbon atoms or an ether compound of 8 to 12 carbon atoms. A protective film is typically formed by applying a protective film solution onto the resist film as pre-baked by spin coating, and pre-baking the coating. The protective film preferably has a thickness in the range of 10 to 200 nm.

Where the protective film is used, the resultant multilayer structure is exposed to radiation by dry or immersion lithography, post-exposure baked (PEB), and developed in an alkaline developer for 10 to 300 seconds to form a resist pattern. A typical alkaline developer is a 2.38 wt % aqueous solution of tetramethylammonium hydroxide (TMAH). Where a protective film which is soluble in the developer is used, stripping of the protective film and development of the resist film occur simultaneously.

In the case of immersion lithography, to fully remove water on the protective film prior to PEB, the water on the resist should preferably be dried or recovered by suitable means, for example, spin drying prior to PEB, purging of the film surface with dry air or nitrogen, or optimizing the water recovery nozzle configuration or process on a stage after the exposure. Full removal of residual water on the protective film prior to PEB minimizes the risk that water can penetrate into the resist film to suck up the acid in the resist, impeding pattern formation.

Development is carried out by a puddle, dip or similar technique using an aqueous alkaline solution, typically by a puddle technique using a 2.38 wt % aqueous solution of TMAH, at room temperature for 10 to 300 seconds. The resist coating as developed is then rinsed with deionized water and dried by spin drying or nitrogen blowing.

Next, the ARC film is etched by dry etching or the like while using the resist pattern as a mask. This etching may be carried out by a standard technique. In the case of dry etching with an oxygen-based gas, an inert gas such as He or Ar and another gas such as CO, $CO_2$, $NH_3$, $SO_2$, $N_2$ or $NO_2$ may be added to oxygen gas. Etching with fluorochemical gases is employed where the substrate is $SiO_2$ or SiN, and etching with chlorine or bromine based gases is employed where the substrate is polysilicon (p-Si), Al or W. The ARC film of the invention is characterized by a high etching rate during etching of the substrate. As a result of etching, a pattern is formed in the substrate.

Although the foregoing description refers to a photoresist composition as the overcoat layer material, the ARC-forming composition may also be used in an application other than photolithography, for example, in an application where electron beam exposure is used, for the purpose of forming a resist undercoat layer for preventing the resist film from footing or undercutting.

EXAMPLE

Synthesis Examples and Examples are given below together with Comparative Examples for further illustrating the invention although the invention is not limited thereby.

The weight average molecular weight (Mw) and number average molecular weight (Mn) of a polymer are determined by gel permeation chromatography (GPC) versus polystyrene standards, and a dispersity (Mw/Mn) is computed therefrom. The abbreviation AIBN denotes 2,2'-azobisisobutyronitrile, MEK denotes methyl ethyl ketone, and THF denotes tetrahydrofuran.

Monomers 1 to 12 used in Synthesis Examples are identified below.

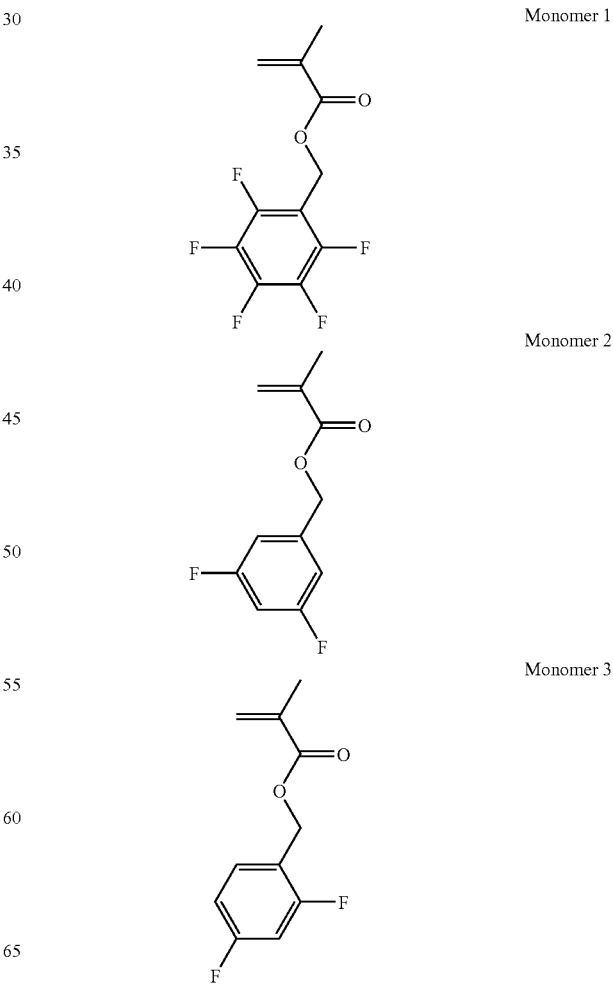

-continued
Monomer 4
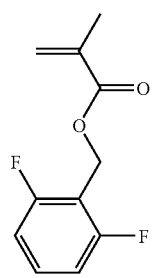
Monomer 5
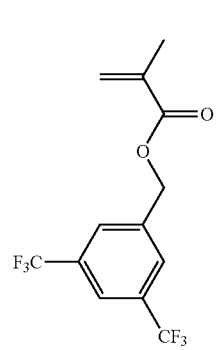
Monomer 6
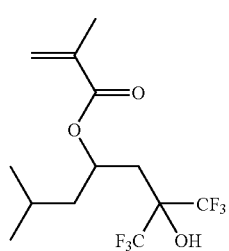
Monomer 7
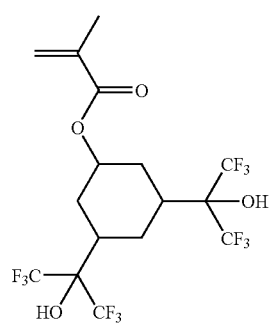
Monomer 8
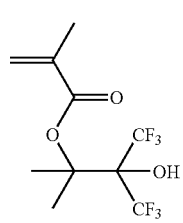
Monomer 9
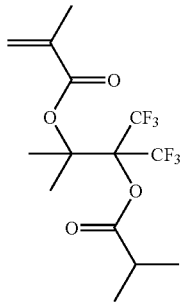
Monomer 10
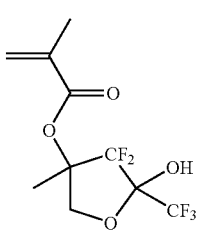
Monomer 11
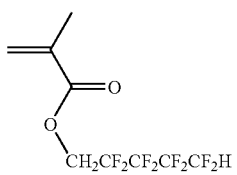
$CH_2CF_2CF_2CF_2CF_2H$
Monomer 12
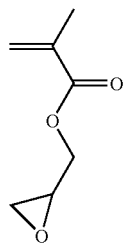
Monomer 13
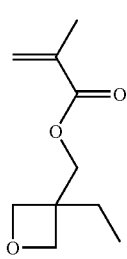

Synthesis of Polymer A-1

In a nitrogen atmosphere, a flask was charged with 7.37 g of Monomer 1, 2.63 g of Monomer 12, 0.076 g of AIBN, 0.75 g of MEK, and 6.75 g of toluene to form a monomer solution. In a nitrogen atmosphere, another flask was charged with 0.75 g of MEK and 6.75 g of toluene and heated to 80° C. with stirring, after which the monomer solution was added dropwise over 4 hours. After the completion of dropwise addition, the polymerization solution was stirred for a further 4 hours while maintaining it at the temperature of 80° C. The polymerization solution was cooled down to room temperature and added dropwise to 100 g of hexane, whereupon the precipitating polymer was filtered. The polymer precipitate was washed twice with 60.0 g of n-hexane and vacuum dried at 50° C. for 20 hours, obtaining 8.47 g of a polymer in white powder solid form, designated Polymer A-1. The yield was 85%. The polymer had a Mw of 31,800 and a dispersity Mw/Mn of 2.19. On $^{13}$C-NMR analysis, it had a copolymer compositional ratio of Monomer 1/Monomer 12=60/40 mol %.

Synthesis of Polymer A-2

In a nitrogen atmosphere, a flask was charged with 7.71 g of Monomer 1, 2.29 g of Monomer 13, 0.068 g of AIBN, 0.75 g of MEK, and 6.75 g of toluene to form a monomer solution. In a nitrogen atmosphere, another flask was charged with 0.75 g of MEK and 6.75 g of toluene and heated to 80° C. with stirring, after which the monomer solution was added dropwise over 4 hours. After the completion of dropwise addition, the polymerization solution was stirred for a further 4 hours while maintaining it at the temperature of 80° C. The polymerization solution was cooled down to room temperature and added dropwise to 100 g of n-hexane, whereupon the precipitating polymer was filtered. The polymer precipitate was washed twice with 60.0 g of n-hexane and vacuum dried at 50° C. for 20 hours, obtaining 8.45 g of a polymer in white powder solid form, designated Polymer A-2. The yield was 85%. The polymer had a Mw of 37,500 and a Mw/Mn of 2.19. On $^{13}$C-NMR analysis, it had a copolymer compositional ratio of Monomer 1/Monomer 13=70/30 mol %.

Synthesis of Polymers A-3 to A-15

Polymers A-3 to A-15 were synthesized by the same procedure as above or in accordance with the well-known formulation. These polymers are identified in Table 1.

Synthesis of Comparative Polymers 1 to 6

Comparative Polymers 1 to 6, identified below, were prepared by similar radical polymerization.

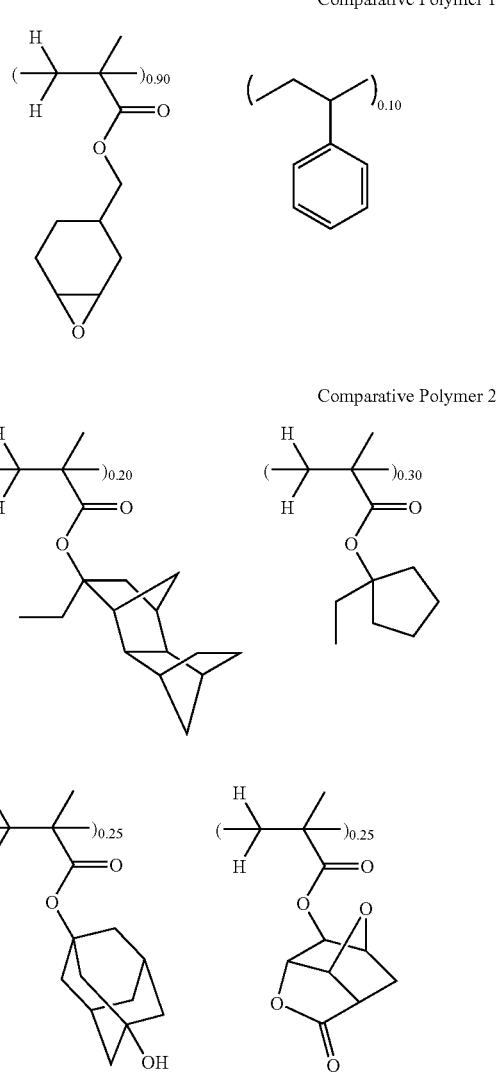

Comparative Polymer 1

Comparative Polymer 2

TABLE 1

|  | Monomers used | | | Compositional ratio | Mw | Mw/Mn |
| --- | --- | --- | --- | --- | --- | --- |
| Polymer A-1 | Monomer 1 | Monomer 12 | — | 60/40 | 31,800 | 2.19 |
| Polymer A-2 | Monomer 1 | Monomer 13 | — | 70/30 | 37,500 | 2.19 |
| Polymer A-3 | Monomer 1 | Monomer 5 | Monomer 12 | 60/20/20 | 36,500 | 2.09 |
| Polymer A-4 | Monomer 2 | Monomer 6 | Monomer 12 | 50/20/30 | 36,500 | 2.20 |
| Polymer A-5 | Monomer 3 | Monomer 6 | Monomer 12 | 50/20/30 | 33,400 | 2.16 |
| Polymer A-6 | Monomer 3 | Monomer 6 | Monomer 12 | 50/30/20 | 37,200 | 2.24 |
| Polymer A-7 | Monomer 3 | Monomer 6 | Monomer 13 | 50/20/30 | 33,000 | 2.12 |
| Polymer A-8 | Monomer 3 | Monomer 6 | Monomer 13 | 40/20/40 | 30,400 | 2.09 |
| Polymer A-9 | Monomer 3 | Monomer 7 | Monomer 13 | 45/15/40 | 35,000 | 2.23 |
| Polymer A-10 | Monomer 3 | Monomer 8 | Monomer 12 | 50/20/30 | 28,200 | 2.12 |
| Polymer A-11 | Monomer 3 | Monomer 9 | Monomer 13 | 40/20/40 | 27,200 | 2.07 |
| Polymer A-12 | Monomer 3 | Monomer 10 | Monomer 12 | 50/20/30 | 43,100 | 2.85 |
| Polymer A-13 | Monomer 3 | Monomer 11 | Monomer 13 | 40/20/40 | 29,000 | 2.08 |
| Polymer A-14 | Monomer 2 | Monomer 12 | — | 70/30 | 33,600 | 2.51 |
| Polymer A-15 | Monomer 4 | Monomer 12 | — | 70/30 | 32,200 | 2.33 |

-continued

Comparative Polymer 3

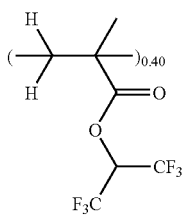 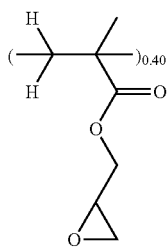 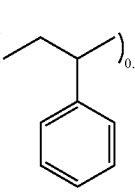

Comparative Polymer 4

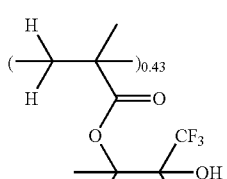 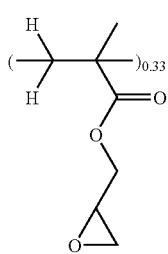

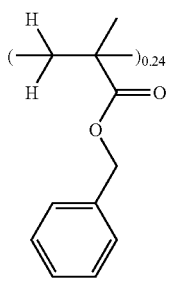

Comparative Polymer 5

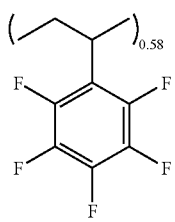 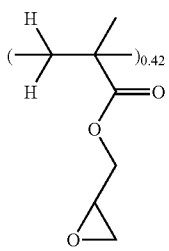

Comparative Polymer 6

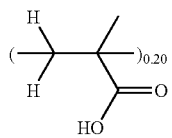 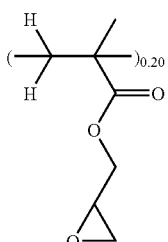

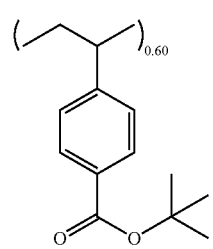

Synthesis of Polymer B-1

Polymer B-1 is poly(4-hydroxystyrene) having a Mw of 8,000, available from Aldrich.

Synthesis of Polymer B-2

A 200-ml flask was charged with 7.0 g of indene, 6.9 g of 6-hydroxy-2-vinylnaphthalene, and 20 g of 1,2-dichloroethane as a solvent. In a nitrogen atmosphere, 0.5 g of boron trifluoride as a polymerization initiator was added to the reactor, which was heated to 60° C., whereupon reaction occurred for 15 hours. The reaction solution was concentrated to ½, and poured into a mixture of 2.5 L methanol and 0.2 L water for precipitation. The resulting white solids were filtered and vacuum dried at 60° C., yielding a white polymer, designated Polymer B-2. The polymer had a Mw of 15,000 and a dispersity Mw/Mn of 1.92. On $^{13}$C-NMR analysis, it had a copolymer compositional ratio of 6-hydroxy-2-vinyl-naphthalene/indene=40/60 mol %.

Polymer B-2

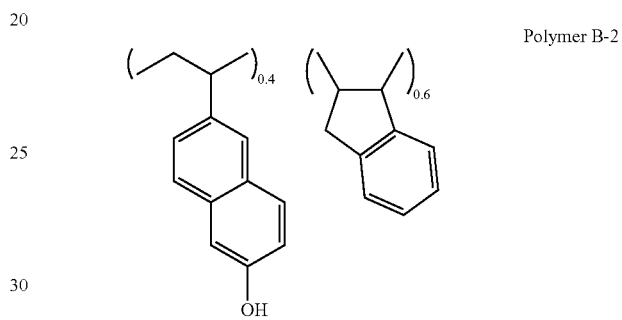

Synthesis of Polymer B-3

A 300-ml flask was charged with 160 g of m-cresol, 50 g of 1-naphthol, 75 g of 37% formalin, and 5 g of oxalic acid, which were stirred at 100° C. for 24 hours for reaction. The reaction solution was dissolved in 500 ml of methyl isobutyl ketone. The solution was thoroughly washed with water to remove the catalyst and metal impurities, and the solvent was distilled off under reduced pressure. The system was kept under a vacuum of 2 mmHg at 150° C. for removing the water and unreacted monomers, yielding 188 g of a polymer, designated Polymer B-3. The polymer had a Mw of 12,000 and a Mw/Mn of 4.60. On $^1$H-NMR analysis, it had a copolymer compositional ratio of a1/b1=80/20 mol %.

Polymer B-3

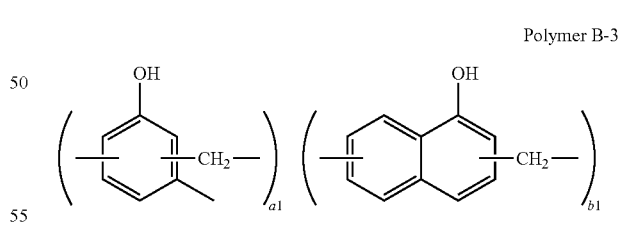

Synthesis of Polymer B-4

A 300-ml flask was charged with 160 g of m-cresol, 70 g of 1-hydroxypyrene, 75 g of 37% formalin, and 5 g of oxalic acid, which were stirred at 100° C. for 24 hours for reaction. The reaction solution was dissolved in 500 ml of methyl isobutyl ketone. The solution was thoroughly washed with water to remove the catalyst and metal impurities, and the solvent was distilled off under reduced pressure. The system was kept under a vacuum of 2 mmHg at 150° C. for removing the water and unreacted monomers, yielding 193 g of a polymer, designated Polymer B-4. The polymer had a Mw of 12,700 and a Mw/Mn of 4.80. On $^1$H-NMR analysis, it had a copolymer compositional ratio of a1/b2=83/17 mol %.

Polymer B-4

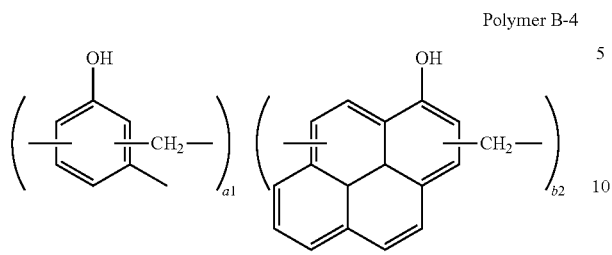

Synthesis of Polymer B-5

A 300-ml flask was charged with 160 g of m-cresol, 60 g of 2-hydroxyfluorene, 75 g of 37% formalin, and 5 g of oxalic acid, which were stirred at 100° C. for 24 hours for reaction. The reaction solution was dissolved in 500 ml of methyl isobutyl ketone. The solution was thoroughly washed with water to remove the catalyst and metal impurities, and the solvent was distilled off under reduced pressure. The system was kept under a vacuum of 2 mmHg at 150° C. for removing the water and unreacted monomers, yielding 190 g of a polymer, designated Polymer B-5. The polymer had a Mw of 10,800 and a Mw/Mn of 4.30. On $^1$H-NMR analysis, it had a copolymer compositional ratio of a1/b3=75/25 mol %.

Polymer B-5

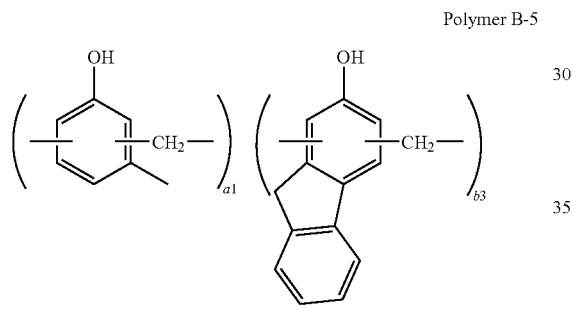

Synthesis of Polymer B-6

A 300-ml flask was charged with 160 g of m-cresol, 50 g of 6-hydroxyindene, 75 g of 37% formalin, and 5 g of oxalic acid, which were stirred at 100° C. for 24 hours for reaction. The reaction solution was dissolved in 500 ml of methyl isobutyl ketone. The solution was thoroughly washed with water to remove the catalyst and metal impurities, and the solvent was distilled off under reduced pressure. The system was kept under a vacuum of 2 mmHg at 150° C. for removing the water and unreacted monomers, yielding 175 g of a polymer, designated Polymer B-6. The polymer had a Mw of 9,800 and a Mw/Mn of 5.30. On $^1$H-NMR analysis, it had a copolymer compositional ratio of a1/b4=68/32 mol %.

Polymer B-6

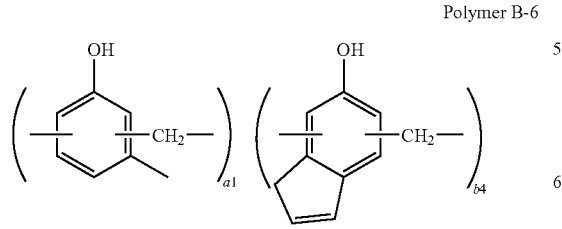

Synthesis of Polymer B-7

A 100-ml flask was charged with 2 g of Compound 1, shown below, 0.75 g of 37% formalin, and 0.05 g of oxalic acid, which were stirred at 100° C. for 24 hours for reaction. The reaction solution was dissolved in 10 ml of methyl isobutyl ketone. The solution was thoroughly washed with water to remove the catalyst and metal impurities, and the solvent was distilled off under reduced pressure. The system was kept under a vacuum of 2 mmHg at 150° C. for removing the water and unreacted monomers, yielding 1.8 g of a polymer, designated Polymer B-7. The polymer had a Mw of 4,000 and a Mw/Mn of 2.60.

Compound 1

Polymer B-7

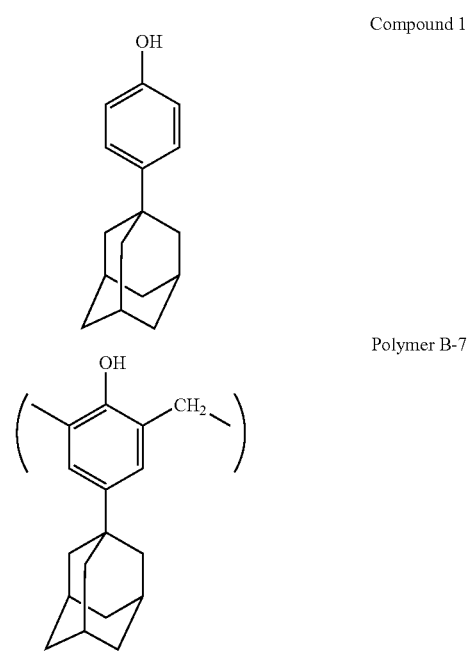

Synthesis of Polymer B-8

A 500-ml flask was charged with 82 g of 4-hydroxystyrene, 85 g of 1-anthracenemethyl methacrylate, and 40 g of toluene as a solvent. The reactor was subjected to three cycles of cooling to −70° C. in a nitrogen atmosphere, vacuum evacuation, and nitrogen flow. The reactor was warmed to room temperature, fed with 4.1 g of AIBN as the polymerization initiator, and heated at 80° C., whereupon reaction occurred for 24 hours. The reaction solution was concentrated to ½, and poured into a solvent mixture of 300 ml methanol and 50 ml water for precipitation. The resulting white solids were filtered and vacuum dried at 60° C., yielding 133 g of a white polymer, designated Polymer B-8. The polymer had a Mw of 14,400 and a Mw/Mn of 1.77. On $^1$H-NMR analysis, it had a copolymer compositional ratio of 4-hydroxystyrene/1-anthracenemethyl methacrylate=56/44 mol %.

Polymer B-8

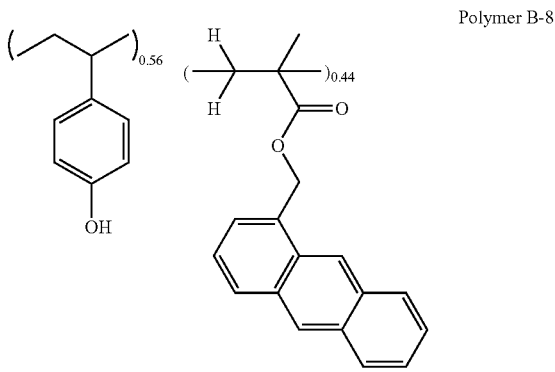

Synthesis of Polymer B-9

A 300-ml flask was charged with 200 g of Compound 2, shown below, 75 g of 37% formalin, and 5 g of oxalic acid, which were stirred at 100° C. for 24 hours for reaction. The reaction solution was dissolved in 500 ml of methyl isobutyl ketone. The solution was thoroughly washed with water to remove the catalyst and metal impurities, and the solvent was distilled off under reduced pressure. The system was kept under a vacuum of 2 mmHg at 150° C. for removing the water and unreacted monomers, yielding 163 g of a polymer, designated Polymer B-9. The polymer had a Mw of 13,000 and a Mw/Mn of 4.60.

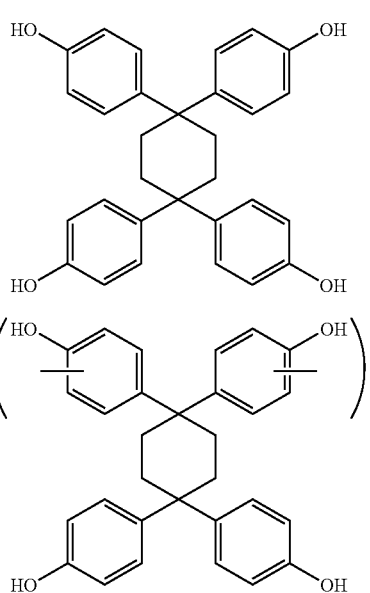

Compound 2

Polymer B-9

Synthesis of Polymer B-10

A 200-ml flask was charged with 15.2 g of acenaphthylene, 3.3 g of 4-hydroxystyrene, and 60 g of 1,2-dichloroethane as a solvent. Then, 1 g of boron trifluoride as a polymerization initiator was added to the reactor, which was heated to 60° C., whereupon reaction occurred for 25 hours. To the reaction solution, 1 L of methanol and 500 g of water were added for precipitation. The resulting white solids were filtered and dried, yielding 12 g of a white polymer, designated Polymer B-10. The polymer had a Mw of 8,800 and a Mw/Mn of 1.82. On $^{13}$C- and $^1$H-NMR analysis, it had a copolymer compositional ratio of acenaphthylene/4-hydroxystyrene=75/25 mol %.

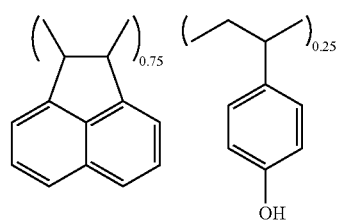

Polymer B-10

Synthesis of Polymer B-11

A 2-L flask was charged with 56.8 g of glycidyl methacrylate, 48.0 g of 4-hydroxystyrene, 25.5 g of indene, and 150 g of THF as a solvent. The reactor was subjected to three cycles of cooling to −70° C. in a nitrogen atmosphere, vacuum evacuation, and nitrogen flow. The reactor was warmed to room temperature, fed with 2.6 g of AIBN as the polymerization initiator, and heated at 60° C., whereupon reaction occurred for 15 hours. The reaction solution was poured into 1500 ml of isopropyl alcohol for precipitation. The resulting white solids were filtered and vacuum dried at 60° C., yielding 110.1 g of a white polymer, designated Polymer B-11. The polymer had a Mw of 8,400 and a Mw/Mn of 1.83. On $^{13}$C- and $^1$H-NMR analysis, it had a copolymer compositional ratio of glycidyl methacrylate/4-hydroxystyrene/indene=42/38/20 mol %.

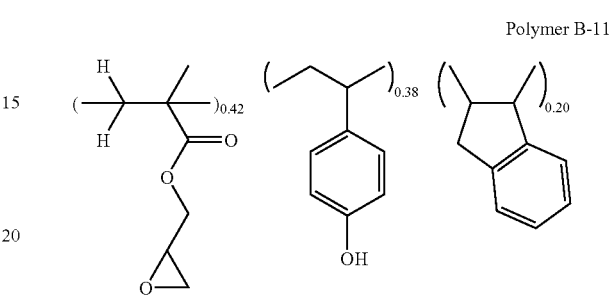

Polymer B-11

Synthesis of Polymer B-12

A 200-ml flask was charged with 11.5 g of indene, 14.1 g of N-hydroxyethylmaleimide, and 15 g of THF as a solvent. The reactor was subjected to three cycles of cooling to −70° C. in a nitrogen atmosphere, vacuum evacuation, and nitrogen flow. The reactor was warmed to room temperature, fed with 2.5 g of 2,2'-azobis(2,4-dimethylvaleronitrile) as the polymerization initiator, and heated at 55° C., whereupon reaction occurred for 25 hours. The reaction solution was diluted with 5 ml of acetone and poured into 2 L of isopropyl alcohol for precipitation. The resulting white solids were filtered and vacuum dried at 40° C., yielding 13 g of a white polymer, designated Polymer B-12. The polymer had a Mw of 6,500 and a Mw/Mn of 1.66. On $^{13}$C- and $^1$H-NMR analysis, it had a copolymer compositional ratio of indene/N-hydroxy-ethylmaleimide=50/50 mol %.

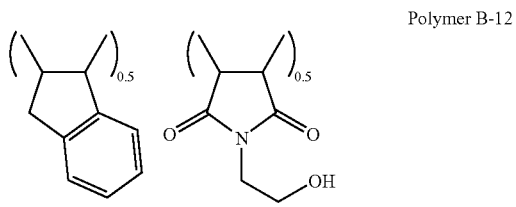

Polymer B-12

Synthesis of Polymer B-13

A 300-ml flask was charged with 120 g of m-cresol, 150 g of 4,4'-(9H-fluoren-9-ylidene)bisphenol, 75 g of 37% formalin, and 5 g of oxalic acid, which were stirred at 100° C. for 24 hours for reaction. The reaction solution was dissolved in 500 ml of methyl isobutyl ketone. The solution was thoroughly washed with water to remove the catalyst and metal impurities, and the solvent was distilled off under reduced pressure. The system was kept under a vacuum of 2 mmHg at 150° C. for removing the water and unreacted monomers, yielding 255 g of a polymer, designated Polymer B-13. The polymer had a Mw of 6,000 and a Mw/Mn of 3.70. On $^1$H-NMR analysis, it had a copolymer compositional ratio of a1/b5=67/33 mol %.

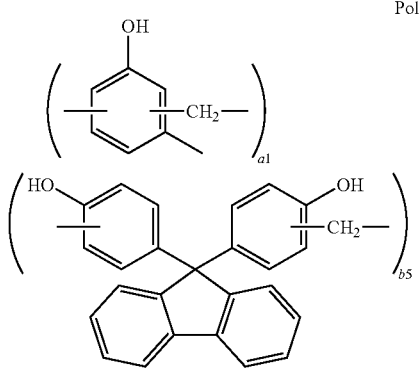

Polymer B-13

Synthesis of Polymer B-14

A 300-ml flask was charged with 120 g of m-cresol, 54 g of 37% formalin, and 3 g of oxalic acid, which were stirred at 100° C. for 24 hours for reaction. The reaction solution was dissolved in 300 ml of methyl isobutyl ketone. The solution was thoroughly washed with water to remove the catalyst and metal impurities, and the solvent was distilled off under reduced pressure. The system was kept under a vacuum of 2 mmHg at 150° C. for removing the water and unreacted monomers, leaving a novolac resin.

A 300-ml flask was charged with 120 g of the novolac resin and 41 g of 9-anthracenemethanol in THF. Tosylic acid, 0.5 g, was added to the solution which was stirred at 80° C. for 24 hours for reaction. By washing the solution with water to remove the catalyst and metal impurities and distilling off the THF under reduced pressure, 155 g of a polymer, designated Polymer B-14, was recovered from the solution. The polymer had a Mw of 6,000 and a Mw/Mn of 2.70. On $^1$H-NMR analysis, it had a copolymer compositional ratio of a1/b6=65/35 mol %.

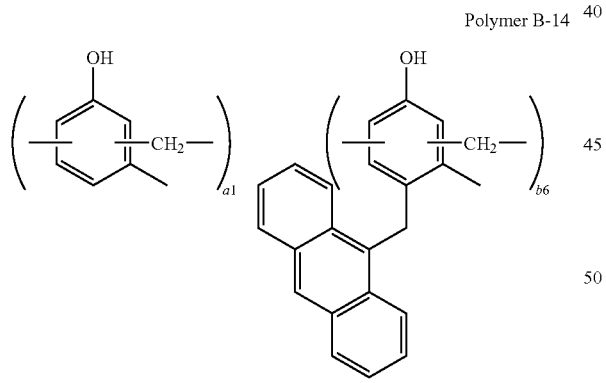

Polymer B-14

Synthesis of Polymer B-15

A 300-ml flask was charged with 120 g of poly(p-hydroxystyrene) with a Mw of 14,000 and a dispersity Mw/Mn of 1.67 and 41 g of 9-anthracenemethanol in THF. Tosylic acid, 0.5 g, was added to the solution which was stirred at 80° C. for 24 hours for reaction. By washing the solution with water to remove the catalyst and metal impurities and distilling off the THF under reduced pressure, 155 g of a polymer, designated Polymer B-15, was recovered from the solution. The polymer had a Mw of 15,000 and a Mw/Mn of 1.70. On $^1$H-NMR analysis, it had a copolymer compositional ratio of a2/b7=20/80 mol %.

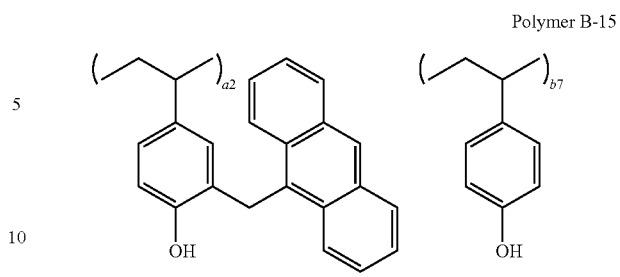

Polymer B-15

Synthesis of Polymer B-16

A 300-ml flask was charged with 180 g of 4,4'-(9H-fluoren-9-ylidene)bisphenol, 75 g of 37% formalin, and 5 g of oxalic acid, which were stirred at 100° C. for 24 hours for reaction. The reaction solution was dissolved in 500 ml of methyl isobutyl ketone. The solution was thoroughly washed with water to remove the catalyst and metal impurities, and the solvent was distilled off under reduced pressure. The system was kept under a vacuum of 2 mmHg at 150° C. for removing the water and unreacted monomers, yielding 163 g of a polymer, designated Polymer B-16. The polymer had a Mw of 11,000 and a Mw/Mn of 4.40.

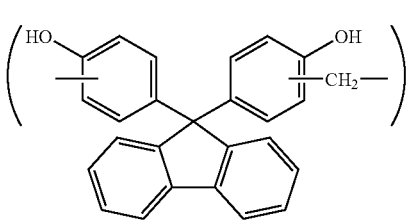

Polymer B-16

Synthesis of Polymer B-17

Polymer B-17 is poly[(o-cresol glycidyl ether)-co-formaldehyde] having a Mw of 2,000, available from Aldrich.

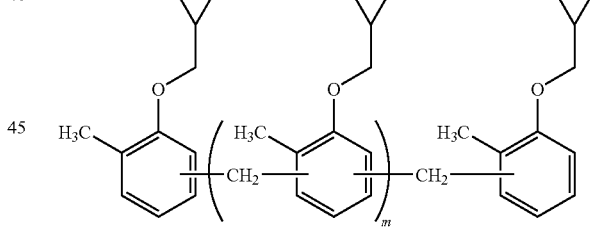

Polymer B-17

A value of m is such that the polymer has Mw=2,000.

Synthesis of Polymer B-18

In a nitrogen atmosphere, a flask was charged with 15.05 g of bisphenol A, 22.16 g of bisphenol AF, 46.40 g of 25% NaOH aqueous solution, 97.02 g of water, and 200 mg of benzyltriethylammonium chloride, which were heated at 70° C. and stirred to form a homogeneous solution. To the flask was added 12.81 g of epichlorohydrin in 124.83 g of cyclopentyl methyl ether. The internal temperature of the flask was raised to 84° C. whereupon stirring was continued for 5.5 hours. The reaction solution was cooled to room temperature, after which 26.43 g of 20% aqueous hydrochloric acid and 108.57 g of water were added. Further, 300 g of ethyl acetate was added to the solution, from which the water layer was separated off. The organic layer was washed 4 times with 300 g of water, and the solvent was distilled off in vacuum. Cyclopentyl methyl ether was added to the residue to form 300 g of a solution. The solution was added dropwise to 1,500 g of hexane whereupon the precipitating polymer was filtered. The polymer precipitate was washed twice with 300 g of hexane and vacuum dried at 50° C. for 2 hours and then at 90° C. for 22 hours, obtaining 41.01 g of a polymer in white solid form, designated Polymer B-18. The polymer had a Mw of 6,430 and a Mw/Mn of 1.76. On $^1$H-NMR analysis, it had a copolymer compositional ratio of a3/b8=51/49 mol %.

Polymer B-18

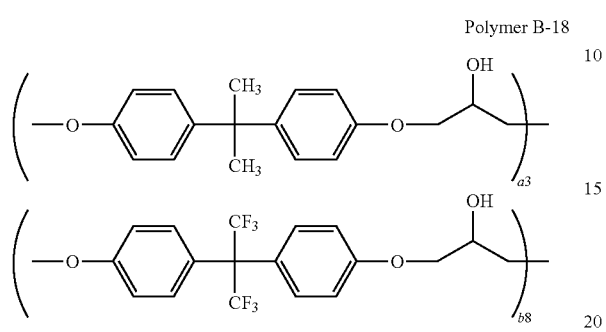

Synthesis of Polymer B-19

In a nitrogen atmosphere, a flask was charged with 12.93 g of bisphenol AF, 13.54 g of 25% NaOH aqueous solution, 28.27 g of water, and 333 mg of benzyltriethylammonium chloride, which were heated at 50° C. and stirred to form a homogeneous solution. To the flask was added 4.45 g of epichlorohydrin in 18.21 g of methyl isobutyl ketone. The internal temperature of the flask was raised to 89° C. whereupon stirring was continued for 9 hours. The reaction solution was cooled to room temperature, after which 7.19 g of 20% aqueous hydrochloric acid was added and further 80 g of ethyl acetate added. The water layer was separated off. The organic layer was washed four times with 50 g of water, and concentrated to 28.94 g by distilling off in vacuum the solvent. 1.23 g of ethyl acetate and 30.17 g of toluene were added to the concentrate to form a homogeneous solution. With vigorous stirring, the solution was added dropwise to 300 g of n-hexane whereupon the polymer thus precipitated was filtered. The polymer was washed twice with 90 g of n-hexane and vacuum dried at 50° C. for 1 hour, at 70° C. for 2.5 hours, then at 90° C. for 11.5 hours, obtaining 14.62 g of a polymer in white solid form, designated Polymer B-19. The polymer had a Mw of 16,700 and a Mw/Mn of 2.76.

Polymer B-19

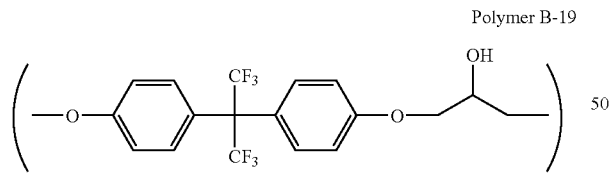

Synthesis of Polymer B-20

In a nitrogen atmosphere, a flask was charged with 24.25 g of 2,2-bis(3,4-dicarboxyphenyl)-hexafluoropropane dianhydride, 3.52 g of glycerol, 2.75 g of 2,6-bishydroxy-methyl-p-cresol, and 117.90 g of acetonitrile, which were stirred for 48 hours at an internal temperature of 83° C. The reaction solution was added dropwise to 3,050 g of water whereupon the precipitating polymer was filtered. The polymer precipitate was washed three times with 240 g water and vacuum dried at 60° C. for 27.5 hours, obtaining 28.91 g of a polymer in solid form, designated Polymer B-20. The polymer had a Mw of 15,300 and a Mw/Mn of 29.6. On $^{13}$C-NMR analysis, it had a copolymer compositional ratio of a4/b9/c1=52/33/15 mol %.

Polymer B-20

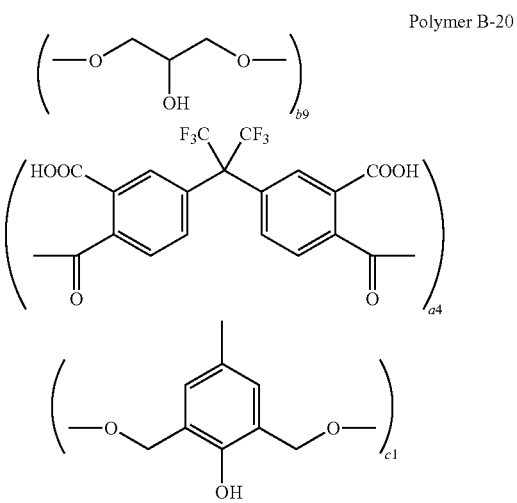

Synthesis of Polymer B-21

In a nitrogen atmosphere, a flask was charged with 36.00 g of 2,2-bis(3,4-dicarboxyphenyl)-hexafluoropropane dianhydride, 5.22 g of glycerol, 4.09 g of 2,6-bishydroxy-methyl-p-cresol, and 175.03 g of acetonitrile, which were stirred for 50 hours at an internal temperature of 83° C. Water, 22.66 g, was added to the solution, which was stirred for a further 4 hours at an internal temperature of 77° C. The reaction solution was added dropwise to 4,500 g of water whereupon the precipitating polymer was filtered. The polymer precipitate was washed three times with 360 g water and vacuum dried at 60° C. for 26 hours, obtaining 38.92 g of a polymer in solid form, designated Polymer B-21. The polymer had a Mw of 6,800 and a Mw/Mn of 47.6. On $^{13}$C-NMR analysis, it had a copolymer compositional ratio of a4/b9/c1=52/33/15 mol %.

Polymer B-21

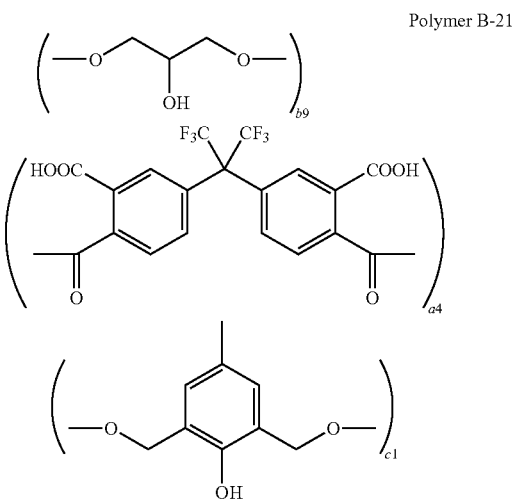

Synthesis of Comparative Polymer 7

A 500-ml flask was charged with 40 g of 4-hydroxy-styrene, 160 g of 1-adamantane 2-methacrylate, and 40 g of toluene as a solvent. The reactor was subjected to three cycles of cooling to −70° C. in a nitrogen atmosphere, vacuum evacuation, and nitrogen flow. The reactor was warmed up to room temperature, fed with 4.1 g of AIBN as a polymerization initiator, and then heated to 80° C., whereupon reaction occurred for 24 hours. The reaction solution was concentrated to ½, and poured into a solvent mixture of 300 ml methanol and 50 ml water for precipitation. The resulting white solids were filtered and vacuum dried at 60° C., yielding 188 g of a white polymer, designated Comparative Polymer 7. The polymer had a Mw of 10,900 and a Mw/Mn of 1.77. On ¹H-NMR analysis, it had a copolymer compositional ratio of 4-hydroxystyrene/1-adamantane 2-methacrylate=32/68 mol %.

Comparative Polymer 7

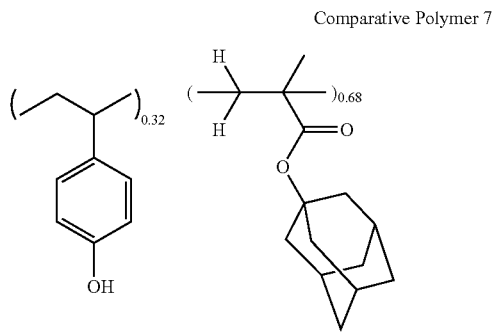

Measurement of Optical Parameters of Polymers

Solutions for measuring optical parameters were prepared by mixing a polymer with a solvent in accordance with the formulation shown in Table 2. The polymers tested are polymers (A) designated Polymers A-1 to A-15, Comparative Polymers 1 to 7, aromatic ring-bearing polymers (B) designated Polymers B-1 to B-21. Filtration through a fluoroplastic filter having a pore size of 0.1 μm gave coating solutions. The coating solutions (Polymers A-1 to A-15, Comparative Polymers 1 to 7, Polymers B-1 to B-21) were coated on Si substrates and baked at 200° C. for 60 seconds to form coating films for measuring optical parameters. Using a variable angle spectroscopic ellipsometer (VASE®) of J. A. Woollam Co., the refractive index (n) and extinction coefficient (k) at wavelength 193 nm of the coating films were determined. The results are also shown in Table 2.

TABLE 2

| Polymer | Polymer (pbw) | Organic solvent (pbw) | Refractive index (n) | Extinction coefficient (k) |
|---|---|---|---|---|
| Polymer A-1 | Polymer A-1 (100) | PGMEA (2,400) | 1.79 | 0.12 |
| Polymer A-2 | Polymer A-2 (100) | PGMEA (2,400) | 1.79 | 0.13 |
| Polymer A-3 | Polymer A-3 (100) | PGMEA (2,400) | 1.85 | 0.24 |
| Polymer A-4 | Polymer A-4 (100) | PGMEA (2,400) | 1.89 | 0.28 |
| Polymer A-5 | Polymer A-5 (100) | PGMEA (2,400) | 1.91 | 0.24 |
| Polymer A-6 | Polymer A-6 (100) | PGMEA (2,400) | 1.87 | 0.20 |
| Polymer A-7 | Polymer A-7 (100) | PGMEA (2,400) | 1.89 | 0.22 |
| Polymer A-8 | Polymer A-8 (100) | PGMEA (2,400) | 1.85 | 0.19 |
| Polymer A-9 | Polymer A-9 (100) | PGMEA (2,400) | 1.85 | 0.20 |
| Polymer A-10 | Polymer A-10 (100) | PGMEA (2,400) | 1.93 | 0.24 |
| Polymer A-11 | Polymer A-11 (100) | PGMEA (2,400) | 1.85 | 0.19 |
| Polymer A-12 | Polymer A-12 (100) | PGMEA (2,400) | 1.92 | 0.27 |
| Polymer A-13 | Polymer A-13 (100) | PGMEA (2,400) | 1.85 | 0.20 |
| Polymer A-14 | Polymer A-14 (100) | PGMEA (2,400) | 2.09 | 0.48 |
| Polymer A-15 | Polymer A-15 (100) | PGMEA (2,400) | 2.03 | 0.47 |
| Comparative Polymer 1 | Comparative Polymer 1 (100) | PGMEA (2,400) | 1.70 | 0.13 |
| Comparative Polymer 2 | Comparative Polymer 2 (100) | PGMEA (2,400) | 1.72 | 0.05 |
| Comparative Polymer 3 | Comparative Polymer 3 (100) | PGMEA (2,400) | 1.66 | 0.22 |
| Comparative Polymer 4 | Comparative Polymer 4 (100) | PGMEA (2,400) | 1.74 | 0.17 |
| Comparative Polymer 5 | Comparative Polymer 5 (100) | PGMEA (2,400) | 1.81 | 0.16 |
| Comparative Polymer 6 | Comparative Polymer 6 (100) | PGMEA (2,400) | 1.49 | 0.36 |
| Polymer B-1 | Polymer B-1 (100) | PGMEA (2,400) | 1.62 | 0.59 |
| Polymer B-2 | Polymer B-2 (100) | PGMEA (2,400) | 1.45 | 0.40 |
| Polymer B-3 | Polymer B-3 (100) | PGMEA (2,400) | 1.48 | 0.53 |
| Polymer B-4 | Polymer B-4 (100) | PGMEA (2,400) | 1.48 | 0.54 |
| Polymer B-5 | Polymer B-5 (100) | PGMEA (2,400) | 1.49 | 0.52 |
| Polymer B-6 | Polymer B-6 (100) | PGMEA (2,400) | 1.48 | 0.52 |
| Polymer B-7 | Polymer B-7 (100) | PGMEA (2,400) | 1.53 | 0.32 |
| Polymer B-8 | Polymer B-8 (100) | PGMEA (2,400) | 1.39 | 0.35 |
| Polymer B-9 | Polymer B-9 (100) | PGMEA (2,400) | 1.45 | 0.52 |
| Polymer B-10 | Polymer B-10 (100) | PGMEA (2,400) | 1.45 | 0.32 |
| Polymer B-11 | Polymer B-11 (100) | PGMEA (2,400) | 1.41 | 0.54 |
| Polymer B-12 | Polymer B-12 (100) | PGMEA (2,400) | 1.53 | 0.39 |
| Polymer B-13 | Polymer B-13 (100) | PGMEA (2,400) | 1.45 | 0.54 |
| Polymer B-14 | Polymer B-14 (100) | PGMEA (2,400) | 1.54 | 0.58 |
| Polymer B-15 | Polymer B-15 (100) | PGMEA (2,400) | 1.52 | 0.59 |
| Polymer B-16 | Polymer B-16 (100) | PGMEA (2,400) | 1.34 | 0.64 |
| Polymer B-17 | Polymer B-17 (100) | PGMEA (2,400) | 1.42 | 0.58 |
| Polymer B-18 | Polymer B-18 (100) | PGMEA (2,400) | 1.49 | 0.60 |
| Polymer B-19 | Polymer B-19 (100) | PGMEA (2,400) | 1.45 | 0.71 |
| Polymer B-20 | Polymer B-20 (100) | PGMEA (2,400) | 1.36 | 0.53 |
| Polymer B-21 | Polymer B-21 (100) | PGMEA (2,400) | 1.36 | 0.50 |
| Comparative Polymer 7 | Comparative Polymer 7 (100) | PGMEA (2,400) | 1.71 | 0.22 |

In Table 2, PGMEA as the organic solvent is propylene glycol monomethyl ether acetate.

As seen from Table 2, Polymer A-14 and A-15 have too high extinction coefficients (k values) and fail to provide a satisfactory antireflection effect. The remaining polymers (A) and polymers (B) have appropriate extinction coefficients (k values) at wavelength 193 nm, suggesting that a satisfactory antireflection effect can be attained by properly combining polymers (A) and (B) and controlling the thickness of upper, lower and mixed layers.

Dry Etching Resistance

Solutions for evaluating dry etching resistance were prepared by mixing selected components in accordance with the formulation shown in Table 3. The components used included polymers (A) designated Polymers A-1, A-3, A-4, A-5, A-10, Comparative Polymer 5, polymer (B) designated Polymer B-21, acid generators AG1, AG2 and AG3, crosslinker CR1, a surfactant FC-4430 (3M-Sumitomo Co., Ltd.), and an organic solvent. Filtration through a Teflon® filter having a pore size of 0.2 μm gave coating solutions. The coating solutions were coated on Si substrates and baked at 220° C. for 60 seconds in Reference Examples 1 to 5 and Comparative Example 1, or at 180° C. for 60 seconds in Reference Example 6 and Example 1 to form coating films.

Similarly, an ArF single-layer resist material to be described later was coated on a Si substrate and baked at 110° C. for 60 seconds to form a coating film.

These films were examined by a test of etching with $CHF_3$/$CF_4$ gas using a dry etching instrument TE-8500P by Tokyo Electron, Ltd. A difference in thickness of the film before and after the etching test was determined. The results are shown in Table 3.

| $CHF_3$/$CF_4$ gas etching test | |
| --- | --- |
| Chamber pressure | 300 mTorr |
| RF power | 1000 W |
| Gap | 9 mm |
| $CHF_3$ gas flow rate | 50 ml/min |
| $CF_4$ gas flow rate | 50 ml/min |
| He gas flow rate | 200 ml/min |
| $O_2$ gas flow rate | 7 ml/min |
| Time | 60 sec |

TABLE 3

| | Polymer (pbw) | Acid generator (pbw) | Crosslinker (pbw) | Surfactant (pbw) | Organic solvent (pbw) | Film thickness (nm) | Thickness difference before and after etching (nm) |
| --- | --- | --- | --- | --- | --- | --- | --- |
| Reference Example 1 | Polymer A-1 (100) | AG1 (5) | — | FC-4430 (0.1) | PGMEA (500) | 500 | 138 |
| Reference Example 2 | Polymer A-3 (100) | AG2 (5) | — | FC-4430 (0.1) | PGMEA (500) | 500 | 123 |
| Reference Example 3 | Polymer A-4 (100) | AG3 (8) | — | FC-4430 (0.1) | PGMEA (500) | 500 | 134 |
| Reference Example 4 | Polymer A-5 (100) | AG1 (5) | — | FC-4430 (0.1) | PGMEA (500) | 500 | 132 |
| Reference Example 5 | Polymer A-10 (100) | AG1 (5) | — | FC-4430 (0.1) | PGMEA (500) | 500 | 132 |
| Reference Example 6 | Polymer B-21 (100) | AG2 (3) | CR1 (10) | FC-4430 (0.1) | PGMEA (500) | 500 | 155 |
| Example 1 | Polymer A-5 (40) Polymer B-21 (60) | AG2 (3) | CR1 (10) | FC-4430 (0.1) | PGMEA (500) | 140 | No film left after etching (>140) |
| ArF single-Layer resist | (described later) | | | | | 140 | 122 |
| Comparative Example 1 | Comparative Polymer 5 (100) | AG1 (5) | — | FC-4430 (0.1) | PGMEA (500) | 500 | 112 |

The components in Table 3 are identified below. Acid generators AG1, AG2, and AG3 have the following structural formulae.

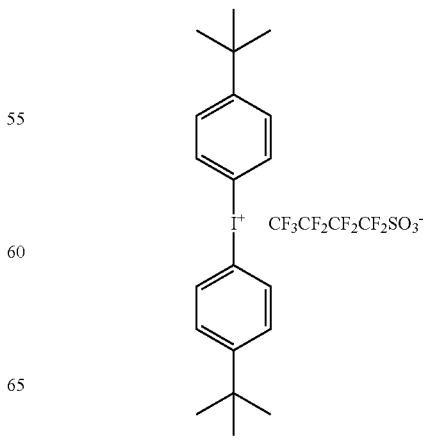

AG1

-continued

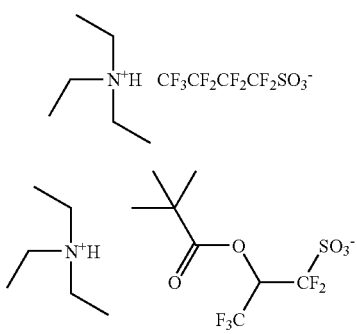

Crosslinker CR1 has the following structural formula.

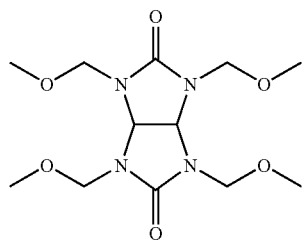

As seen from Table 3, the polymer (A) used in the ARC-forming composition of the invention is characterized by a high etching rate as compared with the ArF single-layer resist material. The ARC-forming composition comprising polymers (A) and (B) in admixture has a higher etching rate than the ArF single-layer resist material.

Measurement of Contact Angle of ARC

Solutions were prepared by mixing selected components in accordance with the formulation shown in Table 4. The components used included polymers (A) designated Polymer A-5, aromatic ring-bearing polymer (B) designated Polymer B-21, Comparative Polymers 4 and 6, acid generator AG2, crosslinker CR1, and an organic solvent. Filtration through a Teflon® filter having a pore size of 0.2 μm gave coating solutions. The coating solutions were spin coated on Si substrates and baked at 180° C. for 60 seconds to form test films. With 5 μL of water dropped thereon, the films were measured for a contact angle with water by means of an inclination contact angle meter prop Master 500 (Kyowa Interface Science Co., Ltd.). The results are shown in Table 4.

TABLE 4

| | Polymer A (pbw) | Polymer B (pbw) | Acid generator (pbw) | Crosslinker (pbw) | Organic solvent (pbw) | Contact angle (°) |
|---|---|---|---|---|---|---|
| Example 2 | Polymer A-5 (40) | Polymer B-21 (60) | AG2 (3) | CR1 (10) | PGMEA (2,400) | 87 |
| Reference Example 7 | Polymer A-5 (100) | — | AG2 (3) | CR1 (10) | PGMEA (2,400) | 87 |
| Reference Example 8 | — | Polymer B-21 (100) | AG2 (3) | CR1 (10) | PGMEA (2,400) | 61 |
| Comparative Example 2 | Comparative Polymer 4 (40) | Comparative Polymer 6 (60) | AG2 (3) | — | PGMEA (2,400) | 55 |
| Comparative Example 3 | Comparative Polymer 4 (100) | — | AG2 (3) | — | PGMEA (2,400) | 72 |
| Comparative Example 4 | — | Comparative Polymer 6 (100) | AG2 (3) | — | PGMEA (2,400) | 41 |

As seen from Example 2 in Table 4, the ARC film formed from the ARC-forming composition of the invention has a contact angle with water approximate to that of a coating film formed from polymer (A) alone, indicating the segregation of polymer (A) on the outer surface side of the ARC film.

Measurement of Thickness of ARC

Solutions for film thickness measurement were prepared by mixing selected components in accordance with the formulation shown in Table 5. The components used included polymers (A) designated Polymers A-1 to A-5, A-7, A-10, Comparative Polymers 1 to 4, 6, 7, aromatic ring-bearing polymers (B) designated Polymers B-1 to B-3, 8-10, B-16 to B-21, acid generators AG1, AG2, and AG3, crosslinkers CR1 and CR2, and a solvent. Filtration through a Teflon® filter having a pore size of 0.2 μm gave coating solutions. The coating solutions were spin coated on Si substrates and baked at 180° C. for 60 seconds in Examples 3, 4, 7, 12, 13, 15, Comparative Example 10, or at 220° C. for 60 seconds in Examples 5, 6, 8 to 11, 14 and Comparative Examples 5 to 9 to form test films. Using a variable angle spectroscopic ellipsometer (VASE®) of J. A. Woollam Co., the thickness of the films was determined. The results are shown in Table 5.

TABLE 5

| | | Polymer A (pbw) | Polymer B (pbw) | Acid generator (pbw) | Crosslinker (pbw) | Organic solvent (pbw) | Upper layer thickness (nm) | Mixed layer thickness (nm) | Lower layer thickness (nm) |
|---|---|---|---|---|---|---|---|---|---|
| Example | 3 | Polymer A-5 (40) | Polymer B-21 (60) | AG2 (3) | CR1 (10) | PGMEA (2,400) | 28.8 | 21.2 | 47.2 |
| | 4 | Polymer A-1 (40) | Polymer B-1 (60) | AG2 (5) | CR1 (10) | PGMEA (2,400) | 32.9 | 16.2 | 52.4 |
| | 5 | Polymer A-1 (40) | Polymer B-2 (60) | AG1 (5) | CR1 (10) | PGMEA (2,400) | 21.8 | 32.4 | 41.2 |
| | 6 | Polymer A-1 (40) | Polymer B-3 (60) | AG3 (8) | CR1 (10) | PGMEA (2,400) | 33.4 | 17.5 | 54.2 |
| | 7 | Polymer A-1 (40) | Polymer B-10 (60) | AG2 (5) | CR1 (15) | PGMEA (2,400) | 31.6 | 17.1 | 50.3 |
| | 8 | Polymer A-1 (40) | Polymer B-16 (60) | AG1 (5) | CR1 (10) | PGMEA (2,400) | 30.0 | 18.6 | 45.4 |
| | 9 | Polymer A-1 (40) | Polymer B-17 (60) | AG1 (5) | — | PGMEA (2,400) | 20.7 | 35.2 | 38.6 |
| | 10 | Polymer A-2 (40) | Polymer B-18 (60) | AG2 (5) | CR2 (10) | PGMEA (2,400) | 35.3 | 8.5 | 53.4 |
| | 11 | Polymer A-2 (40) | Polymer B-19 (60) | AG2 (5) | CR2 (10) | PGMEA (2,400) | 34.5 | 10.9 | 52.1 |
| | 12 | Polymer A-3 (40) | Polymer B-20 (60) | AG2 (3) | CR1 (10) | PGMEA (2,400) | 29.8 | 16.5 | 45.3 |
| | 13 | Polymer A-4 (54) | Polymer B-19 (46) | AG2 (3) | CR1 (10) | PGMEA (2,400) | 37.7 | 23.8 | 30.8 |
| | 14 | Polymer A-7 (40) | Polymer B-19 (60) | AG2 (3) | CR1 (10) | PGMEA (2,400) | 30.5 | 18.1 | 50.0 |
| | 15 | Polymer A-10 (40) | Polymer B-21 (60) | AG2 (3) | CR1 (10) | PGMEA (2,400) | 24.8 | 29.3 | 43.7 |
| Comparative Example | 5 | Comparative Polymer 1 (50) | Polymer B-1 (50) | AG1 (5) | CR1 (10) | PGMEA (3,520) | 0.0 | 74.0 | 4.8 |
| | 6 | Comparative Polymer 2 (50) | Polymer B-1 (50) | AG1 (5) | CR1 (10) | PGMEA (3,520) | 0.5 | 57.2 | 10.1 |
| | 7 | Comparative Polymer 3 (50) | Polymer B-1 (50) | AG1 (5) | CR1 (10) | PGMEA (3,520) | island-in-sea structure | | |
| | 8 | Polymer A-1 (50) | Comparative Polymer 7 (50) | AG1 (5) | CR1 (10) | PGMEA (3,520) | 20.2 | 19.2 | 20.6 |
| | 9 | Comparative Polymer 4 (40) | Polymer B-19 (60) | AG2 (3) | CR1 (10) | PGMEA (2,400) | 0 | 82.0 | 7.9 |
| | 10 | Comparative Polymer 4 (40) | Comparative Polymer 6 (60) | AG2 (3) | — | PGMEA (2,400) | 0 | 93.5 | 0 |

In Table 5, Crosslinker CR2 has the following structural formula.

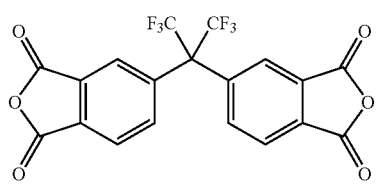

CR2

As seen from Table 5, when the ARC-forming composition of the invention is spin coated onto a substrate and baked to form an ARC film, polymers (A) and (B) segregate in the ARC film so as to form an upper layer having a low extinction coefficient (k) and a lower layer having a high extinction coefficient (k). Depending on particular polymers used, a mixed layer of polymers (A) and (B) forms as an intermediate layer. By selecting the combination and blend ratio of polymers (A) and (B) so as to control the thickness of the upper, mixed and lower layers, an ARC film that is effective in preventing reflection of exposure light by the substrate can be formed.

Resist Patterning Test

An ArF single-layer resist composition solution was prepared by dissolving a polymer (ArF single-layer resist polymer 1), an acid generator and a basic compound in an organic solvent containing 0.1 wt % of FC-4430 (3M-Sumitomo Co., Ltd.) according to the formulation shown in Table 6, and passing through a Teflon® filter having a pore size of 0.2 μm.

TABLE 6

| | Polymer (pbw) | Acid generator (pbw) | Basic compound (pbw) | Organic solvent (pbw) |
|---|---|---|---|---|
| ArF single-layer resist composition | ArF single-layer resist polymer 1 (100) | PAG1 (10.0) | Quencher 1 (1.2) | PGMEA (1,350) |

The components in Table 6 are identified below. Polymer, ArF single-layer resist polymer 1 has the following structural formula.

ArF single-layer resist polymer 1

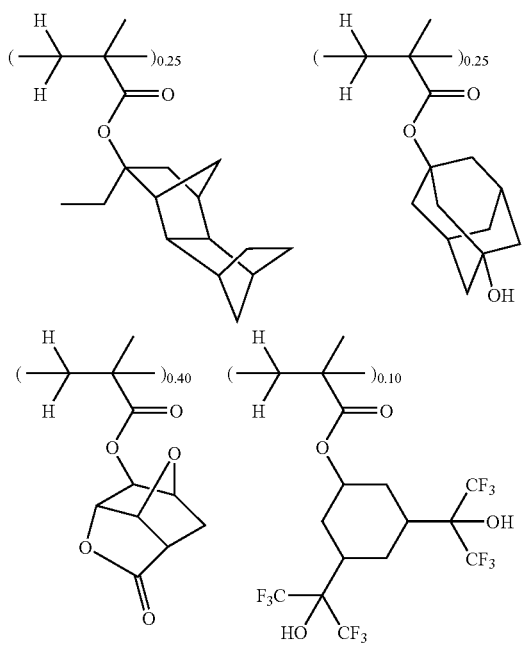

Acid generator, PAG1 has the following structural formula.

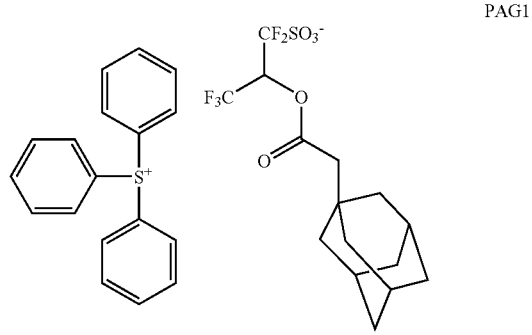

Basic compound, Quencher 1 has the following structural formula.

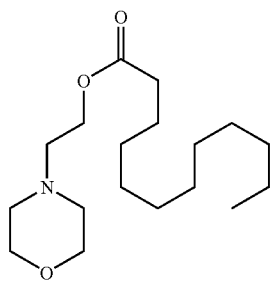

The ARC-forming solutions prepared above (Examples 3, 4, 14, 15, Comparative Examples 8, 9) were coated onto Si substrates and baked at 180° C. for 60 seconds in Examples 3, 4, 15 or at 220° C. for 60 seconds in Example 14, Comparative Examples 8 and 9, to form ARC films. Onto the ARC films, the ArF single-layer resist composition solution prepared above was coated and pre-baked at 110° C. for 60 seconds to form a photoresist film of 160 nm thick. Thereafter, the resist film was exposed using an ArF exposure tool S307E (Nikon Corporation, NA 0.85, σ 0.93, ⅔ annular illumination, 6% half-tone phase shift mask), then baked (PEB) at 110° C. for 60 seconds, and developed for 60 seconds with a 2.38 wt % aqueous solution of tetramethylammonium hydroxide (TMAH), thereby giving a positive 80 nm line-and-space pattern. The cross-sectional profile of the resist pattern was observed. The results are shown in Table 7.

TABLE 7

| ARC film | Cross-sectional profile of resist pattern |
| --- | --- |
| Example 3 | Rectangular, no footing |
| Example 4 | Rectangular, no footing |
| Example 14 | Rectangular, no footing |
| Example 15 | Rectangular, no footing |
| Comparative Example 8 | Standing waves, footing |
| Comparative Example 9 | Standing waves, footing |

As seen from Table 7, the ARC films formed from the ARC-forming compositions of the invention ensure that the photoresist films on the ARC films are processed into resist patterns of rectangular profile without footing.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

Japanese Patent Application No. 2008-316645 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An antireflective coating composition comprising (A) at least one polymer comprising recurring units represented by the general formula (1) and recurring units selected from the general formulae (2) to (4) and having an extinction coefficient k in the range of 0.01 to 0.4 and a refractive index n in the range of 1.4 to 2.1 at a preselected imaging radiation wavelength, and (B) at least one aromatic ring containing-polymer comprising recurring units selected from the following formulae (i) to (xxvi) and having an extinction coefficient k in the range of 0.3 to 1.2 at a preselected imaging radiation wavelength so that the extinction coefficient k of polymer (A) is set lower than that of polymer (B),

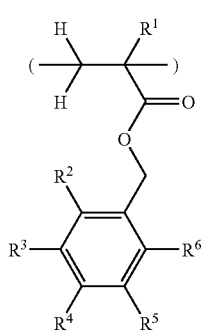 (1)

wherein $R^1$ is hydrogen, fluorine, methyl, or trifluoromethyl, and $R^2$ to $R^6$ are each independently hydrogen, fluorine, trifluoromethyl, or a $C_1$-$C_5$ alkoxy group in which at least one hydrogen atom is substituted by fluorine, with the proviso that not all $R^2$ to $R^6$ are hydrogen at the same time,

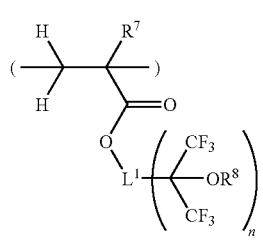 (2)

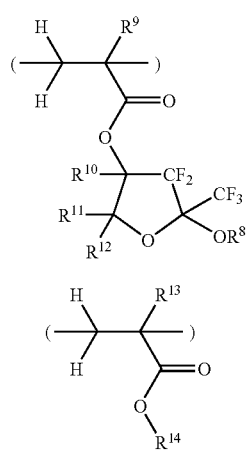

(3)

(4)

wherein $R^7$, $R^9$ and $R^{13}$ are each independently hydrogen, fluorine, methyl, or trifluoromethyl, $R^8$ is hydrogen or a straight, branched or cyclic, monovalent hydrocarbon group of 1 to 30 carbon atoms in which some hydrogen atoms may be substituted by halogen and a constituent unit —$CH_2$— may be substituted by —O— or —C(=O)—, n is 1 or 2, $L^1$ is a straight, branched or cyclic, di- or trivalent hydrocarbon group of 1 to 15 carbon atoms, $R^{10}$ to $R^{12}$ are each independently hydrogen, hydroxyl, halogen, or a straight, branched or cyclic, monovalent organic group of 1 to 15 carbon atoms, at least two of $R^{10}$ to $R^{12}$ may bond together to form a ring with the carbon atom(s) to which they are attached, and $R^{14}$ is a hydrocarbon group of 2 to 15 carbon atoms in which at least one hydrogen atom is substituted by fluorine,

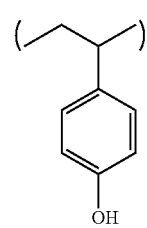 (i)

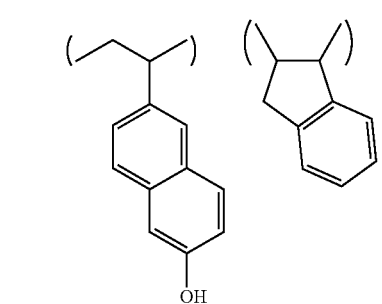 (ii)

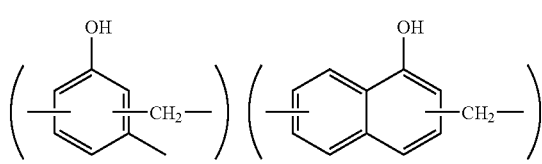 (iii)

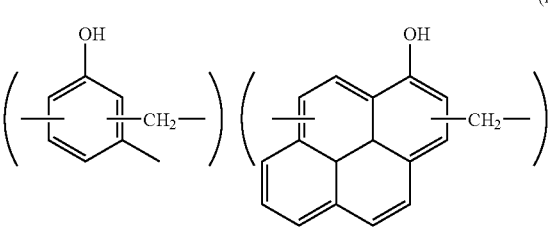 (iv)

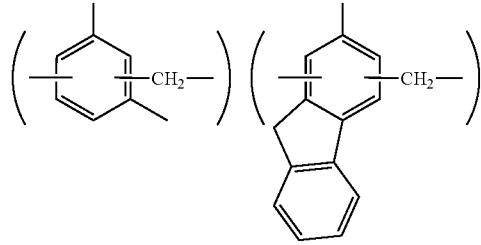 (v)

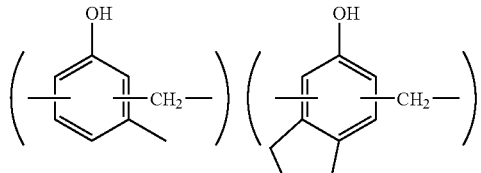 (vi)

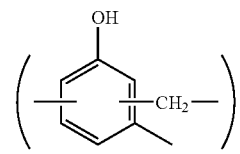 (vii)

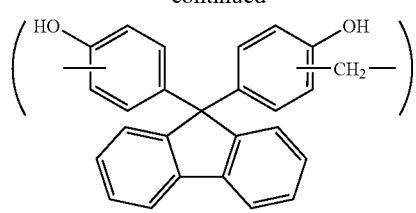
(viii)
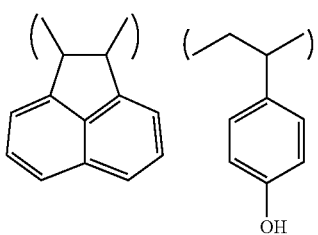
(xii)
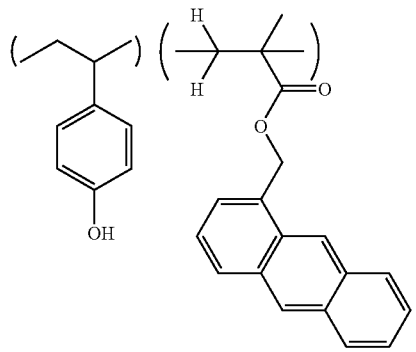
(ix)
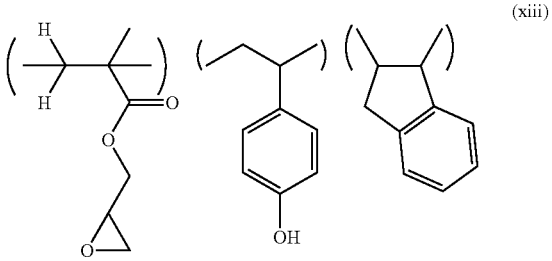
(xiii)
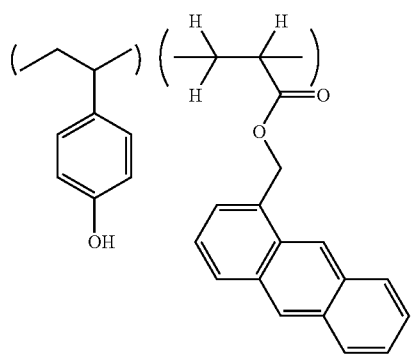
(x)
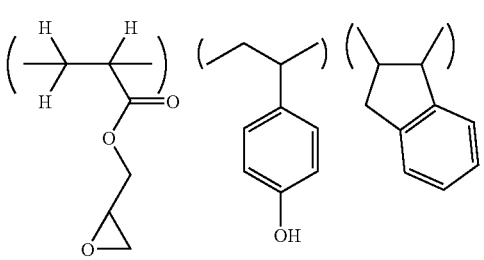
(xiv)
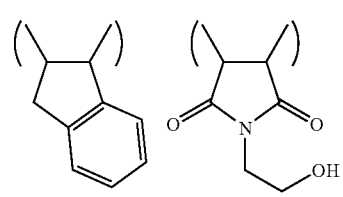
(xv)
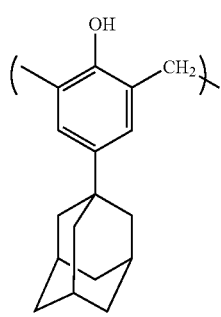
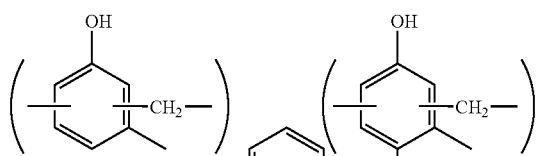
(xvi)
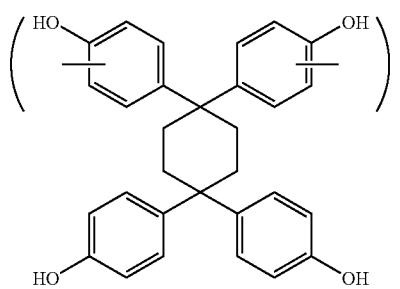
(xi)
(xvii)

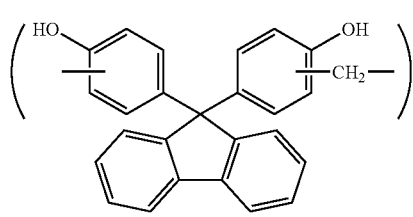 (xviii)

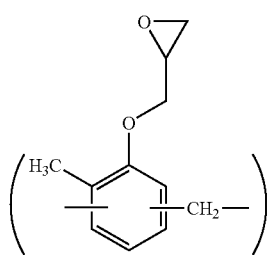 (xix)

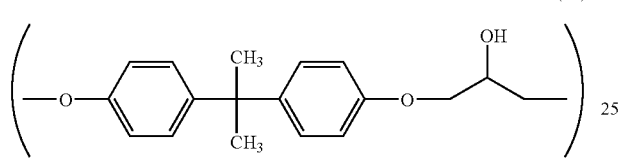 (xx)

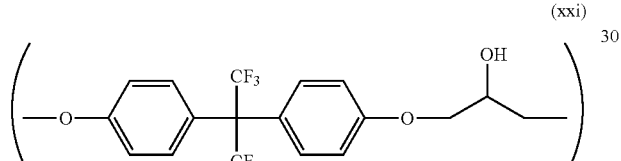 (xxi)

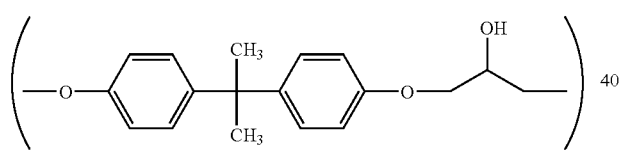 (xxii)

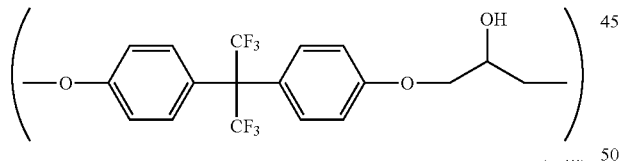

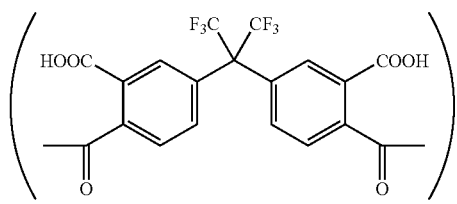 (xxiii)

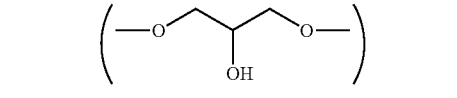

 (xxiv)

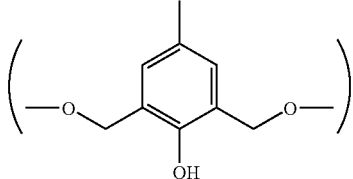

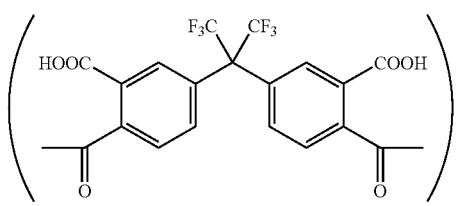 (xxv)

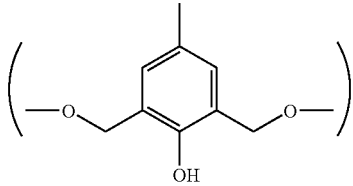

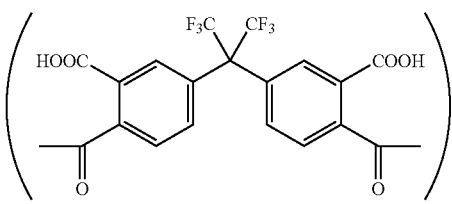 (xxvi)

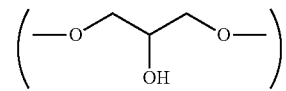

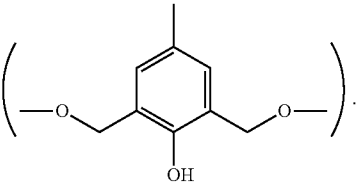.

2. The composition of claim 1 wherein the polymer (A) comprises 3 to 90 mol % of recurring units having formula (1).

3. The composition of claim 1 wherein the polymer (A) comprises 2 to 60 mol % of recurring units having formulae (2), (3) and (4) in total.

4. The composition of claim 1 wherein the polymer (A) comprises recurring units capable of crosslinking reaction in the presence of acid.

5. The composition of claim 4 wherein the polymer (A) comprises 5 to 90 mol % of the recurring units capable of crosslinking reaction in the presence of acid in total.

6. The composition of claim 4 wherein the recurring units capable of crosslinking reaction are selected from the group consisting of recurring units having the following formulae:

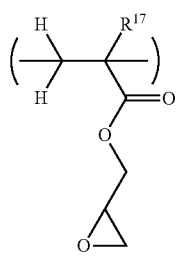 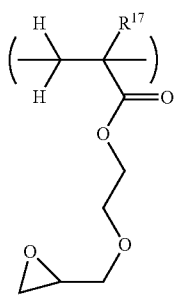 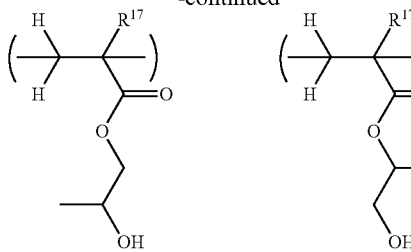

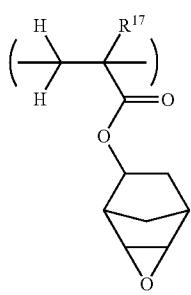 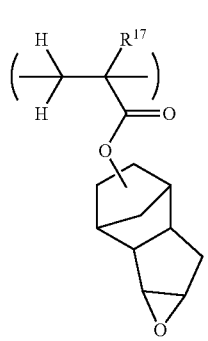 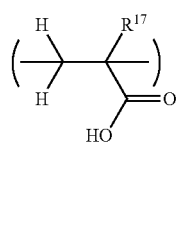

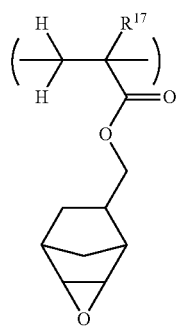 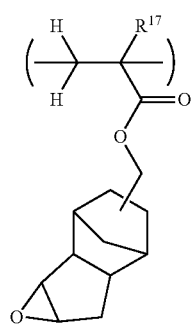 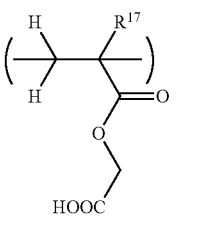 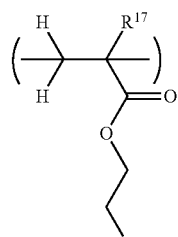

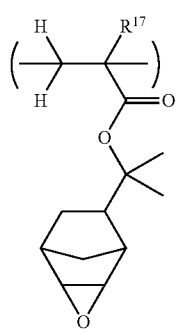 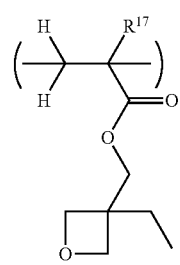 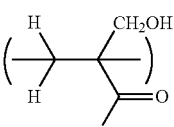 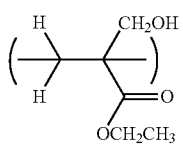

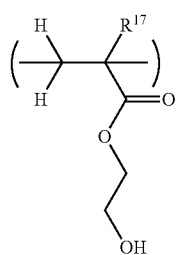 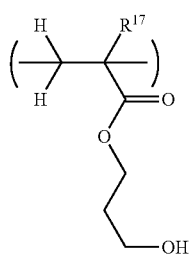 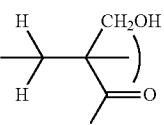 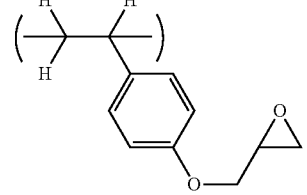

wherein $R^{17}$ is hydrogen, fluorine, methyl, or trifluoromethyl.

7. The composition of claim 1 wherein the polymer (B) comprises 30 to 100 mol % of aromatic ring-bearing recurring units.

8. The composition of claim 1 wherein the polymer (A) and the polymer (B) are present in a weight ratio of 30:70 to 80:20.

9. The composition of claim 1, further comprising at least one component selected from an organic solvent, an acid generator, and a crosslinker.

10. An antireflective coating which is prepared by applying the composition of claim 1 onto a substrate by spin coating and baking to form an antireflective coating having an inner surface contiguous to the substrate and an outer surface remote from the substrate, such that polymer (A) and polymer (B) may segregate vertically toward the outer surface and inner surface, respectively.

11. A lithographic pattern forming process comprising the steps of: applying the composition of claim 1 onto a substrate to form an antireflective coating, forming a photoresist layer on the antireflective coating, exposing a pattern circuitry region of the photoresist layer to an imaging radiation, developing the photoresist layer with a developer to form a patterned resist layer, and etching the antireflective coating and the substrate while using the resist pattern as a mask, thereby forming a pattern in the substrate.

* * * * *